United States Patent
Hosoda

(10) Patent No.: US 10,209,625 B2
(45) Date of Patent: Feb. 19, 2019

(54) EXTREME ULTRAVIOLET LIGHT GENERATING APPARATUS

(71) Applicant: Gigaphoton Inc., Tochigi (JP)

(72) Inventor: Hirokazu Hosoda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/001,091

(22) Filed: Jun. 6, 2018

(65) Prior Publication Data

US 2018/0284618 A1    Oct. 4, 2018

Related U.S. Application Data

(63) Continuation of application No. PCT/JP2016/088784, filed on Dec. 26, 2016.

(30) Foreign Application Priority Data

Jan. 20, 2016   (WO) .................. PCT/JP2016/051620

(51) Int. Cl.
  *G03F 7/20*   (2006.01)
  *H05G 2/00*   (2006.01)

(52) U.S. Cl.
  CPC .............. *G03F 7/7055* (2013.01); *G03F 7/20* (2013.01); *G03F 7/70033* (2013.01); *H05G 2/00* (2013.01)

(58) Field of Classification Search
  CPC .. G03F 7/7055; G03F 7/7033; G03F 7/70575; G03F 7/70175

(Continued)

(56) References Cited

U.S. PATENT DOCUMENTS

2006/0192156 A1   8/2006 Hasegawa
2011/0141865 A1   6/2011 Senekerimyan et al.
(Continued)

FOREIGN PATENT DOCUMENTS

JP   2005-310453 A   11/2005
JP   2006-163060 A    6/2006
(Continued)

OTHER PUBLICATIONS

International Search Report issued in PCT/JP2016/051620; dated Apr. 5, 2016.
(Continued)

*Primary Examiner* — Hung Nguyen
(74) *Attorney, Agent, or Firm* — Studebaker & Brackett PC

(57) ABSTRACT

An extreme ultraviolet light generating apparatus may include: a chamber, within which extreme ultraviolet light is generated from a droplet which is supplied to a predetermined region therein; an image forming optical system that forms an image of the droplet supplied to the predetermined region; an imaging element that captures an image of the formed image; a stage that moves the image forming optical system and/or the imaging element in an optical axis direction of the image forming optical system; a light energy measuring unit that measures light energy which is generated when the extreme ultraviolet light is generated; and a control unit that controls the stage based on a measured value of the light energy measured by the light energy measuring unit such that an image formation plane of the image of the droplet formed by the image forming optical system matches an imaging surface of the imaging element.

15 Claims, 38 Drawing Sheets

(58) Field of Classification Search
USPC .................................. 355/61–71; 250/504 R
See application file for complete search history.

(56) References Cited

U.S. PATENT DOCUMENTS

| | | |
|---|---|---|
| 2012/0156809 A1 | 6/2012 | Shirai |
| 2012/0248341 A1 | 10/2012 | Graham et al. |
| 2013/0015319 A1 | 1/2013 | Moriya et al. |
| 2015/0261095 A1 | 9/2015 | Jansen et al. |
| 2016/0037616 A1 | 2/2016 | Saito et al. |
| 2016/0234920 A1* | 8/2016 | Suzuki .................. H05G 2/003 |

FOREIGN PATENT DOCUMENTS

| | | |
|---|---|---|
| JP | 2007-109451 A | 4/2007 |
| JP | 2012-129345 A | 7/2012 |
| JP | 2012-134417 A | 7/2012 |
| JP | 2013-513929 A | 4/2013 |
| JP | 2014-511011 A | 5/2014 |
| JP | 2014-232167 A | 12/2014 |
| JP | 2014-534559 A | 12/2014 |
| WO | 2014/189055 A1 | 11/2014 |
| WO | 2015/041260 A1 | 3/2015 |
| WO | 2015/047725 A1 | 4/2015 |

OTHER PUBLICATIONS

Notification of Transmittal of Translation of the International Preliminary Report on Patentability (Chapter I) and Translation of Written Opinion of the International Searching Authority; PCT/JP2016/051620; dated Jul. 24, 2018.
International Search Report issued in PCT/JP2016/088784; dated Apr. 25, 2017.
Notification of Transmittal of Translation of the International Preliminary Report on Patentability (Chapter I) and Translation of Written Opinion of the International Searching Authority; PCT/JP2016/088784; dated Jul. 24, 2018.

* cited by examiner

AMOUNT OF SHIFT OF FOCAL POINT F $\Delta Q^+ \fallingdotseq 0$ $\Delta Q^+ \fallingdotseq \Delta Q^-$

| i | $P_i$ | $X_i$ | $T_i$ |
|---|---|---|---|
| 1 | $P_1$ | $X_1$ | $T_1$ |
| 2 | $P_2$ | $X_2$ | $T_2$ |
| 3 | $P_3$ | $X_3$ | $T_3$ |
| 4 | $P_4$ | $X_4$ | $T_4$ |
| : | : | : | : |
| : | : | : | : |
| n | $P_n$ | $X_n$ | $T_n$ |

EXTREME ULTRAVIOLET LIGHT GENERATING APPARATUS

CROSS REFERENCE TO RELATED APPLICATIONS

The present application is a Continuation application of International Application No. PCT/JP2016/088784 filed on Dec. 26, 2016, claiming the priority to International Application No. PCT/JP2016/051620 filed on Jan. 20, 2016. The contents of the applications are incorporated herein by reference in its entirety.

BACKGROUND

1. Technical Field

The present disclosure is related to an extreme ultraviolet light generating apparatus.

2. Related Art

Recently, as semiconductor processes have become finer, transfer patterns for use in photolithography of semiconductor processes have also become finer. In the next generation, microfabrication at 20 nm or less will be in demand. In order to meet this demand, there is expectation for development of an exposure apparatus in which an extreme ultraviolet (EUV) light generating apparatus that generates extreme ultraviolet (EUV) light having a wavelength of approximately 13 nm is combined with a reduced projection reflective optic system.

Three types of EUV light generating apparatuses have been proposed. The three types are: an LPP (Laser Produced Plasma) type apparatus that employs plasma which is generated by a target substance being irradiated with a laser beam; a DPP (Discharge Produced Plasma) type apparatus that employs plasma which is generated by electrical discharge, and an SR (Synchrotron Radiation) type apparatus that employs synchrotron orbital radiation.

RELATED ART DOCUMENTS

Patent Documents

[Patent Document 1]
  Japanese Unexamined Patent Publication No. 2014-232167
[Patent Document 2]
  Japanese Unexamined Patent Publication No. 2006-163060
[Patent Document 3]
  International Patent Publication No. WO 2015/041260

SUMMARY

An extreme ultraviolet light generating apparatus according to one aspect of the present disclosure may include:
  a chamber, within which extreme ultraviolet light is generated from a droplet which is supplied to a predetermined region therein;
  an image forming optical system provided in the chamber, configured to form an image of the droplet which is supplied to the predetermined region;
  an imaging element configured to capture the formed image;
  a stage configured to move at least a portion of the image forming optical system and/or the imaging element in an optical axis direction of the image forming optical system;
  a light energy measuring unit configured to measure light energy which is generated when the extreme ultraviolet light is generated; and
  a control unit configured to control the stage based on a measured value of the light energy measured by the light energy measuring unit such that an image formation plane of the image of the droplet formed by the image forming optical system matches an imaging surface of the imaging element.

An extreme ultraviolet light generating apparatus according to another aspect of the present disclosure may include:
  a chamber, within which extreme ultraviolet light is generated from a droplet which is supplied to a predetermined region therein;
  a first image forming optical system configured to form an image of the droplet which is supplied to the predetermined region, provided in the chamber;
  an optical shutter having a light receiving surface that detects a formed first image and is configured to output the first image;
  an imaging element configured to capture the first image which is output from the optical shutter;
  a stage configured to move at least a portion of the first image forming optical system and/or the optical shutter in an optical axis direction of the first image forming optical system;
  a light energy measuring unit configured to measure light energy which is generated when the extreme ultraviolet light is generated; and
  a control unit configured to control the stage based on a measured value of the light energy measured by the light energy measuring unit such that an image formation plane of the image of the droplet formed by the first image forming optical system matches the light receiving surface of the optical shutter.

BRIEF DESCRIPTION OF THE DRAWINGS

Embodiments of the present disclosure will be described below as examples, with reference to the attached drawings.

DETAILED DESCRIPTION OF THE PREFERRED EMBODIMENTS

Figure 1:
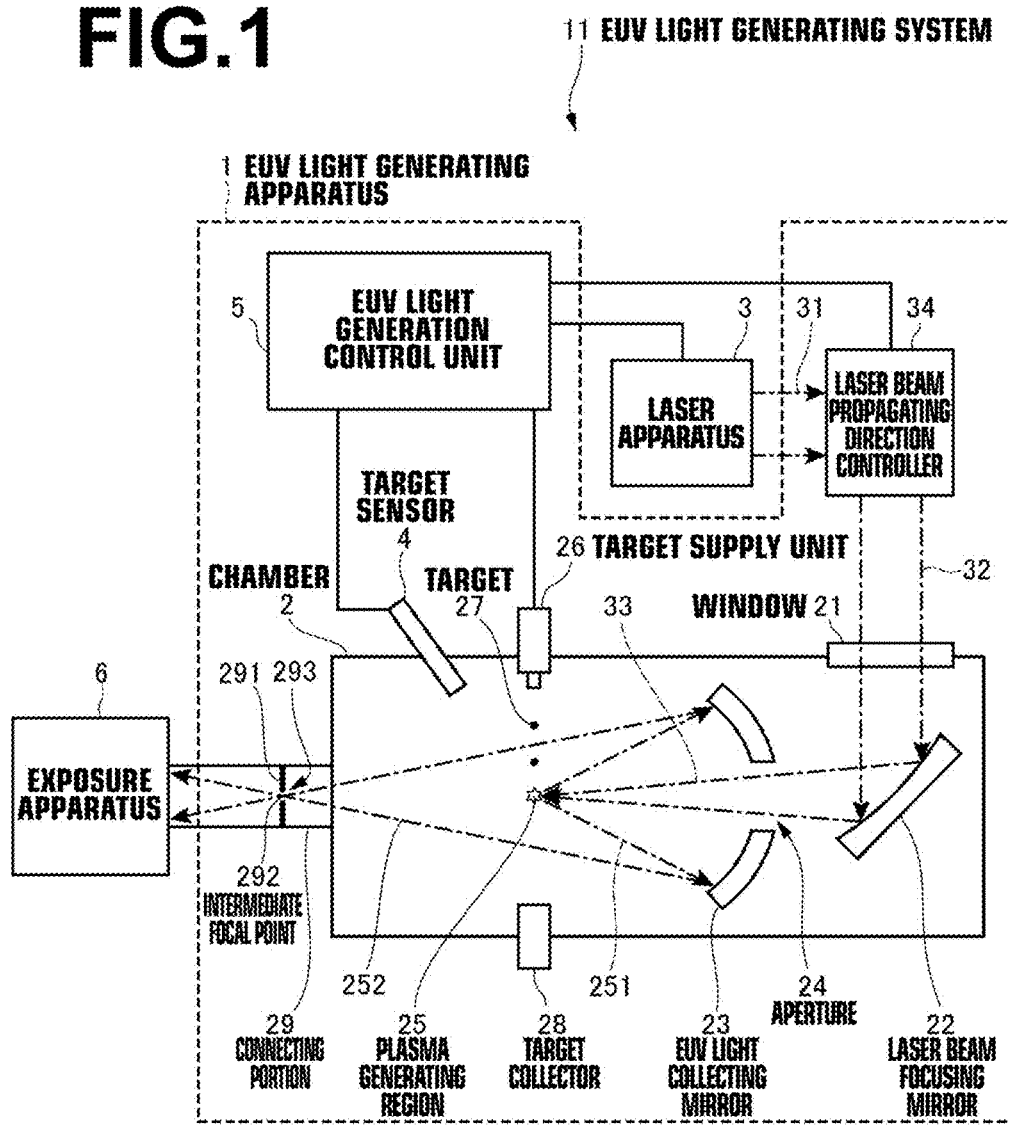
FIG. 1 is a diagram that schematically illustrates the configuration of an exemplary EUV light generating system of the LPP type.

<Contents>
1. Overview of EUV Light Generating System
   1.1 Configuration
   1.2 Operation
2. Terms
3. Problem
   3.1 Configuration of Comparative Example
   3.2 Operation of Comparative Example
   3.3 Problem 4. First Embodiment
   4.1 Configuration
   4.2 Operation
   4.3 Obtainment of Data Table for Accumulated Amounts $Q_i$ and Positions $X_i$, as well as Discharge Time Constant $\tau$
   4.4 Operative Effects
5. Second Embodiment
6. Third Embodiment
7. Processes Performed by Control Unit Related to Obtainment of Data Table for Accumulated Amounts $Q_i$ and Positions $X_i$, as well as Discharge Time Constant $\tau$
8. Fourth Embodiment
   8.1 Configuration
   8.2 Operation
   8.3 Operative Effects
9. Fifth Embodiment
   9.1 Configuration
   9.2 Operation
   9.3 Operative Effects
10. Sixth Embodiment
   10.1 Configuration
   10.2 Operation
   10.3 Operative Effects
11. Seventh Embodiment
   11.1 Configuration
   11.2 Operation
   11.3 Operative Effects
12. Eighth Embodiment
   12.1 Configuration
   12.2 Operation
   12.3 Operative Effects
13. Ninth Embodiment
   13.1 Configuration
   13.2 Operation
   13.3 Operative Effects
14. Other Items
   14.1 Hardware Environment of Control Units
   14.2 Other Modifications, etc.

Embodiments of the present disclosure will be described in detail with reference to the attached drawings. The embodiments to be described below are illustrative examples of the present disclosure, and do not limit the scope of the present disclosure. In addition, not all of the configurations and operations of the embodiments to be described below are necessarily essential configurations and operations of the present disclosure. Note that common constituent elements will be denoted with the same reference numerals, and redundant descriptions will be omitted.

1. Overview of EUV Light Generating System

[1.1 Configuration]

FIG. 1 is a diagram that schematically illustrates the configuration of an exemplary EUV light generating system of the LPP type.

An EUV light generating apparatus 1 may be employed with at least one laser apparatus 3. In the present disclosure, a system that includes the EUV light generating apparatus 1 and the laser apparatus 3 may be referred to as an EUV light generating system 11. As illustrated in FIG. 1 and described in detail later, the EUV light generating apparatus 1 may include a chamber 2 and a target supply unit 26. The chamber 2 may be capable of being sealed to be gastight. The target supply unit 26 may be mounted on the chamber 2 so as to penetrate through a wall of the chamber 2, for example. The material of a target 27 which is supplied by the target supply unit 26 may include, but is not limited to, tin, terbium, gadolinium, lithium, xenon, or any combination of two or more of these substances.

A wall of the chamber 2 may have at least one aperture penetrating therethrough. A window 21 may be provided at the aperture. A pulsed laser beam 32 which is output from the laser apparatus 3 may be transmitted through the window 21. An EUV light collecting mirror 23 having a spheroidal reflective surface may be provided in the chamber 2, for example. The EUV light collecting mirror 23 may have a first focal point and a second focal point. The surface of the EUV light collecting mirror 23 may have a multi layered reflective film, in which molybdenum layers and silicon layers are alternately laminated, formed thereon, for example. It is preferable for the EUV light collecting mirror 23 to be provided such that the first focal point is positioned in a plasma generating region 25 and the second focal point is positioned at an intermediate focal (IF) point 292, for example. The EUV light collecting mirror 23 may have an aperture 24 formed at the center thereof, and a pulsed laser beam 33 may pass through the aperture 24.

The EUV light generating apparatus 1 may further include an EUV light generation control unit 5, a target sensor 4, etc. The target sensor 4 may have an image capturing function and may be configured to detect the presence, the trajectory, the position, the velocity, etc. of the target 27.

In addition, the EUV light generating apparatus 1 may include a connecting portion 29 that enables the interior of the chamber 2 to be in communication with the interior of an exposure apparatus 6. A wall 291 having an aperture 293 formed therethrough may be provided in the connecting portion 29. The wall 291 may be provided such that the aperture 293 is positioned at the second focal point of the EUV light collecting mirror 23.

Further, the EUV light generating apparatus 1 may include a laser beam propagating direction control unit 34, a laser beam focusing mirror 22, and a target collector 28 for collecting the target 27. The laser beam propagating direction controlling unit 34 may be equipped with an optical element for regulating the propagating direction of a laser beam, and an actuator for adjusting the position, orientation, etc. of the optical element.

[1.2 Operation]

Referring to FIG. 1, a pulsed laser beam 31 which is output from the laser apparatus 3 may propagate via the laser beam propagating direction control unit 34, be transmitted through the window 21 as the pulsed laser beam 32, and then enter the chamber 2. The pulsed laser beam 32 may propagate through the chamber 2 along at least one laser beam path and be reflected by the laser beam focusing mirror 22, and at least one target 27 may be irradiated with the laser beam, which is the pulsed laser beam 33.

The target supply unit 26 may be configured to output the target 27 toward the plasma generating region 25 in the interior of the chamber 2. The target 27 may be irradiated with at least one pulse which is included in the pulsed laser beam 33. The target 27 which is irradiated with the pulsed laser beam 33 may turn into plasma, and EUV light 251 may be emitted from the plasma along with light having other wavelengths. The EUV light 251 may be selectively reflected by the EUV light collecting mirror 23. EUV light 252 which is reflected by the EUV light collecting mirror 23 may be focused at the intermediate focal point 292, and output to the exposure apparatus 6. Note that a single target 27 may be irradiated with a plurality of pulses which are included in the pulsed laser beam 33.

The EUV light generation control unit 5 may be configured to totally control the entire EUV light generating system 11. The EUV light generation control unit 5 may be configured to process image data of the target 27 captured by the target sensor 4 or the like. In addition, the EUV light generation control unit 5 may control at least one of the timing at which the target 27 is output and the output direction of the target 27, for example. Further, the EUV light generation control unit 5 may control at least one of the output timing of the laser apparatus 3, the propagating direction of the pulsed laser beam 32, and the focal position of the pulsed laser beam 33, for example. The above items which are controlled are merely examples, and other additional items may be controlled as necessary.

2. Terms

A "target" refers to a substance which is introduced into a chamber and is irradiated with a laser beam. The target which is irradiated with the laser beam turns into plasma and emits EUV light.

A "droplet" refers to one form in which the target is supplied into the chamber.

A "plasma generating region" refers to a predetermined region within the chamber. The plasma generating region is a region in which the target which is output into the chamber is irradiated with the laser beam, and the target turns into plasma.

A "droplet trajectory" is a path that a droplet which is output to the interior of the chamber travels along. The droplet trajectory may intersect the optical path of the laser beam which is introduced to the interior of the chamber, at the plasma generating region.

An "axis of an optical path" refers to an axis that passes through the center of the cross section of a light beam along the direction in which the light propagates.

An "optical path" refers to a path through which light passes. The optical path may include the axis of the optical path.

A "Z axis direction" is a direction in which the EUV light generating apparatus outputs EUV light. That is, the Z axis direction is the direction in which EUV light is output from the chamber of the EUV light generating apparatus to the exposure apparatus.

A "Y axis direction" is a direction in which the target supply unit outputs the target to the interior of the chamber.

An "X axis direction" is a direction that perpendicularly intersects the Y axis direction and the Z axis direction.

3. Problem

An EUV light generating apparatus 1 of a comparative example will be described with reference to FIG. 2 through FIG. 10.

The EUV light generating apparatus 1 of the comparative example may be an EUV light generating apparatus 1 that includes an image measuring unit 45.

[3.1 Configuration of Comparative Example]

Figure 2:
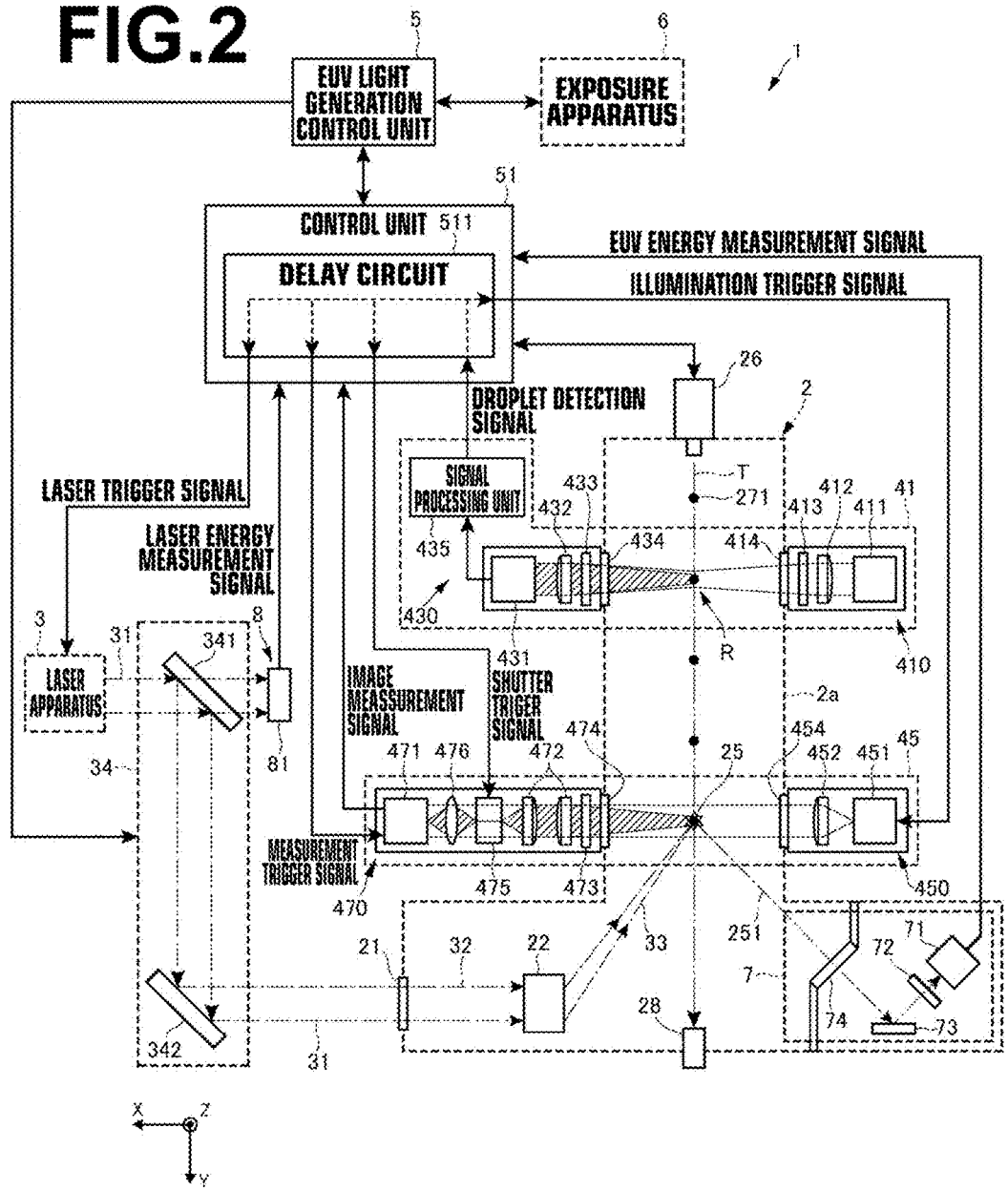
FIG. 2 is a diagram for explaining the configuration of the EUV light generating apparatus of the comparative example.

FIG. 2 is a diagram for explaining the configuration of the EUV light generating apparatus 1 of the comparative example.

The EUV light generating apparatus 1 of the comparative example may be equipped with the chamber 2, the laser beam propagating direction control unit 34, a beam splitter 341, a mirror 342, the laser beam focusing mirror 22, the target supply unit 26, and the target collector 28. In addition, the EUV light generating apparatus 1 of the comparative example may include a droplet detector 41, the image measuring unit 45, a first light energy measuring unit 7, a second light energy measuring unit 8, the EUV light generation control unit 5, and a control unit 51.

As described above, the chamber 2 may be a container into which a droplet 271 is supplied by the target supply unit 26 and within which the droplet 271 is irradiated with the pulsed laser beam 33 to generate plasma and to generate the EUV light 252.

A wall 2a of the chamber 2 may form an interior space of the chamber 2 and partition the interior space of the chamber 2 from the exterior.

The laser beam propagating direction control unit 34 may control the propagating direction of the pulsed laser beam 31 such that the pulsed laser beam 31 which is output from the laser apparatus 3 is transmitted through the window 21 as the pulsed laser beam 32.

The operation of the laser beam propagating direction control unit 34 may be controlled by the EUV light generation control unit 5.

The beam splitter 341 may be provided between the laser apparatus 3 and the mirror 342, along an optical path of the pulsed laser beam 31 output from the laser apparatus 3.

The beam splitter 341 may transmit a portion of the pulsed laser beam 31 toward the second light energy measuring unit 8, and may reflect another portion of the pulsed laser beam 31 toward the mirror 342.

The beam splitter 341 may be included within the laser beam propagating direction control unit 34.

The mirror 342 may be provided along the optical path of the pulsed laser beam 31 which is reflected by the beam splitter 341.

The mirror 342 may reflect the pulsed laser beam 31, which is reflected by the beam splitter 241, toward the window 21.

The mirror 342 may be included within the laser beam propagating direction control unit 34.

The laser beam focusing mirror 22 may reflect the pulsed laser beam 32, which is transmitted through the window 21, toward the plasma generating region 25. The laser beam focusing mirror 22 may focus the reflected pulsed laser beam 32 in the plasma generating region 25 as the pulsed laser beam 33.

The laser beam focusing mirror 22 may be mounted on a stage, which is not illustrated, that adjusts the position and the orientation thereof.

The target supply unit 26 may be a device that melts the target 27 to be supplied to the interior of the chamber 2, and outputs the target 27 toward the plasma generating region 25 in the interior of the chamber 2 as the droplet 271. The target supply unit 26 may be a device that outputs the droplet 271 by the so called continuous jet method.

The target 27 which is supplied by the target supply unit 26 may be formed by a metal material. The metal material that forms the target 27 may be tin, terbium, gadolinium, or any combination including two or more thereof. Preferably, the metal material that forms the target 27 may be tin.

The target supply unit 26 may be provided on the wall 2a of the chamber 2.

The operation of the target supply unit 26 may be controlled by the control unit 51.

The target collector 28 may be a device that collects droplets 271 which are not irradiated with the pulsed laser beam 33, from among the droplets 271 which are output to the interior of the chamber 2.

The target collector 28 may be provided on the wall 2a of the chamber 2 along a line that extends from a droplet trajectory T.

The droplet detector 41 may be a detector that detects the droplet 271 which is output to the interior of the chamber 2.

Specifically, the droplet detector 41 may be a detector that detects a timing at which the droplet 271 passes through a predetermined detection region R, which is at a predetermined position in the interior of the chamber 2. The predetermined position at which the detection region R is located may be a position along the droplet trajectory T between the target supply unit 26 and the plasma generating region 25.

The droplet detector 41 may include an illuminating unit 410, a light receiving unit 430, a window 414, and a window 434.

The illuminating unit 410 and the light receiving unit 430 may respectively be connected to the wall 2a of the chamber 2 via the window 414 and the window 434.

The illuminating unit 410 and the light receiving unit 430 may be arranged such that they face each other with the detection region R along the droplet trajectory T interposed therebetween. The direction along which the illuminating unit 410 and the light receiving unit 430 face each other may substantially perpendicularly intersect the droplet trajectory T.

The illuminating unit 410 may output illuminating light to the detection region R in the interior of the chamber 2.

The illuminating unit 410 may include a light source 411, an illuminating optical system 412, and an optical filter 413.

The light source 411 may be a light source that outputs illuminating light so as to illuminate the droplet 271 that passes through the detection region R.

The light source 411 may be constituted by a light source that outputs continuous light of a single wavelength, such as a CW (Continuous Wave) laser. Alternatively, the light source 411 may be constituted by a light source that continuously outputs pulsed light.

The illuminating optical system 412 may be an optical system that includes a focusing lens and the like. The focusing lens may be a cylindrical lens, for example.

The illuminating optical system 412 may be provided along an optical path of the illuminating light which is output from the light source 411.

The illuminating optical system 412 may transmit the illuminating light which is output from the light source 411, and guide the transmitted illuminating light to the optical filter 413. The illuminating optical system 412 may shape and focus the illuminating light, which is output from the light source 411, at the detection region R, via the optical filter 413 and the window 414.

The optical filer 413 may be an optical filter having a high transmissivity with respect to the wavelength of the illuminating light which is output from the light source, and a low transmissivity with respect to many of the wavelengths of light emitted from the plasma.

The optical filter 413 may be a bandpass filter having a high transmissivity with respect to the wavelength of the illuminating light which is output from the light source.

The optical filter 413 may be provided along an optical path of the illuminating light which is transmitted through the illuminating optical system 412.

The optical filter 413 may transit the illuminating light, which is transmitted through the illuminating optical system 412, toward the window 414. The optical filter 413 may prevent the light which is emitted from the plasma from entering the light source 411 via the illuminating optical system 412.

The window 414 may be provided in the wall 2a of the chamber 2. The window 414 may be mounted in the wall 2a via a sealing member, which is not illustrated, such that the pressure in the interior of the chamber 2 is maintained at a pressure approximating a vacuum.

The window 414 may be provided along an optical path of the illuminating light which is transmitted through the optical filter 413. The optical filter 414 may be arranged to face the detection region R. The window 414 may be arranged such that it faces the window 434 with the detection region R interposed therebetween.

The window 414 may transmit the illuminating light, which is transmitted through the optical filter 413, toward the detection region R.

The light receiving unit 430 may receive the illuminating light which is output to the detection region R.

The light receiving unit 430 may include a light sensor 431, a light receiving optical system 432, an optical filter 433, and a signal processing unit 435.

The window 434 may be provided in the wall 2a of the chamber 2. The window 434 may be mounted in the wall 2a via a sealing member, which is not illustrated, such that the pressure in the interior of the chamber 2 is maintained at a pressure approximating a vacuum.

The window 434 may be arranged to face the detection region R. The window 434 may be arranged to face the window 414 with the detection region R interposed therebetween.

The window 434 may be provided along an optical path of the illuminating light which is output to the detection region R.

The window 434 may transmit the illuminating light, which is output to the detection region R, toward the optical filter 433.

The optical filter 433 may be an optical filter having a high transmissivity with respect to the wavelength of the illuminating light which is output from the light source 411, and a low transmissivity with respect to many of the wavelengths of light which is emitted from the plasma.

The optical filter 433 may be a bandpass filter having a high transmissivity with respect to the wavelength of the illuminating light which is output from the light source 411.

The optical filter 433 may be provided along an optical path of the illuminating light which is transmitted through the window 434.

The optical filter 433 may transmit the illuminating light, which is transmitted through the window 434, toward the light receiving optical system 432. The optical filter 433 may prevent the light which is emitted from the plasma from entering the light sensor 431 via the light receiving optical system 432.

The light receiving optical system 432 may be an optical system such as a collimator, and may be constituted by optical elements such as lenses.

The light receiving optical system 432 may be provided along an optical path of the illuminating light which is transmitted through the optical filter 433.

The light receiving optical system 432 may transmit the illuminating light, which is transmitted through the optical filter 433, and guide the transmitted illuminating light toward the light sensor 431. The light receiving optical system 432 may shape the illuminating light which is transmitted through the optical filter 433 and guide the shaped illuminating light to a detecting surface of the light sensor 431. The light receiving optical system 432 may form an image of the illuminating light, which is output to the detection region R, at the detection region R, on the detecting surface of the light sensor 431.

The light sensor 431 may detect the droplet 271 that passes through the detection region R, by detecting the illuminating light, which is output so as to illuminate the droplet 271 that passes through the detection region R.

The light sensor 431 may be a light sensor having a single channel. Alternatively, the light sensor 431 may be a light sensor having a plurality of channels which are arranged one-dimensionally or two-dimensionally.

The light sensor 431 may be constituted by including detecting elements such as a photodiode array, a photomultiplier, and a multi pixel photocounter.

The light sensor 431 may be provided along an optical path of the illuminating light which is transmitted through the light receiving optical system 432.

The light sensor 431 may detect the light intensity represented by the image of the illuminating light which is formed by the light receiving optical system 432. The light intensity of the illuminating light which is detected by the light sensor 431 may change each time that the droplet 271 passes through the detection region R. The light sensor 431 may convert the detected light intensity of the illuminating light to a voltage value, generate a detection signal corresponding to the change in the light intensity, and send the detection signal to the signal processing unit 435.

The signal processing unit 435 may receive the detection signal from the light sensor 431.

The signal processing unit 435 may generate a droplet detection signal at a timing at which the detection signal from the light sensor 431 becomes lower than a predetermined threshold value.

The droplet detection signal may be a signal that indicates that the droplet 271 has passed through the detection region R.

The signal processing unit 435 may send the generated droplet detection signal to the control unit 51.

The image measuring unit 45 may be a measuring device that captures an image of the droplet 271 which is supplied to the plasma generating region 25, and measures the state of the droplet 271 supplied to the plasma generating region 25.

The state of the droplet 271 supplied to the plasma generating region 25 may be a mechanistic state, such as the size, the shape, the position, the velocity, etc. of the droplet 271 supplied to the plasma generating region 25.

The image measuring unit 45 may include an illuminating unit 450, an imaging unit 470, a window 454, and a window 474.

The illuminating unit 450 and the imaging unit 470 may respectively be connected to the wall 2a of the chamber 2 via the window 454 and the window 474.

The illuminating unit 450 and the imaging unit 470 may be arranged such that they face each other with the plasma generating region 25 interposed therebetween. The direction along which the illuminating unit 450 and the imaging unit 470 face each other may substantially perpendicularly intersect the droplet trajectory T.

The illuminating unit 450 may output illuminating light to the plasma generating region 25.

The illuminating unit 450 may include a light source 451 and an illuminating optical system 452.

The light source 451 may be a light source that outputs the illuminating light to the plasma generating region 25 so as to illuminate the droplet 271 supplied to the plasma generating region 25.

The light source 451 may be constituted by a light source that outputs pulsed light, such as a flash lamp and a laser.

The operation of the light source 451 may be controlled by the control unit 51.

The illuminating optical system 452 may be an optical system such as a collimator, and may be constituted by optical elements such as lenses.

The illuminating optical system 452 may be provided along an optical path of the illuminating light which is output from the light source 451.

The illuminating optical system 452 may transmit the illuminating light, which is output from the light source 451, and guide the transmitted illuminating light toward the window 454. The illuminating optical system 452 may shape the illuminating light which is output from the light source 451 and guide the shaped illuminating light to the plasma generating region 25 via the window 454.

The window 454 may be provided in the wall 2a of the chamber 2. The window 454 may be mounted in the wall 2a of the chamber 2 via a sealing member, which is not illustrated, such that the pressure in the interior of the chamber 2 is maintained at a pressure approximating a vacuum.

The window 454 may be provided along an optical path of the illuminating light which is transmitted through the illuminating optical system 452. The window 454 may be arranged to face the plasma generating region 25. The window 454 may be arranged such that it faces the window 474 with the plasma generating region 25 interposed therebetween.

The window 454 may transmit the illuminating light, which is transmitted through the illuminating optical system 452, toward the plasma generating region 25.

The imaging unit 470 may capture an image of the plasma generating region 25. The imaging unit 470 may capture an image of the droplet 271 supplied to the plasma generating region 25.

The imaging unit 470 may include an image sensor 471, an image forming optical system 472, an optical filter 473, the window 474, an optical shutter 475, and a transfer optical system 476. Note that the image forming optical system 472 may constitute a first image forming optical system of the present disclosure, and the transfer optical system 476 may constitute a second image forming optical system of the present disclosure.

The window 474 may be provided in the wall 2a of the chamber 2. The window 474 may be mounted in the wall 2a of the chamber 2 via a sealing member, which is not illustrated, such that the pressure in the interior of the chamber 2 is maintained at a pressure approximating a vacuum.

The window 474 may be arranged to face the plasma generating region 25. The window 474 may be arranged such that it faces the window 454 with the plasma generating region 25 interposed therebetween.

The window 474 may be provided along the optical path of the illuminating light, which is output to the plasma generating region 25.

The window 474 may transmit the illuminating light, which is output to the plasma generating region 25, toward the optical filter 473.

Note that the window 474 may be included in the imaging unit 470.

The optical filter 473 may be an optical filter having a high transmissivity with respect to the wavelength of the illuminating light which is output from the light source 451, and a low transmissivity with respect to many of the wavelengths of light which is emitted from the plasma.

The optical filter 473 may be a notch filter having a low transmissivity with respect to many of the wavelengths of the light which is emitted from the plasma.

The optical filter 473 may be provided along an optical path of the illuminating light which is transmitted through the window 474.

The optical filter 473 may transmit the illuminating light, which is transmitted through the window 474, toward the image forming optical system 472. The optical filter 473 may prevent the light which is emitted from the plasma from entering the image sensor 471 via the image forming optical system 472, the optical shutter 475, and the transfer optical system 476.

The image forming optical system 472 may be constituted by an optical system in which a plurality of lenses is combined.

The image forming optical system 472 may be provided along an optical path of the illuminating light which is transmitted through the optical filter 473. The image forming optical system 472 may be provided remote from the window 474.

The image forming optical system 472 may be arranged such that the focal point of the lens thereof positioned most toward the plasma generating region 25 is at the plasma generating region 25. The image forming optical system 472 may be arranged such that the focal point of a lens thereof positioned at the side of the plasma generating region 25 is at the position of the droplet 271 supplied to the plasma generating region 25. The above focal point will be referred to as focal point F hereinafter.

The image forming optical system 472 may transmit the illuminating light, which is transmitted through the optical filter 473, and guide the transmitted illuminating light to the optical shutter 475. The image forming optical system 472 may shape the illuminating light which is transmitted through the optical filter 473 and focus the shaped illuminating light on a surface at a light input side of the optical shutter 475. The image forming optical system 472 may form an image of the illuminating light, which is output to the plasma generating region 25, at the plasma generating region 25, on the surface at the light input side of the optical shutter 475.

The optical shutter 475 may regulate the passage of light, which is transmitted through the image forming optical system 472, by opening and closing operations thereof.

The optical shutter 475 may be provided along an optical path of the illuminating light which is transmitted through the image forming optical system 472.

The optical shutter 475 may be constituted by a shutter capable of high speed opening and closing operations, such as an image intensifier. The image intensifier includes a photoelectric surface at the light input side, a reverse bias applying unit that controls the passage of electrons, a multichannel plate that controls amplification of electrons, and a phosphorous surface that converts electrons to light. High speed operation of the shutter is enabled, by changing the electrical potential of the multichannel plate at high speed. Further, the image intensifier reproduces and outputs an image, which is formed on the photoelectric surface at the light input side during the time that the shutter is open, on the phosphorous surface.

In an open state, the optical shutter 475 may enable the illuminating light, which is transmitted through the image forming optical system 472, to pass therethrough. In the open state, the optical shutter 475 may reproduce and output the image at the plasma generating region 25, which is formed on the surface of the optical shutter 475 at the light input side by the image forming optical system 472, on a surface of the optical shutter 475 at the light output side.

In a closed state, the optical shutter 475 may suppress the passage therethrough of the illuminating light, which is transmitted through the image forming optical system 472.

The operation of the optical shutter 475 may be controlled by the control unit 51.

The transfer optical system 476 may be constituted by an optical system that includes a focusing lens, etc.

The transfer optical system 476 may be provided along an optical path of the illuminating light that passes through the optical shutter 475.

The transfer optical system 476 may transmit the illuminating light that passes through the optical shutter 475, and guide the illuminating light to the image sensor 471. The transfer optical system 476 may transfer the image of the illuminating light at the plasma generating region 25, which is formed on the surface of the optical shutter 475 at the light output side, onto a detecting surface of the image sensor 471.

The image sensor 471 may be a light sensor that obtains an image of the illuminating light, which is output so as to illuminate the droplet 271 that is supplied to the plasma generating region 25.

The image sensor 471 may be provided along an optical path of the illuminating light which is transmitted through the transfer optical system 476.

The image sensor 471 may obtain an image of the droplet 271 supplied to the plasma generating region 25, by obtaining the image of the illuminating light, which is output so as to illuminate the droplet 271 that is supplied to the plasma generating region 25.

The image sensor 471 may be constituted by including a detecting element such as a CCD (Charge-Coupled Device).

The image sensor 471 may be exposed to the illuminating light which is transmitted through the transfer optical system 476, and obtain the image of the illuminating light which is transferred by the transfer optical system 476 at the plasma generating region 25. The image sensor 471 may generate image data from the obtained image, and send an image measurement signal that includes the generated image data to the control unit 51. In addition, the image sensor 471 may measure the state of the droplet 271 from the generated image data, include the measured values in the image measurement signal, and send the image measurement signal to the control unit 51.

The first light energy measuring unit 7 may be a device that measures the energy of the EUV light 251 which is emitted from the plasma.

The energy of the EUV light 251 which is emitted from the plasma may be light energy which is generated in the EUV light generating apparatus 1 when the EUV light 251 is generated.

The first light energy measuring unit 7 may include an EUV energy sensor 71, an optical filter 72, a mirror 73, and a pinhole plate 74.

The pinhole plate 74 may be arranged to face the plasma generating region 25.

An aperture, through which the light which is emitted from the plasma passes, may be formed in the pinhole plate 74.

The aperture of the pinhole plate 74 may cause the light which is emitted from the plasma to pass therethrough toward the mirror 73.

The mirror 73 may be configured to have a high reflectance with respect to the wavelength of the EUV light 251. A reflective surface of the mirror 73 may be formed by a multilayered film formed by molybdenum and silicon.

The mirror 73 may be provided along an optical axis of the light that passes through the aperture of the pinhole plate 74.

The mirror 73 may reflect light that includes the EUV light 251 from the light that passes through the aperture of the pinhole plate 74 toward the optical filter 72.

The optical filter 72 may be an optical filter having a high transmissivity with respect to the wavelength of the EUV light 251 and a low transmissivity with respect to many wavelengths of light different from the EUV light 251.

The optical filter 72 may be an optical filter formed by a thin zirconium film or a thin zirconium film that includes silicon.

The optical filter 72 may be provided along an optical path of the light which is reflected by the mirror 73.

The optical filter 72 may transmit the EUV light 251, which is included in the light reflected by the mirror 73, toward the EUV energy sensor 71. The optical filter 72 may prevent light included in the light reflected by the mirror 73 having wavelengths different from that of the EUV light 251 from entering the EUV energy sensor 71.

The EUV energy sensor 71 may be a light sensor that measures the energy of the EUV light 251.

The EUV energy sensor 71 may be constituted by including a detecting element such as a silicon photodiode having a high sensitivity with respect to the wavelength of the EUV light 251.

The EUV energy sensor 71 may be provided along an optical path of the EUV light 251 which is transmitted through the optical filter 72.

The EUV energy sensor 71 may detect the energy of the EUV light 251 which is transmitted through the optical filter 72, and estimate the energy of the EUV light 251 which is emitted from the plasma based on the detected value. The EUV energy sensor 71 may designate this estimated value as the measured value of the energy of the EUV light 251 which is emitted from the plasma. The EUV energy sensor 71 may send an EUV energy measurement signal that includes this measured value to the control unit 51.

The second light energy measuring unit 8 may be a measuring device that measures the energy of one of the pulsed laser beams 31 through 33.

The respective energies of the pulsed laser beams 31 through 33 may be light energy which is generated in the EUV light generating apparatus 1 when the EUV light 251 is generated.

The second light energy measuring unit 8 may include a laser energy sensor 81.

The laser energy sensor 81 may be a light sensor that measures the energy of the pulsed laser beam 31.

The laser energy sensor 81 may be constituted by including a detecting element having a high sensitivity with respect to the wavelength of the pulsed laser beam 31.

The laser energy sensor 81 may be provided along an optical path of the pulsed laser beam 31 which is transmitted through the beam splitter 341.

The laser energy sensor 81 may detect the energy of the pulsed laser beam 31 which is transmitted through the beam splitter 341, and estimate the energy of the pulsed laser beam 33 with which the droplet 271 is irradiated based on the detected value. The laser energy sensor 81 may designate this estimated value as the measured value of the pulsed laser beam 33 with which the droplet 271 is irradiated. The laser energy sensor 81 may send a laser energy measurement signal that includes this measured value to the control unit 51.

Note that the laser energy sensor 81 may detect the energy of one of the pulsed laser beams 31 through 33. In this case, the beam splitter 341 may be provided along the optical path of one of the pulsed laser beams 31 through 33 to be detected by the laser energy sensor 81.

The EUV light generation control unit 5 may send and receive various signals to and from the exposure apparatus 6.

The EUV light generation control unit 5 may totally control the operations of the constituent elements of the EUV light generating system 11, based on various signals which are received from the exposure apparatus 6.

The EUV light generation control unit 5 may send and receive various signals to and from the laser apparatus 3.

The EUV light generation control unit 5 may send and receive various signals to and from the laser beam propagating direction control unit 34 as well as to and from the stage on which the laser beam focusing mirror 22 is mounted. Thereby, the EUV light generation control unit 5 may control the propagating directions and the focusing positions of the pulsed laser beams 31 through 33.

The EUV light generation control unit 5 may send and receive various signals to and from control unit 51.

For example, the EUV light generation control unit 51 may receive signals that include data related to the droplet 271, the pulsed laser beam 31, and the EUV light 251 from the control unit 51. The EUV light generation control unit 5 may send signals that include various control commands to the control unit 51, such that the EUV light 252 is stably output.

Thereby, the EUV light generation control unit 5 may indirectly control the operations of the constituent elements which are included in the target supply unit 26, the droplet detector 41, the image measuring unit 45, the first light energy measuring unit 7, and the second light energy measuring unit 8.

The control unit 51 may send and receive various signals to and from the constituent elements of the EUV light generating apparatus 1.

The control unit 51 may control the operations of the constituent elements which are included in the droplet detector 41, the image measuring unit 45, the first light energy measuring unit 7, and the second light energy measuring unit 8, based on control commands received from the EUV light generation control unit 5.

The control unit 51 may include a delay circuit 511 for controlling the operational timings of the constituent elements which are included in the image measuring unit 45 and the laser apparatus 3.

[3.2 Operation of Comparative Example]

The target supply unit 26 may output the droplet 271 toward the plasma generating region 25 in the interior of the chamber 2, according to a control command from the control unit 51.

The droplet 271 which is output to the interior of the chamber 2 may travel along the droplet trajectory T, and pass through the detection region R.

The light source 411 of the droplet detector 41 may output the illuminating light to the detection region R according to a control command from the control unit 51 so as to illuminate the droplet 271 that passes through the detection region R.

The light sensor 431 may detect the illuminating light which is output to the detection region R.

In the case that the droplet 271 that travels along the droplet trajectory T passes through the detection region R, a portion of the illuminating light which is output from the light source 411 may be shielded by the droplet 271 that passes through the detection region R.

Accordingly, in the case that the droplet 271 passes through the detection region R, the light intensity of the illuminating light which is detected by the light sensor 431 will significantly decrease compared to a case in which the droplet 271 is not passing through the detection region R.

The light sensor 431 may generate the detection signal corresponding to the change in the light intensity of the detected illuminating light, and may send the detection signal to the signal processing unit 435.

The signal processing unit 435 may generate the droplet detection signal based on the detection signal which is sent from the light sensor 431, and send the droplet detection signal to the control unit 51.

The control unit 51 may add a first delay time to a timing at which the droplet detection signal is received by employing the delay circuit 511. The control unit 51 may send an illumination trigger signal to the light source 451 of the image measuring unit 45 at a timing, which is delayed from the timing at which the droplet detection signal is received by the first delay time.

The illumination trigger signal may be a signal that provides momentum to the light source 451 to output the illuminating light.

The first delay time may be an amount of time that causes the timing at which the illuminating light from the light source 451 enters the plasma generating region 25 and the timing at which the droplet 271 reaches the plasma generating region 25 to substantially match.

The control unit 51 may add a second delay time to the timing at which the droplet detection signal is received by employing the delay circuit 511. The control unit 51 may send a shutter trigger signal to the optical shutter 475 of the image measuring unit 45 at a timing, which is delayed from the timing at which the droplet detection signal is received by the second delay time.

The shutter trigger signal may be a signal that provides momentum to the optical shutter 475 to transition to an open state.

The second delay time may be an amount of time that causes the timing at which the optical shutter 475 transitions to the open state and the timing at which illuminating light from the light source 451 enters the optical shutter 475 to substantially match.

The control unit 51 may add a third delay time to the timing at which the droplet detection signal is received by employing the delay circuit 511. The control unit 51 may send a measurement trigger signal to the image sensor 471 of the image measuring unit 45 at a timing, which is delayed from the timing at which the droplet detection signal is received by the third delay time.

The measurement trigger signal may be a signal that provides momentum to the image sensor 471 to be exposed to the illuminating light and to obtain an image thereof.

The third delay time may be an amount of time that causes the timing at which the image sensor 471 is exposed to the illuminating light and obtains an image thereof, and the timing at which illuminating light from the light source 451 enters the image sensor 471, to substantially match.

The control unit 51 may add a fourth delay time to the timing at which the droplet detection signal is received by employing the delay circuit 511. The control unit 51 may send a laser trigger signal to the laser apparatus 3 at a timing, which is delayed from the timing at which the droplet detection signal is received by the fourth delay time.

The laser trigger signal may be a signal that provides momentum to the laser apparatus 3 to output the pulsed laser beam 31.

The fourth delay time may be an amount of time that causes the timing at which the pulsed laser beam 33 is focused at the plasma generating region 25 and the timing at which the droplet 271 reaches the plasma generating region 25 to substantially match.

The first through fourth delay times may be stored in the control unit 51 in advance.

When the light source 451 of the image measuring unit 45 receives the illumination trigger signal, the light source 451 of the image measuring unit 45 may output the illuminating light to the plasma generating region 25 so as to illuminate the droplet 271 supplied to the plasma generating region 25.

When the optical shutter 475 receives the shutter trigger signal, the optical shutter 475 may transition to the open state, and pass the illuminating light which is output to the plasma generating region 25 therethrough.

When the image sensor 471 receives the measurement trigger signal, the image sensor 471 may be exposed to the illuminating light and obtain an image thereof.

In the case that the droplet 271 which has passed through the detection region R reaches the plasma generating region 25, a portion of the illuminating light which is output to the plasma generating region 25 may be shielded by illuminating the droplet 271.

For this reason, in the case that the droplet 271 reaches the plasma generating region 25, a portion of the image of the illuminating light at the plasma generating region 25 may be transferred to the image sensor 471 as an image of a shadow of the droplet 271.

Accordingly, in the case that the droplet 271 reaches the plasma generating region 25, the image of the illuminating light which is obtained by the image sensor 471 may include the image of the shadow of the droplet 271.

The image sensor 471 may generate image data corresponding to the obtained image, and send the image measurement signal that includes the generated image data to the control unit 51. The image sensor 471 may measure the state of the droplet 271 from the generated image data, include the measured value in the image measurement signal, and send the image measurement signal to the control unit 51.

When the laser apparatus 3 receives the laser trigger signal, the laser apparatus 3 may output the pulsed laser beam 31.

A portion of the pulsed laser beam 31 which is output from the laser apparatus 3 may be transmitted through the beam splitter 341 and enter the laser energy sensor 81 of the second light energy measuring unit 8.

The laser energy sensor 81 may measure the energy of the input pulsed laser beam 31, and send the laser energy measurement signal that includes the measured value to the control unit 51.

In addition, another portion of the pulsed laser beam 31 which is output from the laser apparatus 3 may be reflected by the beam splitter 341, and enter the interior of the chamber 2 via the mirror 342 and the window 21 as the pulsed laser beam 32.

The pulsed laser beam 32 which is introduced to the interior of the chamber 2 may be focused by the laser beam focusing mirror 22, and be guided to the plasma generating region 25 as the pulsed laser beam 33. The pulsed laser beam 33 may be guided to the plasma generating region 25 at the timing at which the droplet 271 reaches the plasma generating region 25.

The droplet 271 which reaches the plasma generating region 25 may be irradiated with the pulsed laser beam 33 which is guided to the plasma generating region 25. The droplet 271 which is irradiated with the pulsed laser beam 33 may generate plasma. The generated plasma may radiate light that includes the EUV light 251.

EUV light 251 having wavelengths in the vicinity of a specific wavelength within the EUV light 251 which is emitted from the plasma may be selectively reflected by the EUV light collecting mirror 23. The selectively reflected EUV light 251 may be focused at the intermediate focal point 292 as the EUV light 252, and the EUV light 252 may be output to the exposure apparatus 6.

In addition, a portion of the EUV light 251 which is emitted from the plasma may enter the EUV energy sensor 71 of the first light energy measuring unit 7.

The EUV energy sensor 71 may measure the energy of the input EUV light 251, and send the EUV energy measurement signal that includes the measured value to the control unit 51.

[3.3 Problem]

Figure 3:
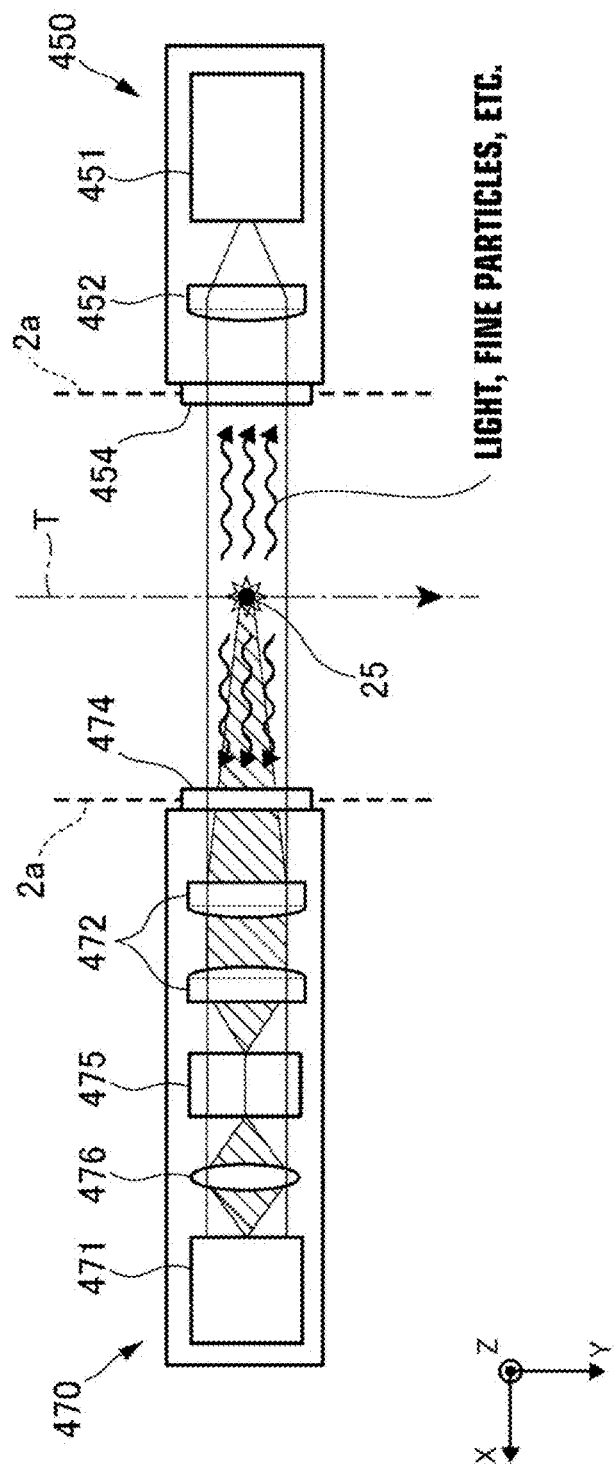
FIG. 3 is a diagram for explaining a problem of the EUV light generating apparatus of the comparative example.

FIG. 3 is a diagram for explaining a problem of the EUV light generating apparatus 1 of the comparative example.

The optical filter 473 is omitted from FIG. 3. The optical filter 473 is omitted from FIG. 4, FIG. 6 through FIG. 9, FIG. 11 through FIG. 14, and FIG. 32 to be described later, in the same manner as in FIG. 3.

As described above, the EUV light generating apparatus 1 may generate the EUV light 251 by the droplet 271 supplied to the plasma generating region 25 being irradiated with the pulsed laser beam 33, thereby turning the droplet 271 into plasma.

When the droplet 271 turns into plasma, light having various wavelengths, such as the EUV light 251, DUV (Deep Ultraviolet) light, UV (Ultraviolet) light, visible light, and infrared light, may be radiated. In addition, fine particles such as atoms, clusters, and ions of the target 27 may be radiated. Energy is imparted to the fine particles which are emitted from the plasma by the pulsed laser beam 33, and therefore the fine particles may have a high amount of kinetic energy.

The light, fine particles, and the like which are emitted from the plasma may enter the wall 2a of the chamber 2 in the vicinity of the plasma generating region 25 and the image measuring unit 45, and may heat the wall 2a of the chamber 2 and the image measuring unit 45. That is, the energy of the light which is emitted from the plasma is light energy which is generated when the EUV light 251 is generated. The light energy may be converted into heat energy within the EUV light generating apparatus 1, and heat the EUV light generating apparatus 1 that includes the wall 2a of the chamber 2 and the image measuring unit 45. Similarly, the kinetic energy of the fine particles which are emitted from the plasma may be converted into heat energy within the EUV light generating apparatus 1, and heat the EUV light generating apparatus 1.

The imaging unit 470 which is included in the image measuring unit 45 is arranged such that it is capable of obtaining an image of the droplet 271 in focus when the focal point F matches the position of the droplet 271, as an example. Note that this focal point F is the focal point of the lens of the image forming optical system 472 positioned most toward the side of the droplet 271, as described previously. In the case that the focal point F shifts form the position of the droplet 271, the imaging unit 470 may obtain images which are out of focus. Therefore, there may be cases in which the image measuring unit 45 cannot appropriately measure the state of the droplet 271 supplied to the plasma generating region 25.

Factors that cause the focal point F of the imaging unit 470 to shift will be described with reference to FIG. 4 through FIG. 10.

Figure 4:
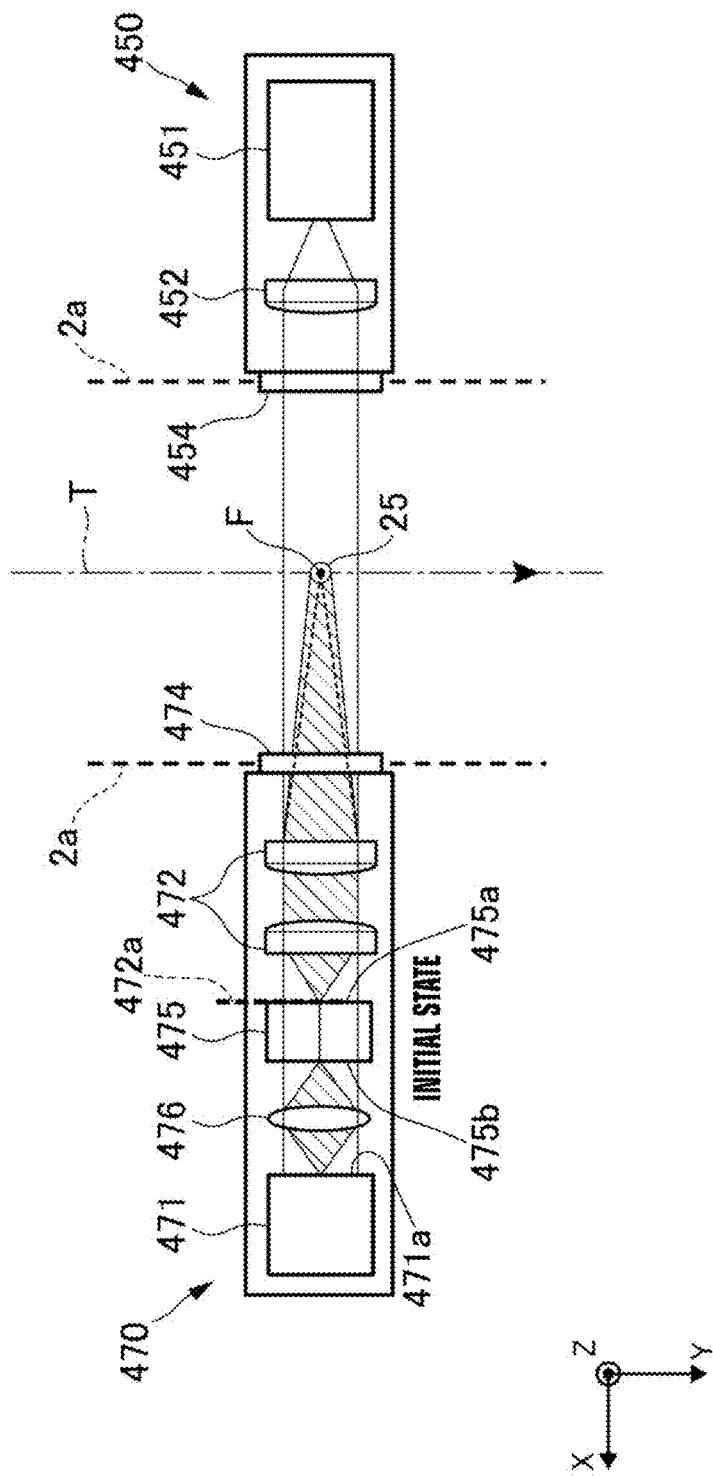
FIG. 4 is a diagram for explaining an initial state of an imaging unit of the comparative example.
Figure 5:
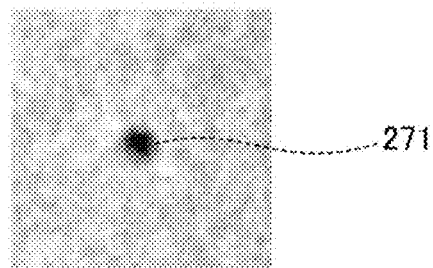
FIG. 5 is a diagram that illustrates an image of a droplet which is obtained by the imaging unit in the state illustrated in FIG. 4.

FIG. 4 is a diagram for explaining an initial state of an imaging unit 470 of the comparative example. Note that the initial state may be a state prior to the generation of the EUV light 251 being performed. The initial state may be a state prior to the light, the fine particles, etc. which are emitted from the plasma entering the wall 2a of the chamber 2 and the image measuring unit 45. FIG. 5 is a diagram that illustrates an image of the droplet 271 which is obtained by the imaging unit 470 in the state illustrated in FIG. 4.

Figure 6:
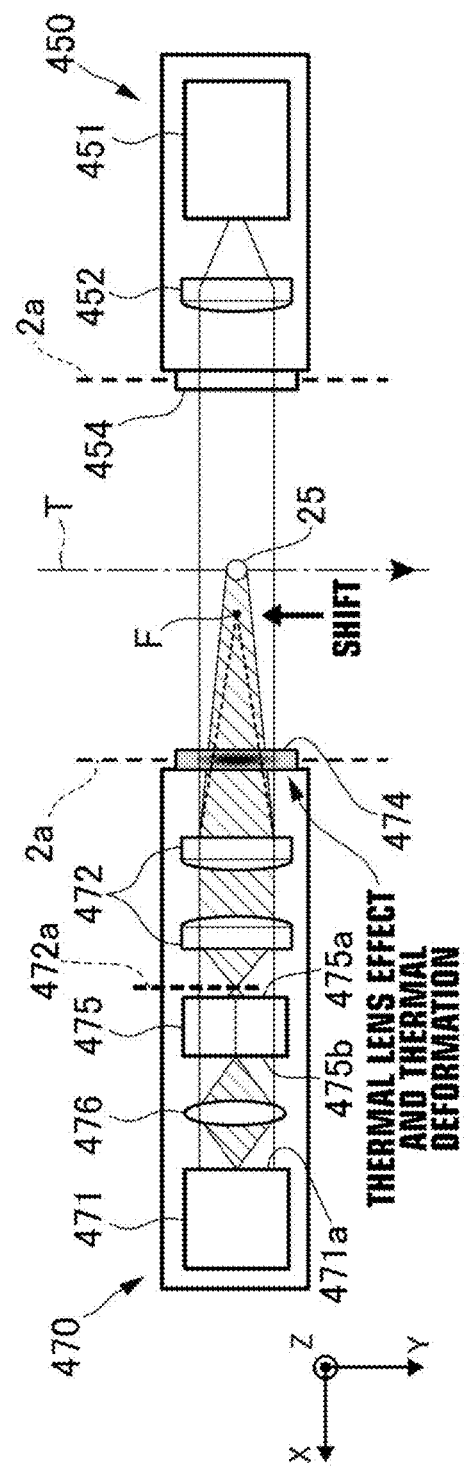
FIG. 6 is a diagram for explaining a state in which the focal point of the imaging unit of the comparative example is shifted due to a thermal lens effect and thermal deformation being generated in a window.
Figure 7:
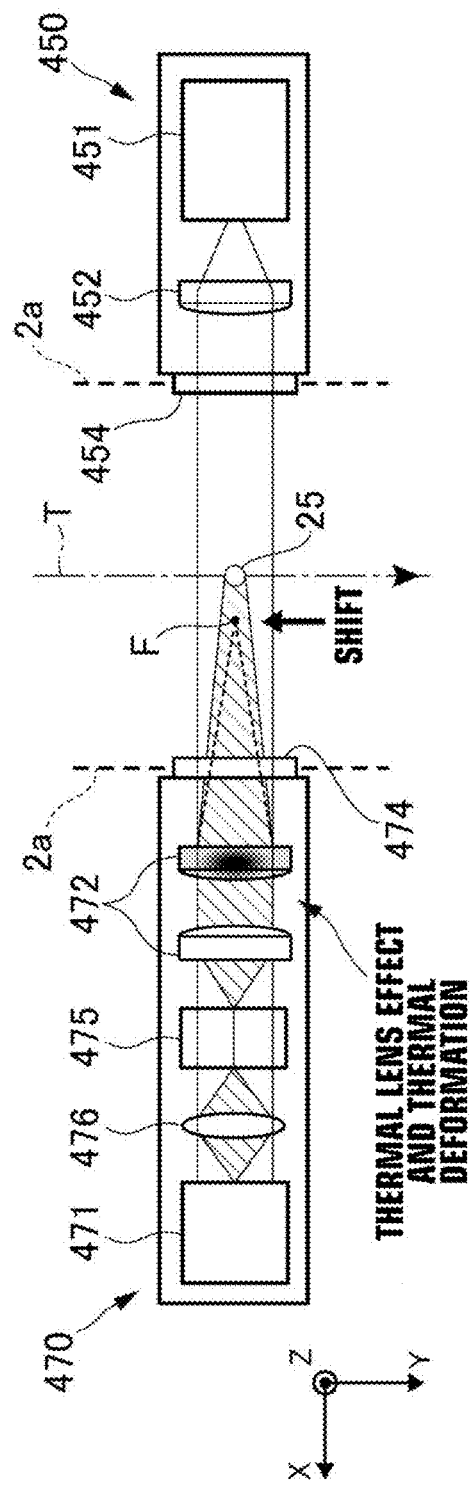
FIG. 7 is a diagram for explaining a state in which the focal point of the imaging unit of the comparative example is shifted due to a thermal lens effect and thermal deformation being generated in an image forming optical system.
Figure 8:
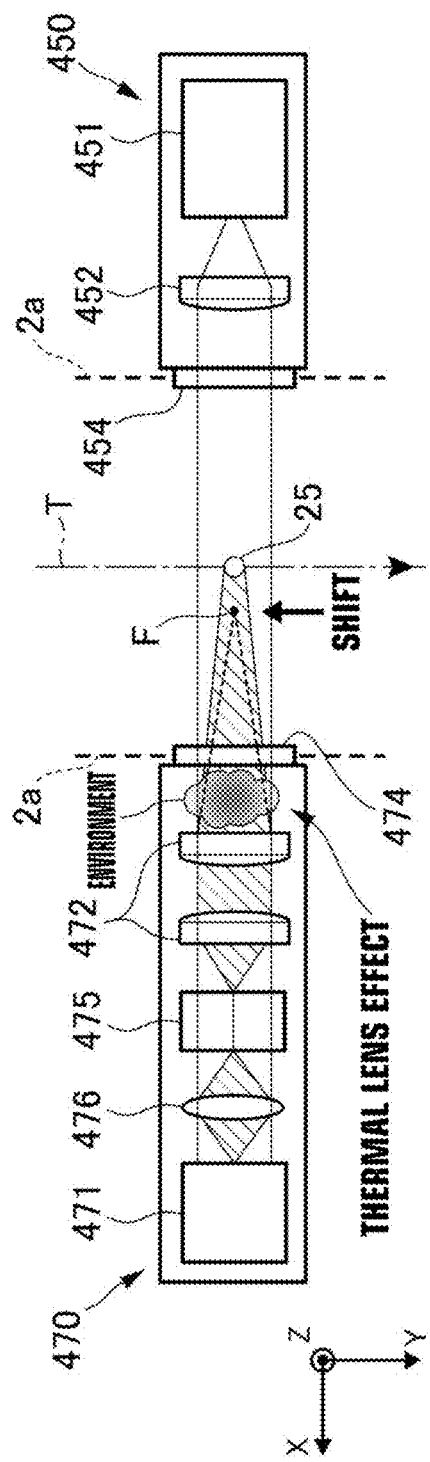
FIG. 8 is a diagram for explaining a state in which the focal point of the imaging unit of the comparative example is shifted due to a thermal lens effect being generated in the environment of the image forming optical system.
Figure 9:
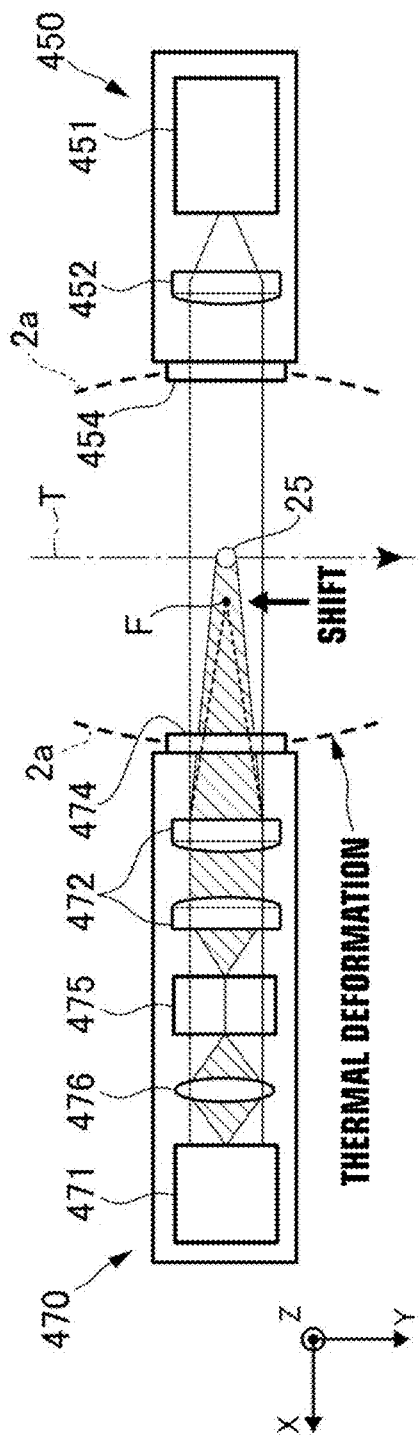
FIG. 9 is a diagram for explaining a state in which the focal point of the imaging unit of the comparative example is shifted due to thermal deformation of a wall of a chamber.
Figure 10:
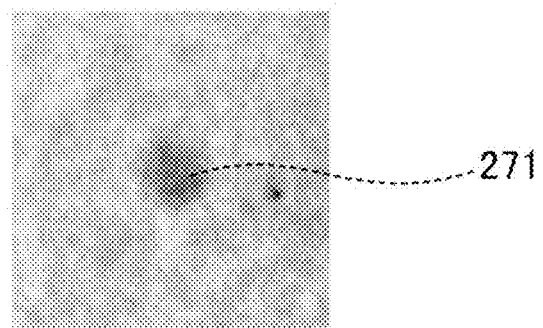
FIG. 10 is a diagram that illustrates an image of a droplet which is obtained by the imaging unit of the comparative example in the state illustrated in at least one of FIG. 6 through FIG. 9.

In addition, FIG. 6 is a diagram for explaining a state in which the focal point F of the imaging unit 470 of the comparative example is shifted due to a thermal lens effect and thermal deformation of the window 474. FIG. 7 is a diagram for explaining a state in which the focal point F of the imaging unit 470 of the comparative example is shifted due to a thermal lens effect and thermal deformation of the image forming optical system 472. FIG. 8 is a diagram for explaining a state in which the focal point F of the imaging unit 470 of the comparative example is shifted due to a thermal lens effect being generated in the environment of the image forming optical system 472. FIG. 9 is a diagram for explaining a state in which the focal point F of the imaging unit 470 of the comparative example is shifted due to thermal deformation of the wall 2a of the chamber 2. FIG. 10 is a diagram that illustrates an image of the droplet 271 which is obtained by the imaging unit 470 of the comparative example in the state illustrated in at least one of FIG. 6 through FIG. 9.

As illustrated in FIG. 4, the focal point F of the imaging unit 470 may be adjusted in advance so as to match the position of the droplet 271 supplied to the plasma generating region 25 in the initial state. In FIG. 4, reference numeral 472a denotes an image formation plane of the image forming optical system 472 that constitutes the imaging unit 470. In addition, reference numeral 475a denotes a light receiving surface of the optical shutter 475, reference numeral 475b denotes a reproduction surface of the optical shutter 475, and reference numeral 471a denotes an imaging surface of the image sensor 471. In the initial state, the image formation plane 472a of the image forming optical system 472 matches the light receiving surface 475a of the optical shutter 475. Therefore, an image of the droplet 271 in focus may be detected by the optical shutter 475, and the same image may be reproduced and output on the reproduction surface 475b of the optical shutter 475. The output image may be formed on the imaging surface 471a of the image sensor 471 by the transfer optical system 476. The image of the droplet 271 in focus may ultimately be captured by the image sensor 471 in this manner.

In this case, the image of the droplet 271 which is obtained by the imaging unit 470 may have high contrast, as illustrated in FIG. 5.

Note that high contrast may refer to a level of contrast which is sufficiently high to a degree that enables the outline of the droplet 271 to be specified and the state of the droplet 271 to be appropriately measured.

Low contrast may refer to a level of contrast which is low to a degree that does not enable the outline of the droplet 271 to be specified and the state of the droplet 271 to be appropriately measured.

When generation of the EUV light 251 is performed, the light, the fine particles, etc. which are emitted from the plasma may enter the wall 2a of the chamber 2 and the image measuring unit 45, and heat these components.

It may be considered that the focal point F of the imaging unit 470 shifts due to the phenomena listed under (1) through (4) below occurring either singly or in combination.

(1) It may be considered that a thermal lens effect and thermal deformation occur at the window 474, as illustrated in FIG. 6. That is, a temperature distribution is generated in the window 474 due to being heated, and therefore it may be considered that a refractive index distribution will be generated. In addition, it may be considered that the window 474 undergoes thermal deformation due to being heated, and therefore it may be considered that the length of a path that the illuminating light passes through will change.

Thereby, the optical path length of the illuminating light that travels between the plasma generating region 25 and the imaging unit 470 may change. The focal length of the imaging unit 470 may be effectively shortened due to being heated. The focal point F of the imaging unit 470 may shift from the plasma generating region 25 toward the imaging unit 470 due to being heated.

Note that the optical path length may be the product of the length and the refractive index of a medium through which light passes. FIG. 6 illustrates a state in which the image formation plane 472a of the image forming optical system 472 for the droplet 271 does not match the light receiving surface 475a of the optical shutter 475. In this case, the image of the droplet 271 which is captured by the mage sensor 471 may be that which is not in focus.

(2) FIG. 7 illustrates an example of a case in which a thermal lens effect and thermal deformation occur in a lens of the image forming optical system 472 positioned at the side of the plasma generating region 25. That is, a temperature distribution is generated in the lens of the image forming optical system 472 positioned at the side of the plasma generating region 25 due to being heated, and therefore it may be considered that a refractive index distribution will be generated. In addition, it may be considered that the lens undergoes thermal deformation due to being heated, and therefore it may be considered that the length of a path through which the illuminating light passes will change.

Thereby, the optical path length of the illuminating light that travels through the imaging unit 470 may change. The focal length of the lens of the image forming optical system 472 positioned at the side of the plasma generating region 25 may be effectively shortened due to being heated. The focal point F of the imaging unit 470 may shift from the plasma generating region 25 toward the imaging unit 470 due to being heated.

(3) It may be considered that a thermal lens effect is generated in the environment in the periphery of the image forming optical system 472, as illustrated in FIG. 8. That is, a temperature distribution is generated in the gas in the periphery of the image forming optical system 472 due to being heated, and therefore it may be considered that a refractive index distribution will be generated.

Thereby, the optical path length of the illuminating light that travels through the imaging unit 470 may change. The focal length of the imaging unit 470 may be effectively shortened due to being heated. The focal point F of the imaging unit 470 may shift from the plasma generating region 25 toward the imaging unit 470 due to being heated.

(4) It may be considered that thermal deformation of the wall 2a of the chamber 2 will occur, as illustrated in FIG. 9. That is, the wall 2a of the chamber 2 undergoes thermal deformation due to being heated, and therefore it may be considered that the position of the imaging unit 470 which is provided on the wall 2a will change. In other words, the wall 2a undergoes thermal deformation, and therefore it may be considered that the physical distance between the imaging unit 470 which is provided on the wall 2a via the window 474 and the plasma generating region 25 will change.

Thereby, the optical path length of the illuminating light that travels between the plasma generating region 25 and the imaging unit 470 may change. The focal length of the imaging unit 470 may be effectively shortened due to being heated. The focal point F of the imaging unit 470 may shift from the plasma generating region 25 toward the imaging unit 470 due to being heated.

In the case that the focal point F of the imaging unit 470 shifts, the image of the droplet 271 which is obtained by the imaging unit 470 may be an image having low contrast and is out of focus, as illustrated in FIG. 10.

In this case, the image measuring unit 45 may not be capable of appropriately measuring the state of the droplet 271 supplied to the plasma generating region 25.

Based on the above, a technique is desired that enables the state of the droplet 271 supplied to the plasma generating region 25 to be appropriately measured even if the focal point F of the imaging unit 470 shifts when the EUV light 251 is generated.

4. First Embodiment

An EUV light generating apparatus 1 according to a first embodiment will be described with reference to FIG. 11 through FIG. 31.

The EUV light generating apparatus 1 of the first embodiment may be the EUV light generating apparatus 1 of the comparative example, to which a moving mechanism 48 and a stage driving unit 512 are added.

With respect to the configuration and operation of the EUV light generating apparatus 1 of the first embodiment, descriptions of structures and operations which are the same as those of the EUV light generating apparatus 1 of the comparative example will be omitted.

[4.1 Configuration]

Figure 11:
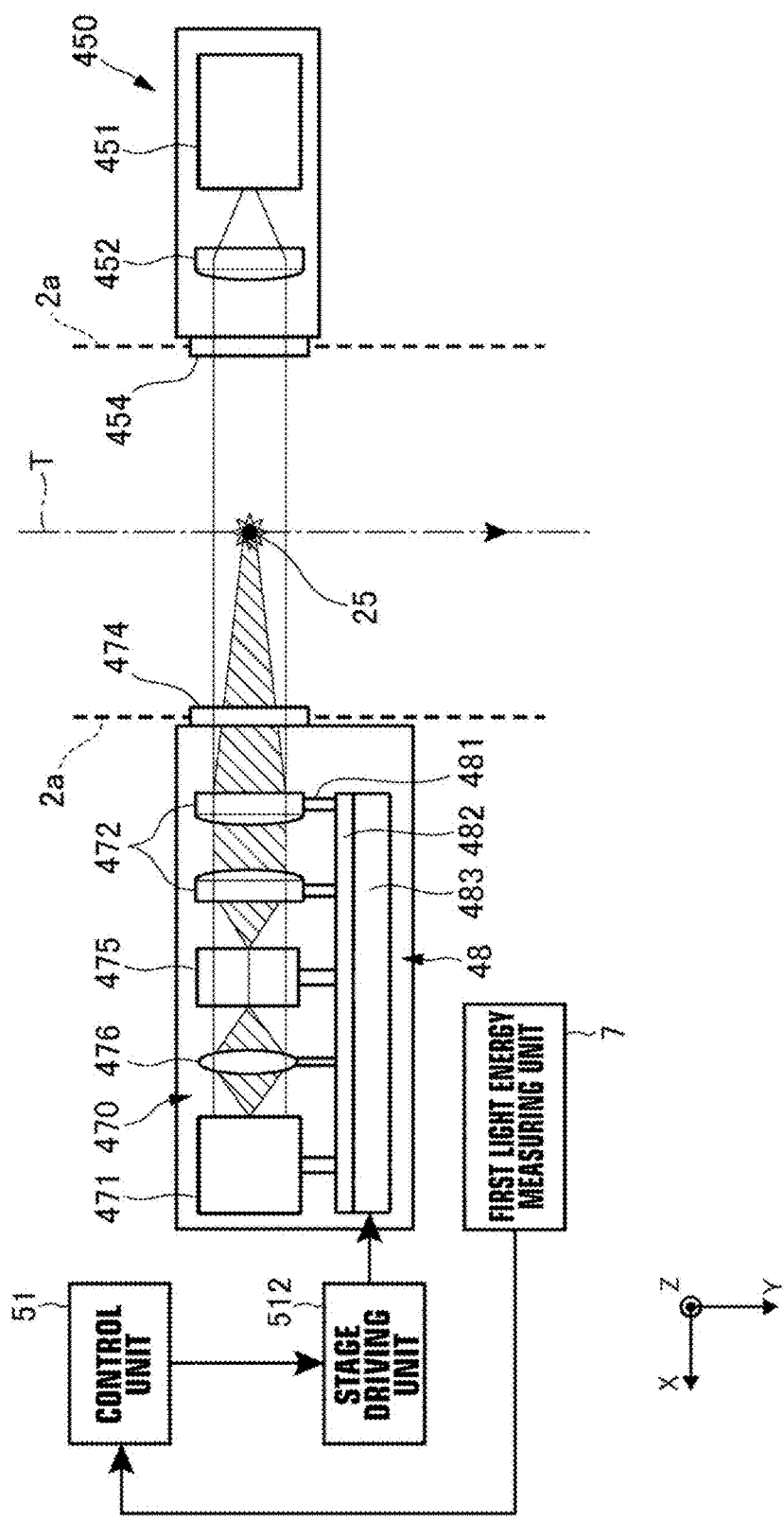
FIG. 11 is a diagram for explaining the configuration of an EUV light generating apparatus according to a first embodiment.

FIG. 11 is a diagram for explaining the configuration of an EUV light generating apparatus 1 according to the first embodiment. The imaging unit 470 may be mounted on the moving mechanism 48 of the first embodiment.

The moving mechanism 48 may be a mechanism that moves the position of the imaging unit 470.

The moving mechanism 48 may move the imaging unit 470 along the axis of the optical path of the illuminating light which is output to the plasma generating region 25.

The moving mechanism 48 may be provided in the interior of an optical path pipe, which is not illustrated, that houses the constituent elements of the imaging unit 470.

The moving mechanism 48 may include a holder 481, a plate 482, and a stage 483.

The holder 481 may hold the imaging unit 470. Specifically, the holder 481 may hold the image sensor 471, the image forming optical system 472, the optical filter 473, the optical shutter 475, and the transfer optical system 476 included in the imaging unit 470, without changing the relative positions among these elements.

The holder 481 may be fixed on the plate 482.

The imaging unit 470 may be mounted on the plate 482 via the holder 481. The plate 482 may be connected to the stage 483. The plate 482 may be configured to be movable by the stage 483.

The stage 483 may include an actuator that moves the position of the plate 482. The stage 483 may move the position of the plate 482 in a direction along the axis of the optical path of the illuminating light which is output to the plasma generating region 25. The stage 483 may move the position of the plate 482 in the direction of the optical axis of the image forming optical system 472.

The stage 483 may move the position of the imaging unit 470, which is mounted on the plate 482, by moving the position of the plate 482.

The stage driving unit 512 may be connected to the stage 483 and the control unit 51.

The stage driving unit 512 may move the stage 483 based on control commands received from the control unit 51.

The control unit 51 of the first embodiment may correct the position of the focal point F, which is shifted by the EUV light 251 being generated, by controlling the stage 483 via the stage driving unit 512.

The other structures of the EUV light generating apparatus 1 of the first embodiment may be the same as those of the EUV light generating apparatus 1 of the comparative example.

[4.2 Operation]

An outline of the operations of the EUV light generating apparatus 1 of the first embodiment will be described with reference to FIG. 12 through FIG. 14.

Figure 12:
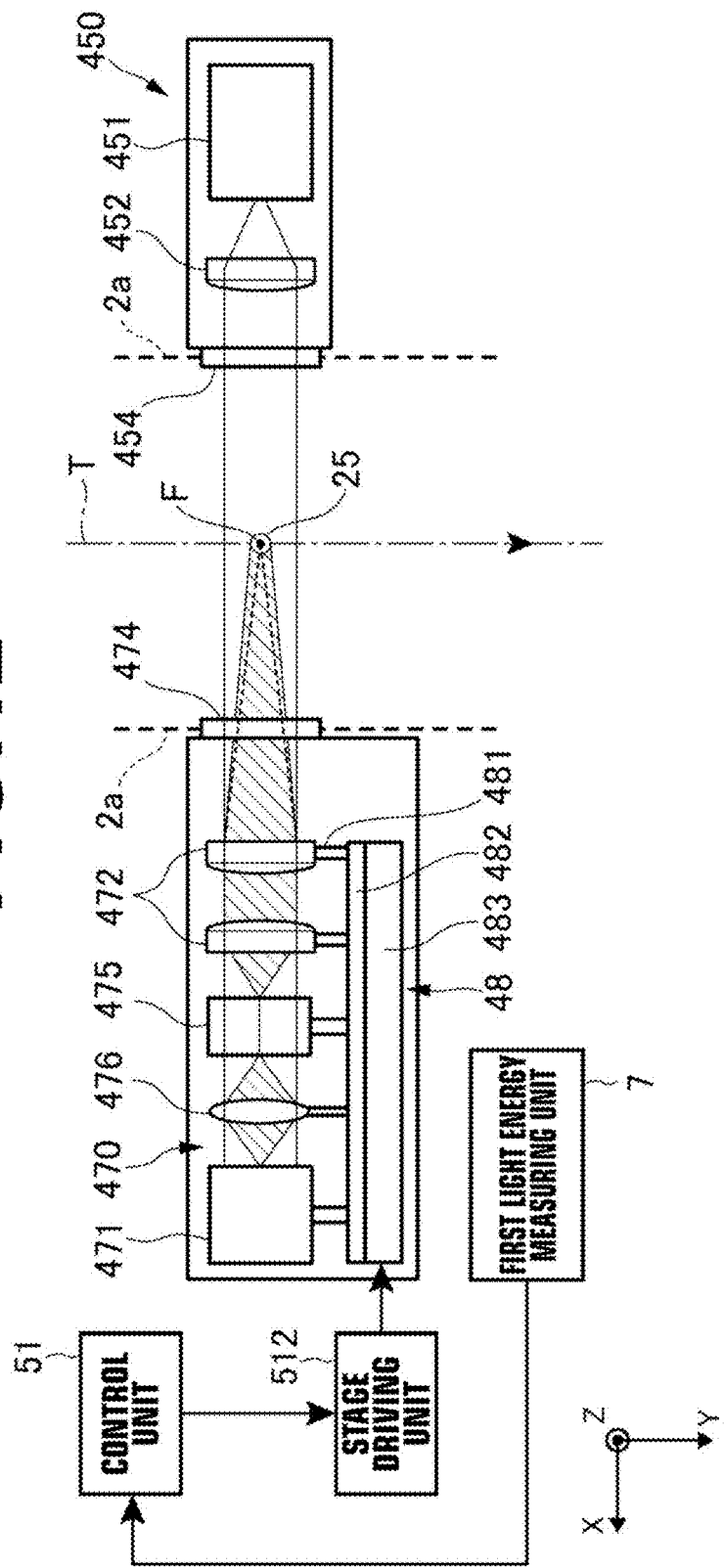
FIG. 12 is a diagram for explaining an initial state of an imaging unit of the first embodiment.

FIG. 12 is a diagram for explaining an initial state of the imaging unit 470 of the first embodiment. FIG. 13 is a diagram for explaining a state in which the focal point F of the imaging unit 470 is shifted when EUV light 251 is generated. FIG. 14 is a diagram for explaining a state in which the position of the shifted focal point F of the imaging unit is corrected.

As illustrated in FIG. 12, the focal point F of the imaging unit 470 of the first embodiment may be adjusted in advance so as to match the position of the droplet 271 supplied to the plasma generating region 25 in the initial state, in the same manner as the imaging unit 470 of the comparative example. The imaging unit 470 which is adjusted in this manner as an example may obtain an image of the droplet 271 which is in focus.

When the EUV light 251 is generated, the wall 2a of the chamber 2 and the image measuring unit 45 may be heated by light, fine articles, etc. which are emitted from the plasma.

Figure 13:
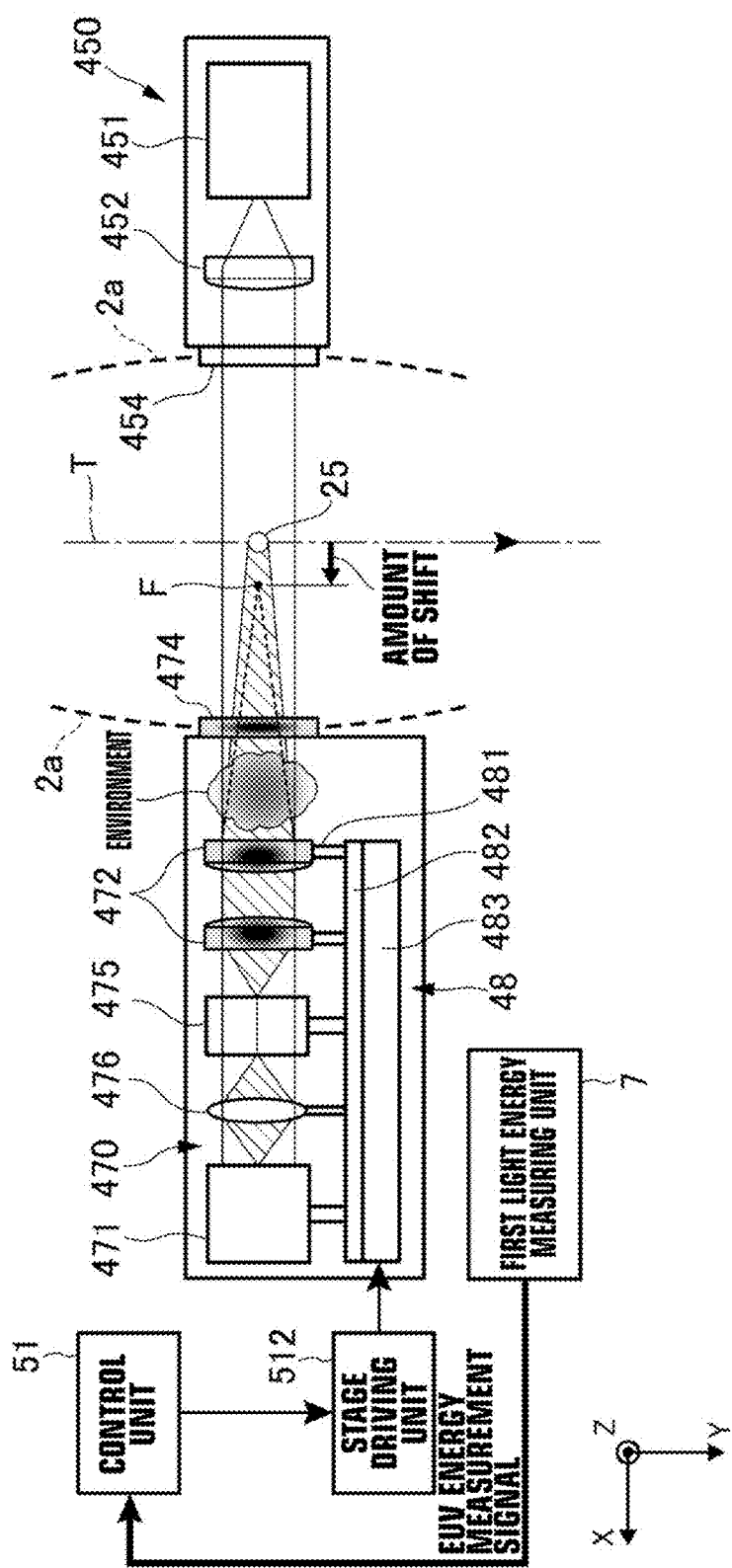
FIG. 13 is a diagram for explaining a state in which the focal point of the imaging unit is shifted when EUV light is generated.

As a result, the focal point F of the imaging unit 470 may shift from the plasma generating region 25 toward the side of the imaging unit 470 due to the phenomena listed above as (1) through (4) occurring either singly or in combination, as illustrated in FIG. 13.

As illustrated in FIG. 13, the first light energy measuring unit 7 of the first embodiment may measure the energy of the EUV light 251 which is emitted from the plasma, and send the EUV energy measurement signal that includes the measured value to the control unit 51.

Figure 14:
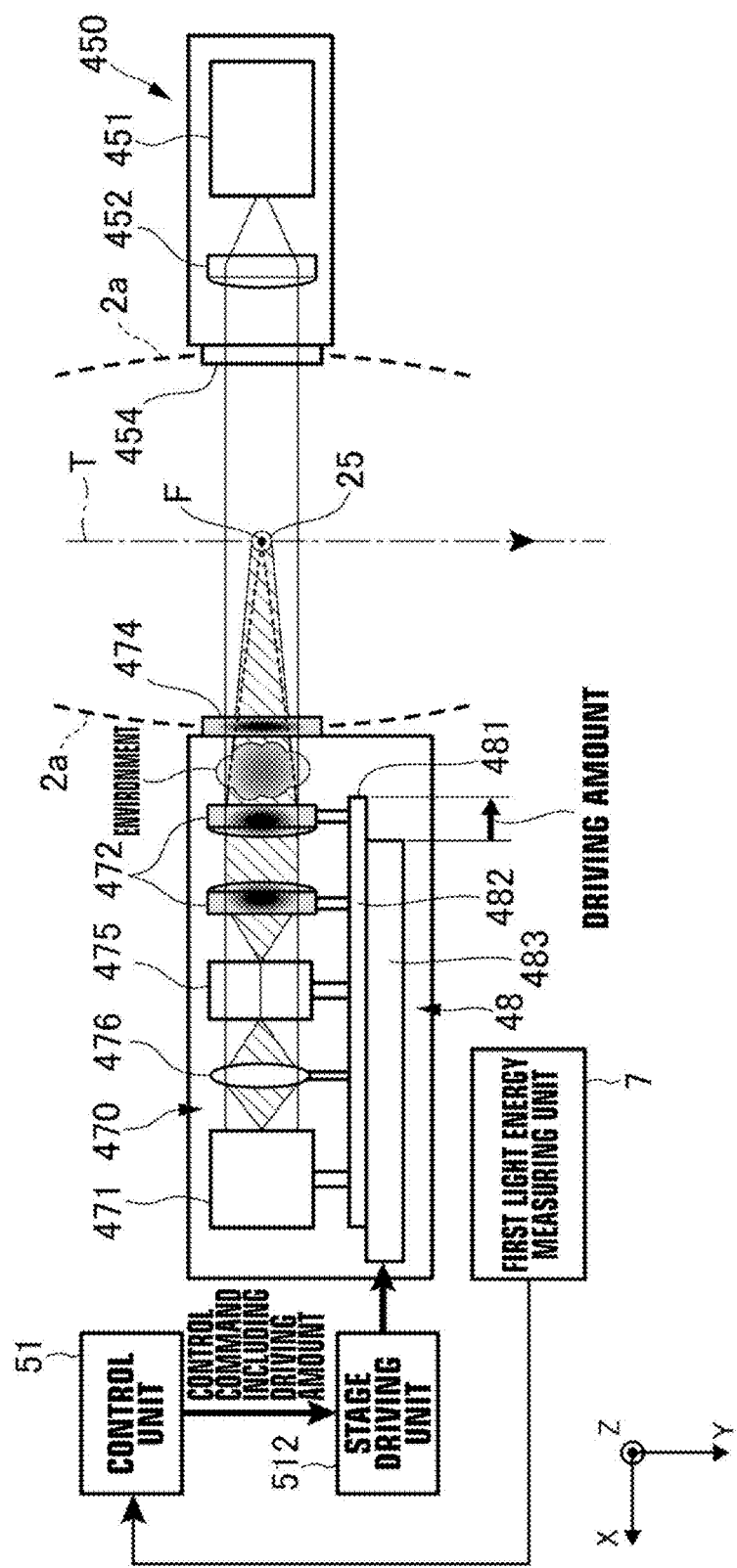
FIG. 14 is a diagram for explaining a state in which the position of the shifted focal point of the imaging unit is corrected.

As illustrated in FIG. 14, the control unit 51 of the first embodiment may receive the EUV energy measurement signal from the first light energy measuring unit 7.

The control unit 51 may control the stage 483 such that the focal point F of the imaging unit 470 matches the position of the droplet 271 supplied to the plasma generating region 25, based on the measured value.

Specifically, the control unit 51 may calculate the amount of shift of the focal point F based on the measured value of the energy of the EUV light 251. Then, the control unit 51 may determine a driving amount of the stage 483 according to the amount of shift of the focal point F.

The control unit 51 may generate a signal that includes a control command for driving the stage 483 according to the determined driving amount, and send the signal to the stage driving unit 512.

The stage driving unit 512 may drive the stage 483 based on the control command from the control unit 51.

The shifted focal point F may move toward the side of the plasma generating region 25 corresponding to the driving amount of the stage 483, and be caused to match the position of the droplet 271 supplied to the plasma generating region 25.

The control unit 51 may correct the position of the shifted focal point F by controlling the stage 483 via the stage driving unit 512 in this manner.

Processes related to correction of the position of the focal point F which are performed by the control unit 51 of the first embodiment will be described with reference to FIG. 15 through FIG. 31.

Figure 15:
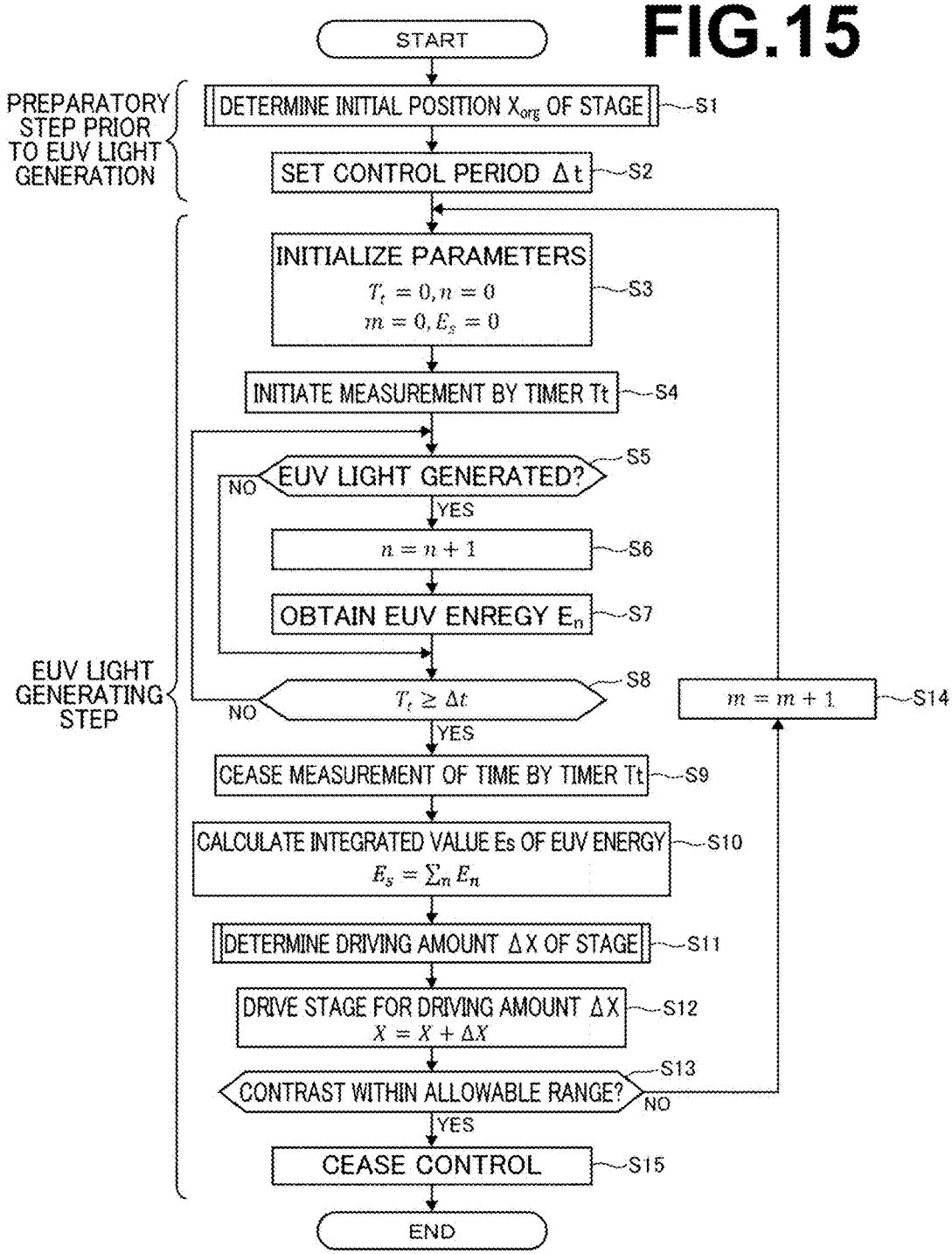
FIG. 15 is a diagram that illustrates a flow chart of processes related to correction of the focal point.

FIG. 15 is a diagram that illustrates a flow chart of processes related to correction of the position of the focal point F.

Steps S1 and S2 may be processes which are performed in a preparatory step prior to the EUV light 251 being generated. Steps S3 through S15 may be processes which are performed at a step in which the EUV light 251 is being generated.

At step S1, the control unit 51 may determine an initial position $X_{org}$ of the stage 483.

The control unit 51 may determine the initial position $X_{org}$ of the stage 483 such that the focal point F of the imaging unit 470 matches the position of the droplet 271 supplied to the plasma generating region 25.

Note that a process that determines the initial position $X_{org}$ of the stage 483 will be described later with reference to FIG. 16.

At step S2, the control unit 51 may set a control period $\Delta t$.

The control period $\Delta t$ may be a period during which the control unit 51 controls the stage 483, and may be stored in the control unit 51 in advance.

At step S3, the control unit 51 may initialize parameters related to control of the stage 483.

Specifically, the control unit 51 may initialize a timer $T_t$, a pulse number n, a control number m and an integrated value $E_s$ of EUV energy $E_n$ as expressed by Formula 1.

$$T_t=0, n=0$$

$$m=0, E_s=0 \quad \text{[Formula 1]}$$

Note that the timer $T_t$ may measure an amount of time that elapses after the control period $\Delta t$ is initiated.

The pulse number n may be the number of times that the EUV light 251 is generated after the control period $\Delta t$ is initiated.

The control number m may be the number of times that the stage 483 is controlled.

The EUV energy $E_n$ may be the pulse energy of the $n^{th}$ EUV light 251 which is generated after the control period $\Delta t$ is initiated. The EUV energy $E_n$ may be the light energy which is generated within the EUV light generating apparatus 1 when the $n^{th}$ EUV light 251 is generated after the control period $\Delta t$ is initiated.

The integrated value $E_s$ of EUV energy $E_n$ may be a value obtained by integrating the pulse energy of the EUV light 251 which is generated from a point in time at which the control period $\Delta t$ is initiated to a point in time at which the control period $\Delta t$ is completed. The integrated value $E_s$ of EUV energy $E_n$ may be the light energy which is generated within the EUV light generating apparatus 1 during the control period $\Delta t$.

At step S4, the control unit 51 may initiate the measurement of time by the timer $T_t$.

At step S5, the control unit 51 may judge whether the EUV light 251 is being generated.

The control unit 51 may judge that the EUV light 251 is not being generated if the EUV energy measurement signal from the first light energy measuring unit 7 is not received, and the process may proceed to step S8. In contrast, if the EUV energy measurement signal is received, the control unit 51 may judge that the EUV light 251 is being generated, and the process may proceed to step S6.

At step S6, the control unit 51 may incrementally increase the pulse number n as expressed by Formula 2.

$$n=n+1 \qquad \text{[Formula 2]}$$

At step S7, the control unit may obtain the EUV energy $E_n$.

The control unit 51 may obtain the measured value of the energy of the EUV light 251, which is included in the EUV energy measurement signal received at step S5, as the EUV energy $E_n$.

At step S8, the control unit 51 may judge whether the control period $\Delta t$ has elapsed by employing Formula 3.

$$T_t \geq \Delta t \qquad \text{[Formula 3]}$$

The control unit 51 may judge that the control period $\Delta t$ has not elapsed if the value of the timer $T_t$ is not greater than or equal to the control period $\Delta t$, and the process may return to step S5. In contrast, the control unit 51 may judge that the control period $\Delta t$ has elapsed if the value of the timer $T_t$ is greater than or equal to the control period $\Delta t$, and the process may proceed to step S9.

At step S9, the control unit 51 may cease the measurement of time by the timer $T_t$.

At step S10, the control unit 51 may employ Formula 4 to calculate the integrated value $E_s$ of the EUV energy $E_n$.

$$E_s = \sum_n E_n \qquad \text{[Formula 4]}$$

At step S11, the control unit 51 may determine the driving amount $\Delta X$ of the stage 483.

Note that a process that determines the driving amount $\Delta X$ of the stage 483 will be described later with reference to FIG. 27.

At step S12, the control unit 51 may drive the stage 483 for the driving amount $\Delta X$. Thereby, the control unit 51 may correct a position X of the stage 483 as expressed by Formula 5. As a result, the position of the imaging unit 470 will be corrected, and the position of the focal point F may also be corrected.

$$X=X+\Delta Xl \qquad \text{[Formula 5]}$$

At step S13, the control unit 51 may judge whether the contrast of the image of the droplet 271 is within a predetermined allowable range.

The control unit 51 may control the image measuring unit 45 so as to capture an image of the droplet 271 supplied to the plasma generating region 25 at the position X of the stage 483, which was corrected at step S12.

Then, the control unit 51 may judge whether the contrast of the image of the droplet 271 is within a predetermined allowable range. The allowable range may be a range within which the state of the droplet 271 is capable of being measured from the obtained image of the droplet 271.

The control unit 51 may proceed to the process of step S15 if the contrast is within the allowable range. In contrast, if the contrast is not within the allowable range, the control unit 51 may proceed to the process of step S14.

At step S14, the control unit 51 may incrementally increase the control number m as expressed by Formula 6. Then, the control unit 51 may return to the process of step S3.

$$m=m+1 \qquad \text{[Formula 6]}$$

At step S15, the control unit 51 may cease control of the stage 483, and end the present process.

Figure 16:
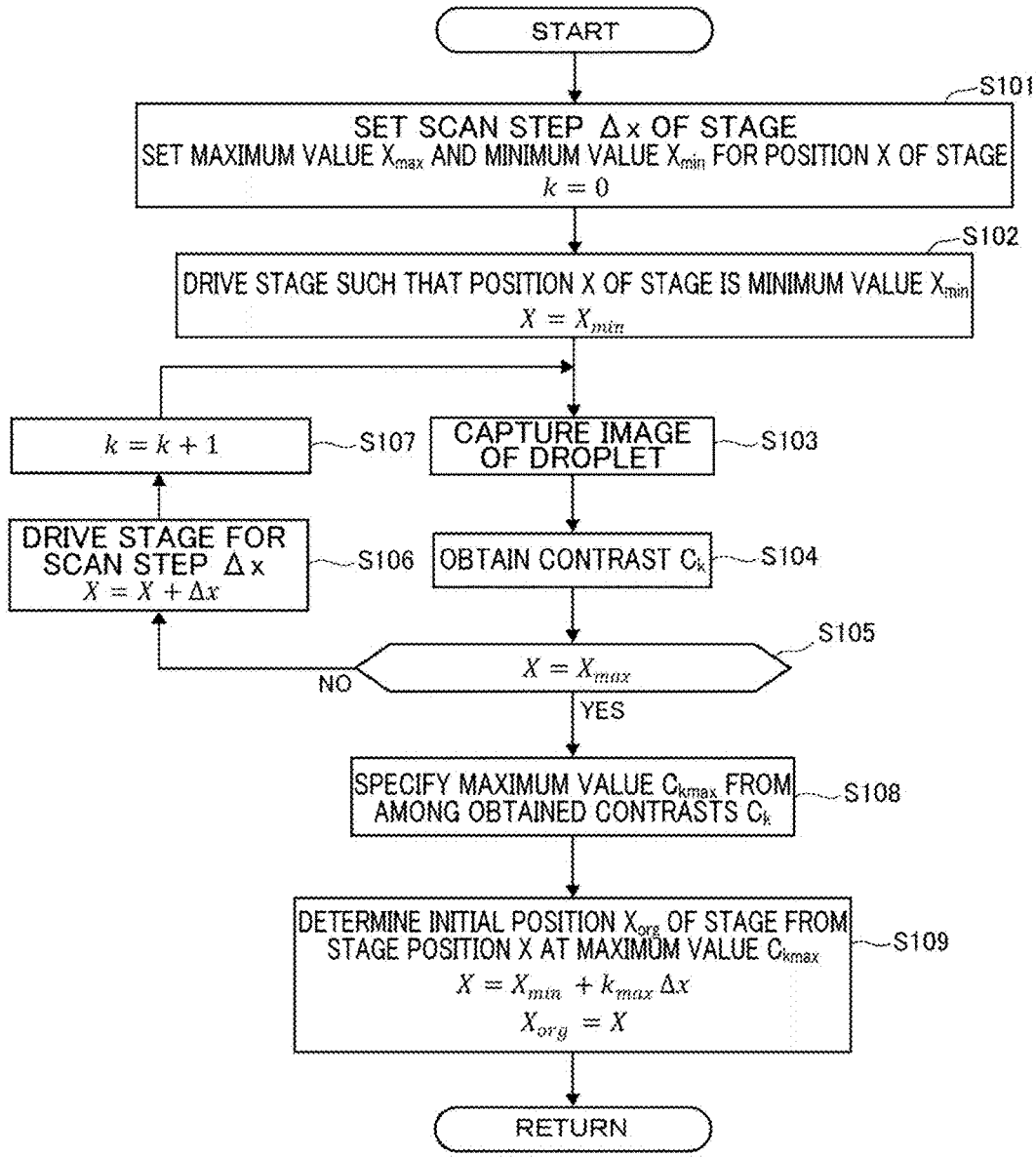
FIG. 16 is a diagram that illustrates a flow chart of a process that determines an initial position of a stage, denoted as step S1 in FIG. 15.

FIG. 16 is a diagram that illustrates a flow chart of the process that determines the initial position $X_{org}$ of the stage 483, denoted as step S1 in FIG. 15.

At step S101, the control unit 51 may set parameters related to determining the initial position $X_{org}$ of the stage 483.

Specifically, the control unit 51 may set a maximum value $X_{max}$ and a minimum value $X_{min}$ for the position X of the stage 483. The control unit 51 may initialize a scan number k as expressed by Formula 7.

$$k=0 \qquad \text{[Formula 7]}$$

When determining the initial position $X_{org}$ of the stage 483, the control unit 51 may cause the imaging unit 470 to scan the droplet 271.

That is, the control unit 51 may drive the stage 483 in small increments and move the position of the imaging unit 470. In addition, the control unit 51 may cause the imaging unit 470 to capture an image of the droplet 271 at each position to which the imaging unit 470 is moved.

The scan number k may be the number of times that the imaging unit 470 captures an image of the droplet 271 at each position to which the stage 483 is moved by being driven in small increments.

At step S102, the control unit 51 may drive the stage 483 such that the position X of the stage 483 becomes the minimum value $X_{min}$ as expressed by Formula 8.

$$X=X_{min} \qquad \text{[Formula 8]}$$

At step S103, the control unit 51 may cause the imaging unit 470 to capture an image of the droplet 271 supplied to the plasma generating region 25.

At step S104, the control unit 51 may obtain a contrast $C_k$ of the obtained image of the droplet 271.

At step S105, the control unit 51 may employ Formula 9 to judge whether the position X of the stage 483 has reached the maximum value $X_{max}$.

$$X=X_{max} \qquad \text{[Formula 9]}$$

If the position X of the stage 483 has reached the maximum value $X_{max}$, the control unit 51 may cause the process to proceed to step S108. In contrast, if the position X of the stage 483 has not reached the maximum value $X_{max}$, the control unit 51 may cause the process to proceed to step S106.

At step S106, the control unit X may drive the stage 483 for a scan step $\Delta x$. Thereby, the control unit 51 may correct the position X of the stage 483 as expressed by Formula 10. As a result, the position of the imaging unit 470 will be corrected, and the position of the focal point F will also be corrected.

$$X=X+\Delta x \qquad \text{[Formula 10]}$$

The scan step Δx may be a driving amount that the stage 483 is driven for, at each scanning operation.

At step S107, the control unit 51 may incrementally increase the scan number k as expressed by Formula 11. Then, the control unit 51 may cause the process to proceed to step S103.

$$k=k+1 \qquad \text{[Formula 11]}$$

At step S108, the control unit 51 may specify a maximum value $C_{kmax}$ from among the obtained contrasts $C_k$.

A process that specifies the maximum value $C_{kmax}$ of the contrasts $C_k$ will be described later with reference to FIG. 17 through FIG. 26.

At step S109, the control unit 51 may determine the initial position $X_{org}$ of the stage 483, from the position X of the stage 483 at which the contrast $C_k$ became the maximum value $C_{kmax}$.

The stage position X at the maximum value $C_{kmax}$ may be expressed as Formula 12.

$$X=X_{min}+k_{max}\Delta x \qquad \text{[Formula 12]}$$

Note that $k_{max}$ may be the scan number k in the case that the contrast $C_k$ becomes the maximum value $C_{kmax}$.

Then, the control unit 51 may determine the position X of the stage 483 at which the contrast $C_k$ is the maximum value $C_{kmax}$ as the initial position $X_{org}$ of the stage 483, as expressed by Formula 13.

$$X_{org}=X \qquad \text{[Formula 13]}$$

That is, the control unit 51 may judge that the focal point F matches the position of the droplet 271 supplied to the plasma generating region 25 in the case that the contrast $C_k$ becomes the maximum value $C_{kmax}$. Then, the control unit 51 may determine the position X of the stage 483 at which the focal point F matches the position of the droplet 271 supplied to the plasma generating region 25 as the initial position $X_{org}$ of the stage 483.

Thereafter, the control unit 51 may end the present process, and cause the process to proceed to step S1 of FIG. 15.

FIG. 17 through FIG. 21 respectively illustrate images obtained by the imaging unit 470 in cases that the scan number k is $k_0$, $k_p$, $k_{max}$, $k_q$, and $k_r$.

FIG. 22 through FIG. 26 respectively illustrate diagrams for explaining the light intensity of the illuminating light which is detected along a z axis in the images of FIG. 17 through FIG. 21.

The z axis may be a coordinate axis which is substantially parallel to the Z axis, and through which the center of the droplet 271 supplied to the plasma generating region 25 may pass.

The scan numbers k are assumed to sequentially increase in order from $k_0$, $k_p$, $k_{max}$, $k_q$, and $k_r$.

Cases in which the scan number k is $k_0$ and $k_r$ are assumed to be cases in which the focal point F completely does not match the position of the droplet 271 supplied to the plasma generating region 25.

Cases in which the scan number k is $k_p$ and $k_q$ are assumed to be cases in which the focal point F matches the position of the droplet 271 supplied to the plasma generating region 25 to a greater degree than the cases in which the scan number k is $k_0$ and $k_r$.

Cases in which the scan number k is $k_0$ and $k_r$ are assumed to be cases in which the focal point F completely does not match the position of the droplet 271 supplied to the plasma generating region 25.

Figure 17:
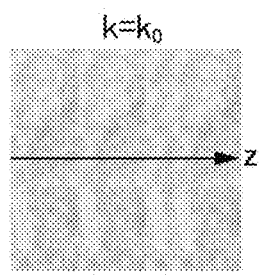
FIG. 17 is a diagram that illustrates an image which is obtained by the imaging unit when a scan number k is $k_0$.
Figure 21:
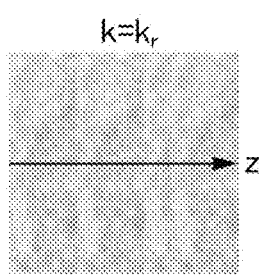
FIG. 21 is a diagram that illustrates an image which is obtained by the imaging unit when the scan number k is $k_r$.

In such cases, it may be difficult for an image of the droplet 271 to be recognized from the image which is obtained by the imaging unit 470, as illustrated in FIG. 17 and FIG. 21.

Figure 22:
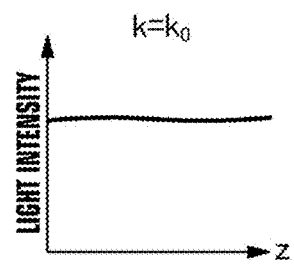
FIG. 22 is a diagram for explaining the light intensity of illuminating light, which is detected along a z axis in the image illustrated in FIG. 17.
Figure 26:
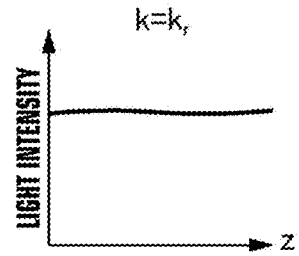
FIG. 26 is a diagram for explaining the light intensity of illuminating light, which is detected along the z axis in the image illustrated in FIG. 21.

In addition, the light intensity of the illuminating light which is detected along the z axis may be substantially constant with hardly any change, even if the z axis coordinate changes, as illustrated in FIG. 22 and FIG. 26.

It may be difficult for the control unit 51 to obtain the contrast $C_k$. The control unit 51 may assign zero as the value of $C_k$.

Cases in which the scan number k is $k_p$ and $k_q$ are assumed to be cases in which the focal point F matches the position of the droplet 271 supplied to the plasma generating region 25 to a greater degree than the cases in which the scan number k is $k_0$ and $k_r$.

Figure 18:
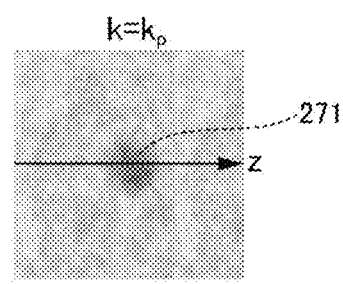
FIG. 18 is a diagram that illustrates an image which is obtained by the imaging unit when the scan number k is $k_p$.
Figure 20:
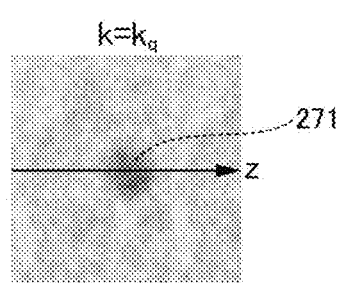
FIG. 20 is a diagram that illustrates an image which is obtained by the imaging unit when the scan number k is $k_q$.

In such cases, it is possible for an image of the droplet 271 to be recognized from the image which is obtained by the imaging unit 470, as illustrated in FIG. 18 and FIG. 20.

Figure 23:
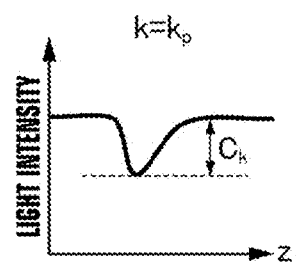
FIG. 23 is a diagram for explaining the light intensity of illuminating light, which is detected along the z axis in the image illustrated in FIG. 18.
Figure 25:
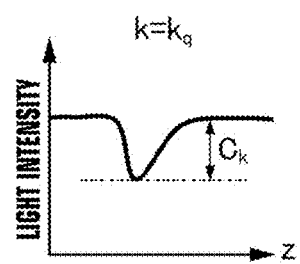
FIG. 25 is a diagram for explaining the light intensity of illuminating light, which is detected along the z axis in the image illustrated in FIG. 20.

In addition, the light intensity of the illuminating light which is detected along the z axis at a position where the image of the droplet 271 is present may be lower than the light intensity at a position where the image of the droplet 271 is not present, as illustrated in FIG. 23 and FIG. 25. The light intensity of the illuminating light which is detected along the z axis may be at a local minimum in the vicinity of the center position of the image of the droplet 271.

The control unit 51 may assign the difference between the light intensity at the local minimum and the light intensity at the position where the droplet 271 is not present, of the light intensity which is detected along the z axis, as the contrast $C_k$.

In the case that the scan number k is $k_{max}$, the focal point F may match the position of the droplet 271 supplied to the plasma generating region 25.

Figure 19:
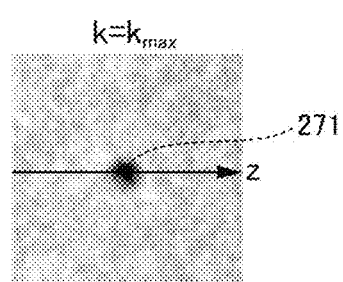
FIG. 19 is a diagram that illustrates an image which is obtained by the imaging unit when the scan number k is $k_{max}$.

In this case, it is comparatively easy for an image of the droplet 271 to be recognized from the image which is obtained by the imaging unit 470, as illustrated in FIG. 19.

Figure 24:
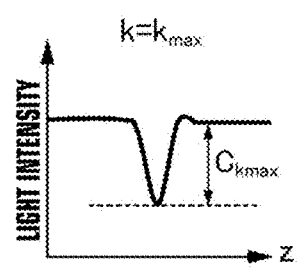
FIG. 24 is a diagram for explaining the light intensity of illuminating light, which is detected along the z axis in the image illustrated in FIG. 19.

In addition, the light intensity of the illuminating light which is detected along the z axis may be at a local minimum in the vicinity of the center position of the image of the droplet 271, as illustrated in FIG. 24. The light intensity at the local minimum may be minimal compared to the cases illustrated in FIG. 22, FIG. 23, FIG. 25, and FIG. 26.

The control unit 51 may assign the difference between the light intensity at the local minimum and the light intensity at the position where the droplet 271 is not present, of the light intensity which is detected along the z axis, as the contrast $C_k$. The contrast $C_k$ in the case illustrated in FIG. 24 may be maximal compared to the cases illustrated in FIG. 22, FIG. 23, FIG. 25, and FIG. 26.

The control unit 51 may specify the contrast $C_k$ for the case illustrated in FIG. 24 which is maximal from among the obtained contrast values $C_k$, as the maximum value $C_{kmax}$ in this manner.

Then, the control unit 51 may determine the initial position $X_{org}$ of the stage 483 from the position X of the stage 483 for the case in which the contrast $C_k$ became the maximum value $C_{kmax}$.

Figure 27:
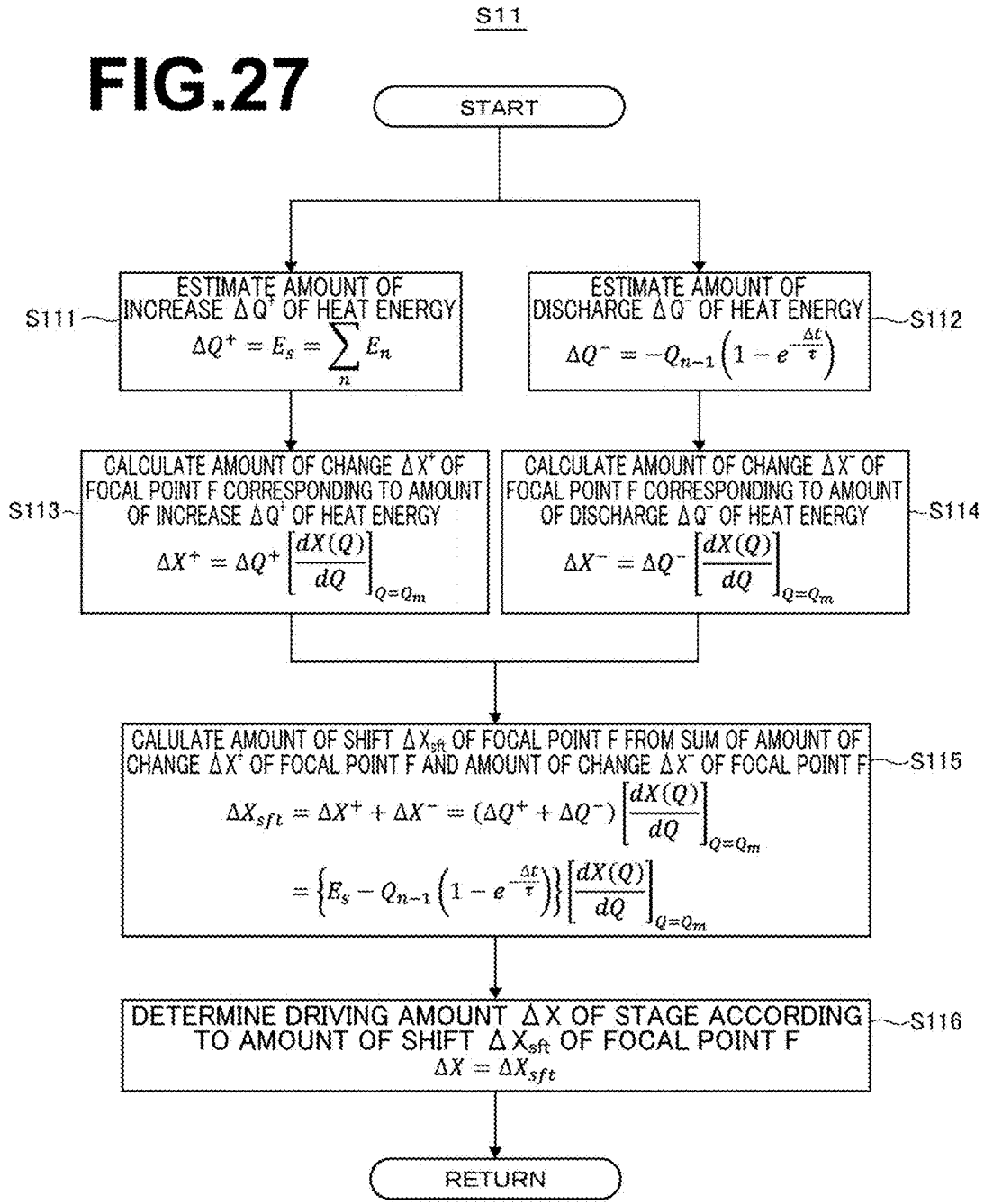
FIG. 27 is a diagram that illustrates a flow chart of a process that determines a drive amount $\Delta X$ of a stage, denoted as step S11 in FIG. 15.
Figure 28:
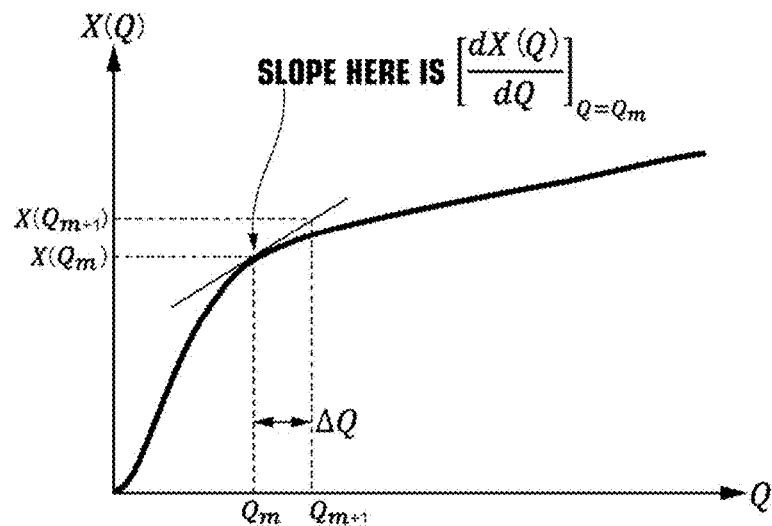
FIG. 28 is a diagram for explaining a relationship between an accumulated amount Q of heat energy, which is accumulated within the EUV light generating apparatus, and a position X (Q) of the focal point of the imaging unit.

FIG. 27 is a flow chart that illustrates the process that determines the driving amount ΔX of the stage 483, denoted as step S11 in FIG. 15. FIG. 28 is a diagram for explaining a relationship between an accumulated amount Q of heat energy, which is accumulated within the EUV light generating apparatus 1, and a position X(Q) of the focal point F.

The control unit 51 may determine the driving amount ΔX of the stage 483 according to an amount of shift $\Delta X_{sft}$ of the focal point F which shifts when the EUV light 251 is generated.

The focal point F may be considered to shift according to the accumulated amount Q of heat energy which is accumulated within the EUV light generating apparatus 1 due to the EUV light 251 being generated. That is, the position of the focal point F may be considered to be expressed as a function of the accumulated amount Q of heat energy, as illustrated in FIG. 28. The position of the focal point F in the case that the accumulated amount of heat energy is Q is designated as X(Q).

In addition, the accumulated amount Q of heat energy may be calculated from a balance of an amount of increase $\Delta Q^+$ of heat energy that increases within the EUV light generating apparatus 1 due to the EUV light 251 being generated and an amount of discharge $\Delta Q^-$ of heat energy which is discharged to the exterior of the EUV light generating apparatus 1.

Accordingly, the amount of shift $\Delta X_{sft}$ of the focal point F may be considered to change according to the balance of the amount of increase $\Delta Q^+$ of heat energy and the amount of discharge $\Delta Q^-$ of heat energy.

That is, the amount of shift $\Delta X_{sft}$ of the focal point F may be considered to be capable of being calculated from a balance of an amount of change $\Delta X^+$ of the focal point F corresponding to the amount of increase ΔQ+ of heat energy and an amount of change $\Delta X^-$ of the focal point F corresponding to the amount of discharge $\Delta Q^-$ of heat energy.

Therefore, the control unit 51 may perform the processes of steps S111 through S115 below in order to calculate the amount of shift $\Delta_{sft}$ of the focal point F.

Note that the accumulated amount Q of heat energy is a virtual amount, and may correspond to the accumulated amount of light energy, which is accumulated within the EUV light generating apparatus 1 due to the EUV light 251 being generated.

At step S111, the control unit 51 may estimate the amount of increase $\Delta Q^+$ of heat energy that increases within the EUV light generating apparatus 1 during the control period Δt by employing Formula 14.

$$\Delta Q^+ = E_s = \sum_n E_n \qquad \text{[Formula 14]}$$

As described previously, the integrated value $E_s$ of EUV energy $E_n$ may be light energy which is generated within the EUV light generating apparatus 1 during the control period Δt.

The light energy which is generated within the EUV light generating apparatus 1 may be converted to heat energy within the EUV light generating apparatus 1, and heat the EUV light generating apparatus 1.

That is, the integrated value $E_s$ of EUV energy $E_n$ may be correlated with the amount of increase $\Delta Q^+$ of heat energy that increases within the EUV light generating apparatus 1 during the control period Δt.

Therefore, the control unit 51 may estimate the amount of increase $\Delta Q^+$ of heat energy that increases within the EUV light generating apparatus 1 during the control period Δt from the integrated value $E_s$ of EUV energy $E_n$ which is integrated during the control period Δt.

At step S112, the control unit 51 may estimate the amount of discharge $\Delta Q^-$ of heat energy which is discharged to the exterior of the EUV light generating apparatus 1 during the control period Δt by employing Formula 15.

$$\Delta Q^- = -Q_{n-1}\left(1 - e^{-\frac{\Delta t}{\tau}}\right) \qquad \text{[Formula 15]}$$

The accumulated amount Q of heat energy which is accumulated within the EUV light generating apparatus 1 due to the EUV light 251 being generated may be considered to be discharged to the exterior of the EUV light generating apparatus 1 at a predetermined discharge time constant τ.

The discharge time constant τ is a virtual amount, and may correspond to a time constant when the accumulated amount of light energy, which is accumulated within the EUV light generating apparatus 1 due to the EUV light 251 being generated, is discharged to the exterior of the EUV light generating light apparatus 1.

The control unit 51 may store the discharge time constant τ in advance, and to estimate the amount of discharge $\Delta Q^-$ of heat energy which is discharged to the exterior of the EUV light generating apparatus 1 during the control period Δt by employing the discharge time constant τ.

Note that a process that obtains the discharge time constant τ will be described later with reference to FIG. 29 through FIG. 31 and FIG. 33 through FIG. 41.

At step S113, the control unit 51 may calculate the amount of change $\Delta X^+$ of the focal point F corresponding to the amount of increase $\Delta Q^+$ of heat energy by employing Formula 16.

$$\Delta X^+ = \Delta Q^+ \left[\frac{dX(Q)}{dQ}\right]_{Q=Q_m} \qquad \text{[Formula 16]}$$

At step S114, the control unit 51 may calculate the amount of change $\Delta X^-$ of the focal point F corresponding to the amount of discharge $\Delta Q^-$ of heat energy by employing Formula 17.

$$\Delta X^- = \Delta Q^- \left[\frac{dX(Q)}{dQ}\right]_{Q=Q_m} \qquad \text{[Formula 17]}$$

Here, Formula 16 and Formula 17 that express the amounts of change $\Delta X^+$ and $\Delta X^-$ of the focal point F will be considered.

As illustrated in FIG. 28, it is considered that, when the accumulated amount Q of heat energy within the EUV light generating apparatus 1 changes from $Q_m$ to $Q_{m+1}$, the position X(Q) of the focal point F will change from $X(Q_m)$ to $X(Q_{m+1})$.

If a difference ΔQ between $Q_{m+1}$ and $Q_m$ is small, the relationship of Formula 18 may be established.

$$X(Q_{m+1}) = X(Q_m) + \Delta Q \left[\frac{dX(Q)}{dQ}\right]_{Q=Q_m} \qquad \text{[Formula 18]}$$

If Formula 18 is resolved, the amount of change of the focal point F from $X(Q_m)$ to $X(Q_{m+1})$ may be expressed as in Formula 19.

$$X(Q_{m+1}) - X(Q_m) = \Delta Q \left[\frac{dX(Q)}{dQ}\right]_{Q=Q_m}$$ [Formula 19]

In the case that $Q_{m+1}$ is greater than $Q_m$, the difference $\Delta Q$ between $Q_{m+1}$ and $Q_m$ may be the amount of increase $\Delta Q^+$ of heat energy. In this case, in the function of X(Q) such as that illustrated in FIG. 28, the difference between $X(Q_{m+1})$ and $X(Q_m)$ at the left side of Formula 19 may correspond to the amount of change $\Delta X^+$ of the focal point F.

In the case that $Q_{m+1}$ is less than $Q_m$, the difference $\Delta Q$ between $Q_{m+1}$ and $Q_m$ may be the amount of discharge $\Delta Q^-$ of heat energy. In this case, in the function of X(Q) such as that illustrated in FIG. 28, the difference between $X(Q_{m+1})$ and $X(Q_m)$ at the left side of Formula 19 may correspond to the amount of change $\Delta X^-$ of the focal point F.

Accordingly, the amounts of change $\Delta X^+$ and $\Delta X^-$ of the focal point F may be calculated by employing Formula 16 and Formula 17.

However, because the control unit 51 cannot handle X(Q) as a continuous function, a derivative function of X(Q) may approximate the function as expressed by Formula 20. In this case, $Q_m$ may be expressed to have a relationship of Formula 21 or Formula 22. Note that parameter i may be a natural number which is greater than or equal to 0 and less than or equal to n.

$$\left[\frac{dX(Q)}{dQ}\right]_{Q=Q_m} \rightarrow \frac{X_i - X_{i-1}}{Q_i - Q_{i-1}}$$ [Formula 20]

$$Q_{i-1} \leq Q_m < Q_i$$ [Formula 21]

$$Q_{i-1} < Q_m \leq Q_i$$ [Formula 22]

The control unit 51 may store a data table that shows a correspondent relationship between accumulated amounts $Q_i$ of heat energy and positions $X_i$ of the focal point F in advance, and perform calculation using Formula 20 by referring to the data table.

The control unit 51 may perform calculation using Formula 16 and 17 that express the amounts of change $\Delta X^+$ and $\Delta X^-$ of the focal point F in this manner.

Note that a process that obtains the data table that shows the correspondent relationship between accumulated amounts $Q_i$ of heat energy and positions $X_i$ of the focal point F will be described later with reference to FIG. 29 through FIG. 31 and FIG. 33 through FIG. 41.

At step S115, the control unit 51 may calculate the amount of shift $\Delta X_{sft}$ of the focal point F from the balance of the amount of change $\Delta X^+$ of the focal point F and the amount of change $\Delta X^-$ of the focal point F.

Specifically, the control unit 51 may calculate the amount of shift $\Delta X_{sft}$ of the focal point F from a sum of the amount of change $\Delta X^+$ of the focal point F and the amount of change $\Delta X^-$ of the focal point F, as expressed by Formula 23.

$$\Delta X_{sft} = \Delta X^+ + \Delta X^- = (\Delta Q^+ + \Delta Q^-)\left[\frac{dX(Q)}{dQ}\right]_{Q=Q_m}$$ [Formula 23]

$$= \left\{E_s - Q_{n-1}\left(1 - e^{-\frac{\Delta t}{\tau}}\right)\right\}\left[\frac{dX(Q)}{dQ}\right]_{Q=Q_m}$$

Formula 23 shows that it is possible for the control unit 51 to calculate the amount of shift $\Delta X_{sft}$ of the focal point F based on a sum of the amount of increase $\Delta Q^+$ and the amount of discharge $\Delta Q^-$ of heat energy.

At step S116, the control unit 51 may determine the driving amount $\Delta X$ of the stage 483 according to the amount of shift $\Delta X_{sft}$ of the focal point F, as expressed by Formula 24.

$$\Delta X = \Delta X_{sft}$$ [Formula 24]

Thereafter, the control unit 51 may end the present process, and cause the process to proceed to step S11 of FIG. 15.

[4.3 Obtainment of Data Table for Accumulated Amounts $Q_i$ and Positions $X_i$, as Well as Discharge Time Constant $\tau$]

Figure 29:
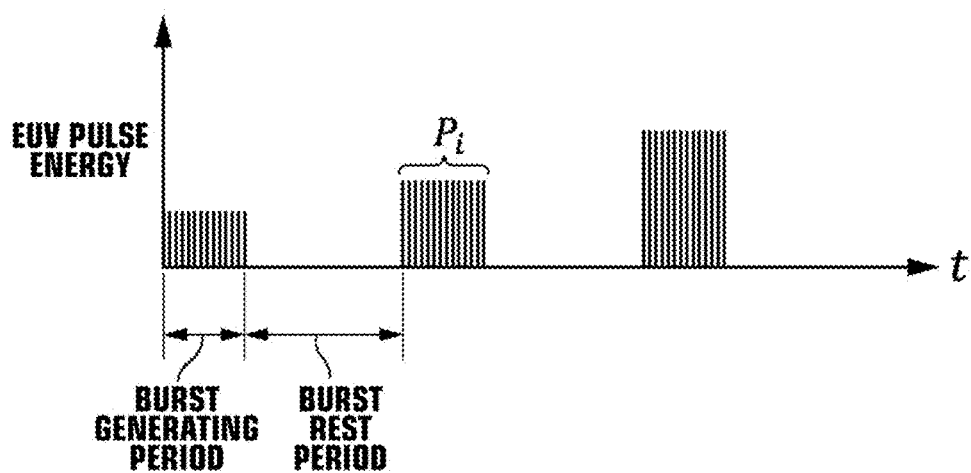
FIG. 29 is a diagram for explaining a burst operation, which is performed to obtain a data table that shows a correspondent relationship between accumulated amounts $Q_i$ of heat energy and positions $X_i$ of the focal point corresponding to the relationship illustrated in FIG. 28, as well as a discharge time constant $\tau$.
Figures 30, 31:
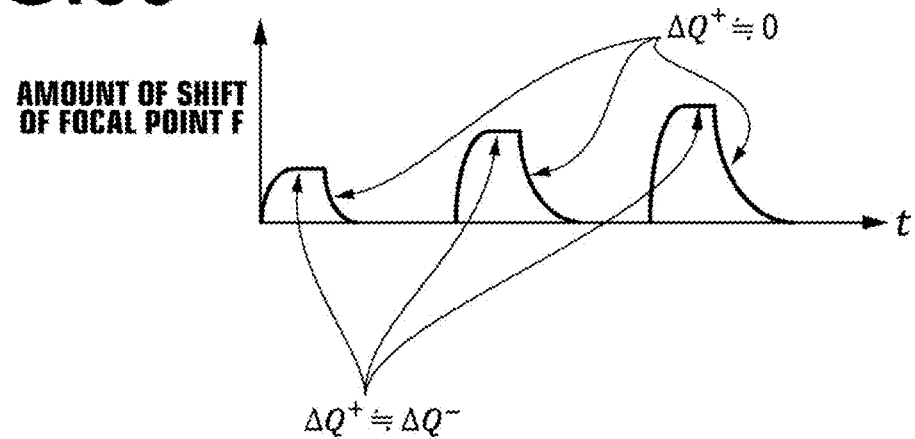
FIG. 30 is a diagram for explaining an amount of shift $\Delta X_{sft}$ of the focal point, which shifts due to the burst operation illustrated in FIG. 29.
FIG. 31 is a diagram for explaining the data table which is obtained by the burst operation illustrated in FIG. 29.

FIG. 29 is a diagram for explaining a burst operation, which is performed to obtain the data table that shows the correspondent relationship between accumulated amounts $Q_i$ of heat energy and positions $X_i$ of the focal point F corresponding to the relationship illustrated in FIG. 28, as well as the discharge time constant $\tau$. FIG. 30 is a diagram for explaining the amount of shift $\Delta X_{sft}$ of the focal point F, which shifts due to the burst operation illustrated in FIG. 29. FIG. 31 is a diagram for explaining the data table which is obtained by the burst operation illustrated in FIG. 29.

The EUV light generating apparatus 1 may obtain the data table that shows the correspondent relationship between accumulated amounts $Q_i$ of heat energy and positions $X_i$ of the focal point F corresponding to the relationship illustrated in FIG. 28, as well as the discharge time constant $\tau$ in advance, prior to the process illustrated in FIG. 15 being performed. To this end, the EUV light generating apparatus 1 may perform the following operations.

First, the EUV light generating apparatus 1 may measure the position of the focal point F in advance, prior to a state in which the EUV light 251 is generated.

Next, the EUV light generating apparatus 1 may perform the burst operation.

The burst operation may be an operation that alternately repeats burst generating periods, during which the EUV light 251 is generated, and burst rest periods, during which the EUV light 251 is not generated, at a predetermined repetition frequency for a predetermined period.

The EUV light generating apparatus 1 may perform the burst operation while changing a power $P_i$ of the EUV light 251 during each burst generating period. For example, the EUV light generating apparatus 1 may perform the burst operation while increasing the power $P_i$ of the EUV light 251 during each burst generating period, as illustrated in FIG. 29. The EUV light generating apparatus 1 may perform the burst operation while increasing the power $P_i$, by setting the length of each burst generating periods to be substantially constant and increasing the pulse energy of the EUV light 251 which is generated during each burst generation period.

The EUV light generating apparatus 1 may perform the burst operation while securing periods to a degree, which is sufficient for the position of the shifted focal point F to return to the position in the state prior to the generation of the EUV light 251 being performed, as the burst rest periods.

In the case that such a burst operation is performed, the amount of shift $\Delta X_{sft}$ of the focal point F may increase accompanying the initiation of each burst generating period and then eventually become saturated, as illustrated in FIG. 30. It may be considered that the amount of increase $\Delta Q^+$ of heat energy and the amount of discharge $\Delta Q^-$ per unit time are in equilibrium during the period in which the amount of shift $\Delta X_{sft}$ is saturated.

Thereafter, the saturated amount of shift $\Delta X_{sft}$ may decrease accompanying the completion of each burst generating period, and then eventually become substantially zero. It may be considered that amount of increase $\Delta Q^+$ of heat energy is substantially zero because the burst generating period is completed, and the amount of shift $\Delta X_{sft}$ decreases according to the discharge time constant $\tau$ during the period in which the amount of shift $\Delta X_{sft}$ decreases.

Next, the EUV light generating apparatus 1 may measure a position $X_i$ of the focal point F when the EUV light generating apparatus 1 is in a state of thermal equilibrium and the amount of shift $\Delta X_{sft}$ is saturated and stabilized. The EUV light generating apparatus 1 may correlate and store the measured position $X_i$ of the focal point F with the power $P_i$ of the EUV light 251 during each burst generating period.

Here, it may be considered that an accumulated amount $Q_i$ of heat energy which is accumulated within the EUV light generating apparatus 1 is proportionate to the power $P_i$ of the EUV light 251, because the amount of increase $\Delta Q^+$ of heat energy per unit time and the amount of decrease $\Delta Q^-$ of heat energy per unit time are in equilibrium. For this reason, the accumulated amount $Q_i$ of heat energy may be approximately substituted for the power $P_i$ of the EUV light 251.

Accordingly, the EUV light generating apparatus 1 may correlate and store the measured position $X_i$ of the focal point F with the power $P_i$ of the EUV light 251 during each burst generating period, to obtain a data table such as that illustrated in FIG. 31.

In addition, the EUV light generating apparatus 1 may measure a relaxation time $T_i$, which is an amount of time from a point immediately following the completion of each burst generating period to a point at which the position $X_i$ of the focal point F returns to the state prior to the generation of the EUV light 251. The EUV light generating apparatus 1 may measure the relaxation time $T_i$, by measuring the amount of time until the contrast of the image of the droplet 271 returns to a contrast in the state prior to the generation of the EUV light 251 from a contrast immediately following the completion of each burst generating period.

The EUV light generating apparatus 1 may correlate and store the measured relaxation time $T_i$ with the measured position $X_i$ of the focal point F and the power $P_i$ of the EUV light 251, to obtain a data table such as that illustrated in FIG. 31.

The EUV light generating apparatus 1 may determine the discharge time constant $\tau$ from the measured relaxation time $T_i$, and store the determined discharge time constant $\tau$. The amount of shift $\Delta X_{sft}$ may decrease more gradually and the relaxation time $T_i$ may become longer as the discharge time constant $\tau$ is greater.

The other operations of the EUV light generating apparatus 1 of the first embodiment may be the same as those of the EUV light generating apparatus 1 of the comparative example.

[4.4 Operative Effects]

The EUV light generating apparatus 1 of the first embodiment is capable of correcting the position of the focal point F by driving the stage 483 for an appropriate driving amount corresponding to the amount of shift of the focal point F, even if the focal point F shifts when the EUV light 251 is generated.

For this reason, the EUV light generating apparatus 1 of the first embodiment is capable of preventing out of focus images being obtained by the imaging unit 470 because the focal point F will match the position of the droplet 271 supplied to the plasma generating region 25, even if the focal point F of the imaging unit 470 shifts.

That is, if the correction is administered, a state which is the same as the state at the initial position described previously and illustrated in FIG. 4 will be achieved, and the image sensor 471 will be capable of capturing an image of the droplet 271 in focus.

As a result, the EUV light generating apparatus 1 of the first embodiment is capable of appropriately measuring the state of the droplet 271 supplied to the plasma generating region 25, and of appropriately controlling the state of the droplet 271 supplied to the plasma generating region 25.

Particularly, there may be cases in which the laser apparatus 3 outputs a plurality of pulsed laser beams 31 instead of a single pulsed laser beam 31 to radiate one droplet 271.

For example, there may be a case in which the laser apparatus 3 outputs three pulsed laser beams 31, a first pre-pulsed laser beam, a second pre-pulsed laser beam, and a main pulsed laser beam, in this order as the plurality of pulsed laser beams 31.

The droplet 271, which is a primary target, may be destroyed when irradiated with the first pre-pulsed laser beam, scatter as fine particles of the target 27, and change into a secondary target. That is, the secondary target may be the target 27 which changes from the aspect of the droplet 271 by being irradiated with the first pre-pulsed laser beam.

The secondary target may scatter as a cluster of even finer particles of the target 27, vapor of the target 27, and pre-plasma, which is a portion of the secondary target that turns into plasma, and change into a tertiary target. That is, the tertiary target may be the target 27 which changes from the aspect of the secondary target by being irradiated with the second pre-pulsed laser beam.

The pre-plasma may be the target 27, which is a portion of the secondary target that turns into plasma and is an aspect that includes ions or neutral particles. The tertiary target may improve the generation efficiency of EUV light by the main pulsed laser beam.

The EUV light generating apparatus 1 of the first embodiment is capable of appropriately controlling the state of the droplet 271 supplied to the plasma generating region 25. Therefore, it is possible for the states of the secondary target and the tertiary target to be appropriately controlled, and to improve the generation efficiency of EUV light.

Note that the EUV light generating apparatus 1 of the first embodiment may not only capture an image of the droplet 271 at the plasma generating region 25, but may also capture images, and measure the sizes, shapes, positions, etc. of the secondary target and the tertiary target as well.

In the first embodiment, a case in which the position of the focal point F of the lens of the image forming optical system 472 positioned at the side of the plasma generating region 25 changes was described as a specific example. The position of the focal point F in this case is the position where an image which is formed by the image forming optical system 472 is formed on the light receiving surface 475a of the optical shutter 475, and may be read as a position O of a subject.

For example, in FIG. 7, there may be a case in which the lenses of the image forming optical system 472 positioned at the side of the plasma generating region 25 as well as at the side of the optical shutter 475 are heated. In this case, the position O of the subject for forming an image on the light receiving surface 475a of the optical shutter 475 may shift somewhat from the position of the focal point F of the lens of the image forming optical system 472 positioned at the side of the plasma generating region 25. In such a case as well, a correspondence between the position O of the subject and a position Xi may be stored in a storage means in the form of a look up table, for example. Then, an amount of movement of the position O corresponding to the position Xi may be read out from the storage means, and the stage 483 may be moved for the amount of movement. Note that the above correspondence may be obtained based on experiments or experience.

5. Second Embodiment

An EUV light generating apparatus 1 according to a second embodiment will be described.

As described previously, the respective energy of the pulsed laser beams 31 through 33 with which the droplet 271 is irradiated may be light energy which is generated in the EUV light generating apparatus 1 when the EUV light 251 is generated. The energy of one of the pulsed laser beams 31 through 33 with which the droplet 271 is irradiated may be measured by the second light energy measuring unit 8.

The control unit 51 of the second embodiment may receive the laser energy measurement signal from the second light energy measuring unit 8. The control unit 51 of the second embodiment may control the stage 483 such that the focal point F matches the position of the droplet 271 supplied to the plasma generating region 25, based on the measured value of the energy of one of the pulsed laser beams 31 through 33, which is included in the laser energy measurement signal.

Specifically, the control unit 51 of the second embodiment may calculate the amount of shift of the focal point F based on the measured value of the energy of one of the pulsed laser beams 31 through 33. Then, the control unit 51 of the second embodiment may determine the driving amount of the stage 483 corresponding to the amount of shift of the focal point F.

The other structures and operations of the EUV light generating apparatus 1 of the second embodiment may be the same as those of the EUV light generating apparatus 1 of the first embodiment.

Accordingly, the EUV light generating apparatus 1 of the second embodiment is capable of obtaining an image of the droplet 271 in focus by driving the stage 483 for an appropriate driving amount corresponding to the amount of shift of the focal point F, even if the focal point F shifts when the EUV light 251 is generated, in the same manner as the first embodiment.

As a result, the EUV light generating apparatus 1 of the second embodiment is capable of appropriately measuring the state of the droplet 271 supplied to the plasma generating region 25, and of appropriately controlling the state of the droplet 271 supplied to the plasma generating region 25.

6. Third Embodiment

An EUV light generating apparatus 1 according to a third embodiment will be described with reference to FIG. 32.

Figure 32:
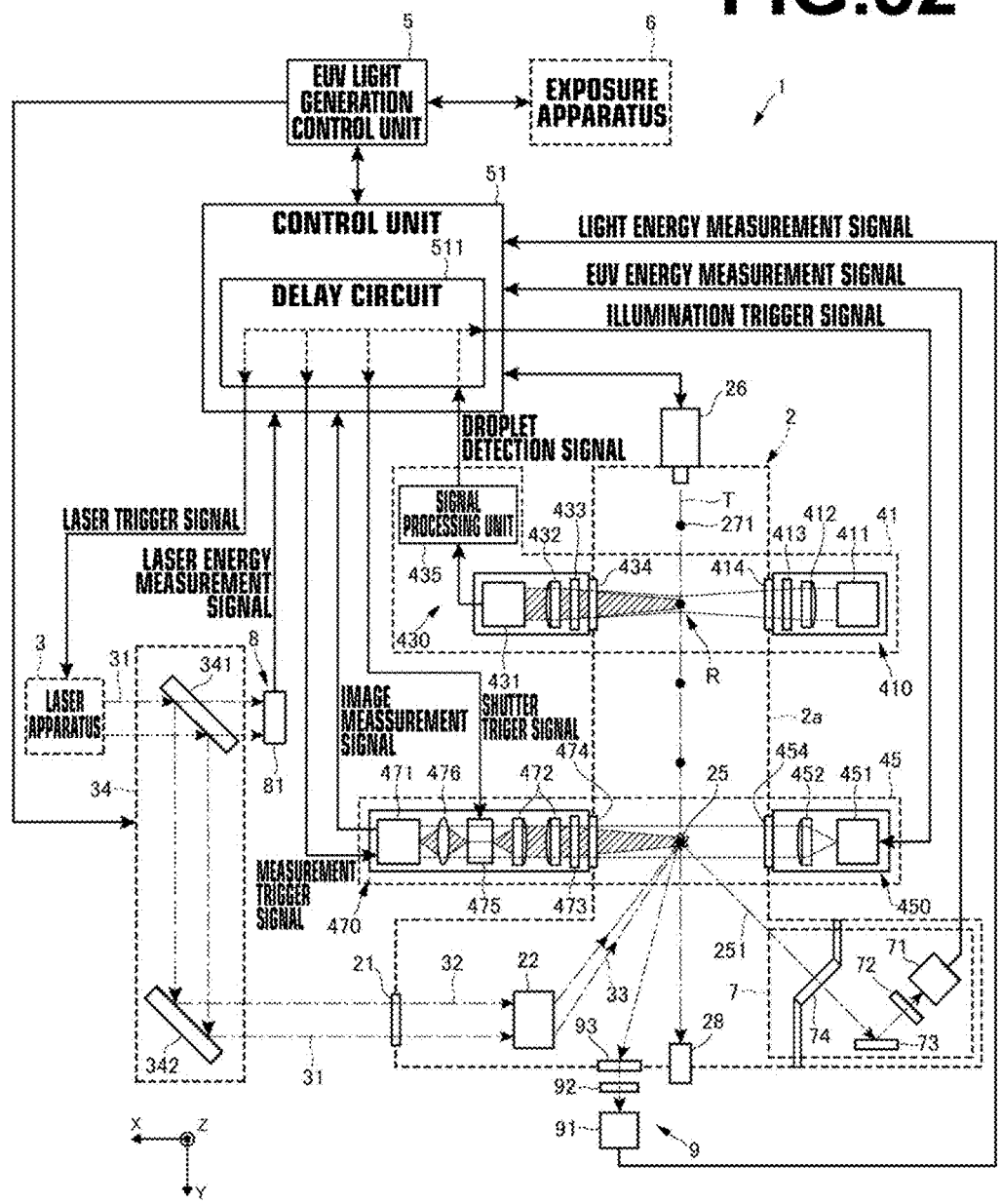
FIG. 32 is a diagram for explaining the configuration of an EUV light generating apparatus according to a third embodiment.

FIG. 32 is a diagram for explaining the configuration of the EUV light generating apparatus 1 of the third embodiment.

As described previously, the plasma may emit light having various wavelengths, such as DUV light, UV light, visible light, and infrared light, in addition to the EUV light 251. That is, the light such as DUV light, UV light, visible light, and infrared light, from among the light emitted from the plasma, may be light having wavelengths different from that of the EUV light 251.

The energy of the light having wavelengths different from that of the EUV light 251, from among the light emitted from the plasma may be light energy which is generated in the EUV light generating apparatus 1 when the EUV light 251 is generated.

The EUV light generating apparatus 1 of the third embodiment may be equipped with a third light energy measuring unit 9 that measures the energy of light having a specific wavelength different from that of the EUV light 251, from among the light emitted from the plasma.

The third light energy measuring unit 9 may include a light energy sensor 91, an optical filter 92, and a window 93.

The window 93 may be provided in the wall 2a of the chamber 2. The window 93 may be mounted in the wall 2a of the chamber 2 via a sealing member such that the pressure in the interior of the chamber 2 is maintained at a pressure approximating a vacuum.

The window 93 may be arranged such that it faces the plasma generating region 25.

The window 93 may be provided along an optical path of the light which is emitted from the plasma generating region 25.

The window 93 may transmit the light which is emitted from the plasma generating region 25 toward the optical filter 92.

The optical filter 92 may be a bandpass filter having a high transmissivity with respect to the light having the specific wavelength different from that of the EUV light 251, from among the light emitted from the plasma.

The optical filter 92 may be provided along an optical path of the light which is transmitted through the window 93.

The optical filter 92 may transmit the light having the specific wavelength different from that of the EUV light 251, from among the light which is transmitted through the window 93, toward the light energy sensor 91. The optical filter 92 may prevent light other than the light having the specific wavelength from entering the light energy sensor 91.

The light energy sensor 91 may be a light sensor that measures the energy of the light having the specific wavelength different from that of the EUV light 251, from among the light emitted from the plasma.

The light energy sensor 91 may be constituted by including a detecting element having a high sensitivity with respect to the specific wavelength.

The light energy sensor 91 may be provided along an optical path of the light which is transmitted through the optical filter 92.

The light energy sensor 91 may detect the energy of the light which is transmitted through the optical filter 92, and estimate the energy of the light having the specific wavelength based on the detected value. The light energy sensor 91 may designate this estimated value as the measured value of the energy of the light having the specific wavelength.

The light energy sensor 91 may send a light energy measurement signal that includes this measured value to the control unit 51.

The control unit 51 of the third embodiment may receive the light energy measurement signal from the third light energy measuring unit 9. Then, the control unit 51 of the third embodiment may control the stage 483 such that the focal point F matches the position of the droplet 271 supplied to the plasma generating region 25, based on the measured value of the light energy, which is included in the light energy measurement signal.

The other structures and operations of the EUV light generating apparatus 1 of the third embodiment maybe the same as those of the EUV light generating apparatus 1 of the first embodiment.

Accordingly, the EUV light generating apparatus 1 of the third embodiment is capable of obtaining an image of the droplet 271 in focus by driving the stage 483 for an appropriate driving amount corresponding to the amount of shift of the focal point F, even if the focal point F shifts when the EUV light 251 is generated, in the same manner as the first embodiment.

As a result, the EUV light generating apparatus 1 of the third embodiment is capable of appropriately measuring the state of the droplet 271 supplied to the plasma generating region 25, and of appropriately controlling the state of the droplet 271 supplied to the plasma generating region 25.

7. Processes Performed by Control Unit Related to Obtainment of Data Table for Accumulated Amounts $Q_i$ and Positions $X_i$, as Well as Discharge Time Constant τ

Processes related to obtainment of the data table for the accumulated amounts $Q_i$ and the positions $X_i$ which are performed by the control unit will be described with reference to FIG. 33 through FIG. 41.

As described previously, the EUV light generating apparatuses 1 of the first through third embodiments may obtain the data table for the accumulated amounts $Q_i$ and the positions $X_i$, as well as the discharge time constant τ by employing the techniques which were described with reference to FIG. 29 through FIG. 31 prior to the process illustrated in FIG. 15 being performed.

Specifically, as described previously, the EUV light generating apparatuses 1 may substitute the accumulated amount $Q_i$ for the power $P_i$ of the EUV light 251 during the burst generating periods. Then, the EUV light generating apparatuses 1 may obtain a data table of the power $P_i$, the position $X_i$, and the relaxation time $T_i$ such as that illustrated in FIG. 31, as well as the discharge time constant τ.

At this time, the control units 51 of the first through third embodiments may perform the following processes.

Figure 33:
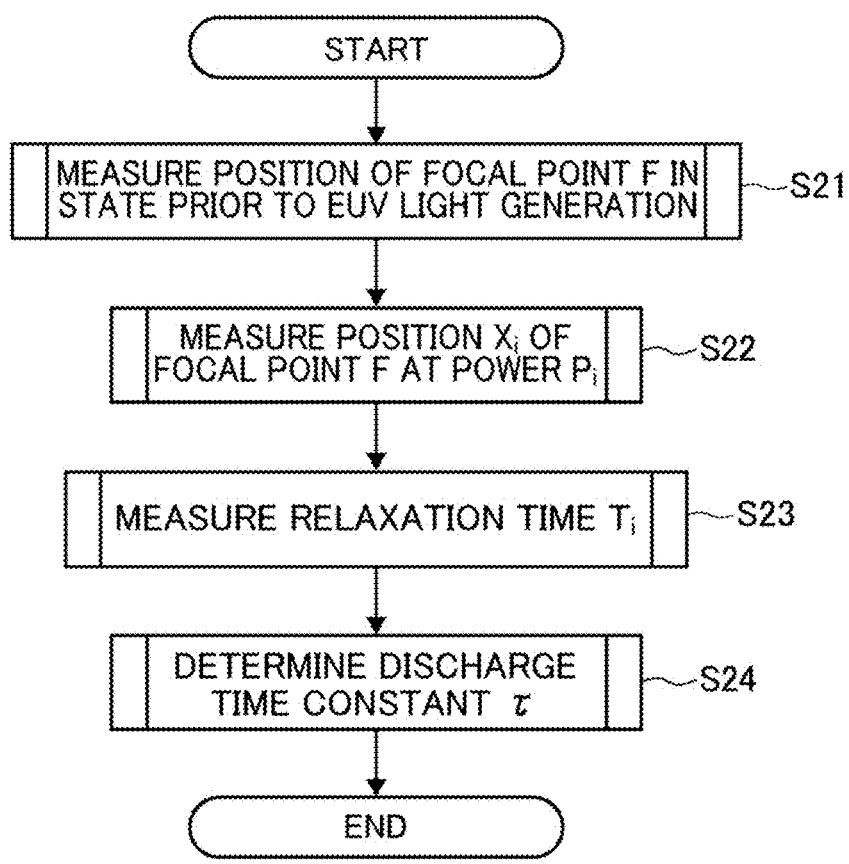
FIG. 33 is a diagram that illustrates a flow chart of processes related to obtaining the data table illustrated in FIG. 31 and the discharge time constant $\tau$, performed by a control unit.

FIG. 33 is a diagram that illustrates a flow chart of processes related to obtaining the data table illustrated in FIG. 31 and the discharge time constant τ, performed by the control units 51. Hereinafter, the control units 51 will be referred in the singular form to simplify the description, as the processes are the same in the first through third embodiments.

At step S21, the control unit 51 may measure the position of the focal point F of the imaging unit 470 in the state prior to the generation of the EUV light 251 being performed.

A process that measures the position of the focal point F in the state prior to the generation of the EUV light 251 being performed will be described later with reference to FIG. 34.

At step S22, the control unit 51 may measure the position $X_i$ of the focal point F at the power $P_i$ of the EUV light 251 during each burst generating period.

A process that measures the position $X_i$ of the focal point F at the power $P_i$ will be described later with reference to FIG. 35.

At step S23, the control unit 51 may measure the relaxation time $T_i$ of the position $X_i$ of the focal point F.

A process that measures the relaxation time $T_i$ will be described later with reference to FIG. 39.

At step S24, the control unit 51 may obtain the discharge time constant τ.

A process that obtains the discharge time constant τ will be described later with reference to FIG. 41.

Figure 34:
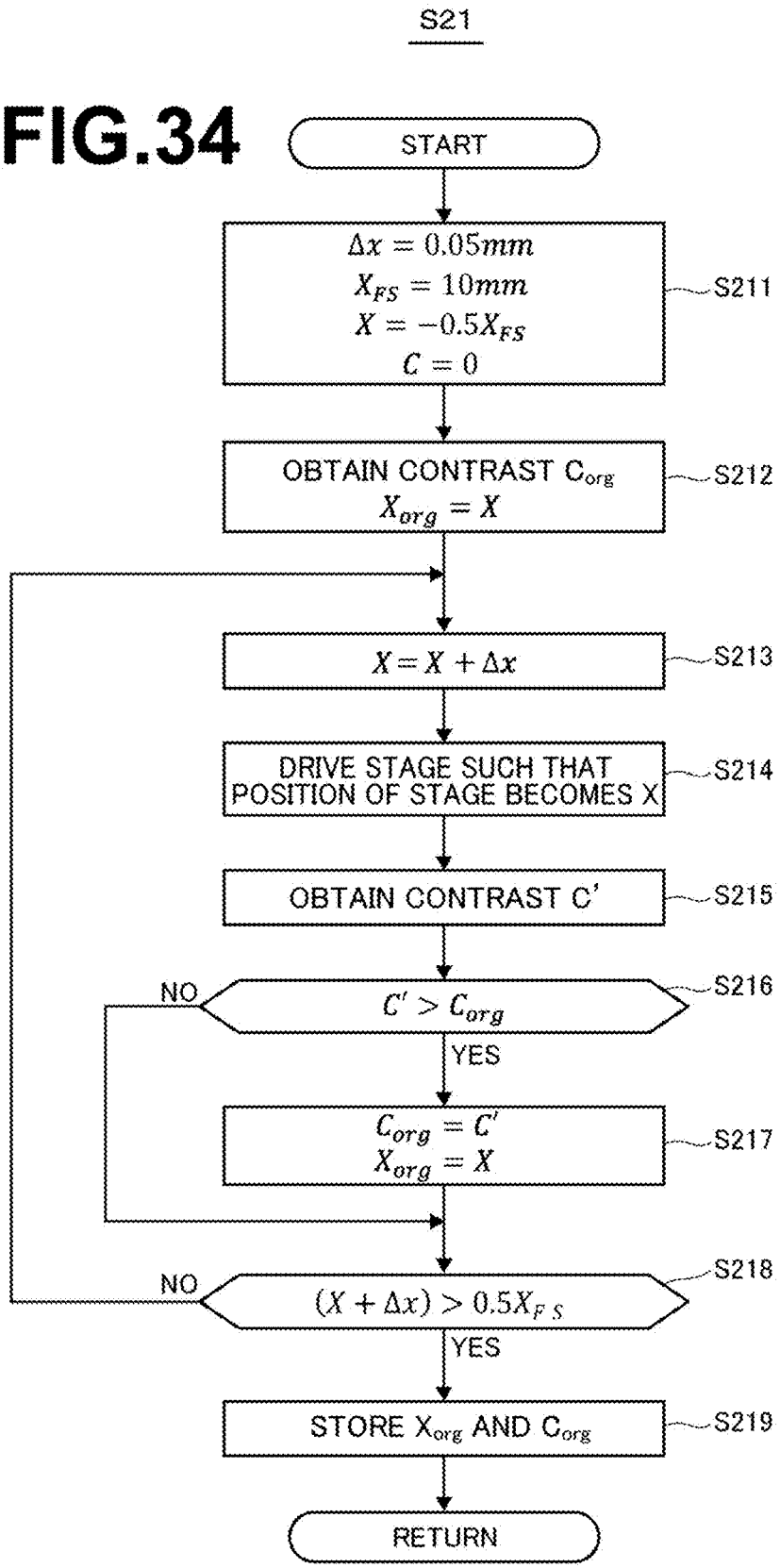
FIG. 34 is a diagram that illustrates a flow chart of a process that measures a position $X_{org}$ of a focal point in a state before EUV light is generated, denoted as step S21 in FIG. 33.

FIG. 34 is a diagram that illustrates a flow chart of the process that measures the position $X_{org}$ of the focal point F in a state before the EUV light 251 is generated, denoted as step S21 in FIG. 33.

At step S211, the control unit 51 may initialize parameters as shown in Formula 25.

$$\Delta x = 0.05 \text{ mm}$$

$$X_{FS} = 10 \text{ mm}$$

$$C = 0 \quad \text{[Formula 25]}$$

$X_{FS}$ may be a parameter related to a movable range of the stage 483.

C may be a parameter related to the contrast of the image of the droplet 271.

In addition, the control unit 51 may set the position X of the stage 483 to be at the center position of the movable range as expressed by Formula 26, and then drive the stage 483.

$$X = -0.5 X_{FS} \quad \text{[Formula 26]}$$

At step S212, the control unit 51 may obtain an image of the droplet 271 and a contrast thereof, and set the obtained contrast as a contrast $C_{org}$. Then, the control unit 51 may set the position X of the stage 483 when the contrast $C_{org}$ is obtained as the position $X_{org}$, as expressed by Formula 27.

$$X_{org} = X \quad \text{[Formula 27]}$$

At step S213, the control unit 51 may set the position X such that the position X of the stage 483 moves for the scan step Δx, as expressed by Formula 28.

$$X = X + \Delta x \quad \text{[Formula 28]}$$

At step S214, the control unit 51 may drive the stage 483 such that the position of the stage 483 becomes X.

At step S215, the control unit 51 may obtain an image of the droplet 271 and a contrast C' thereof.

At step S216, the control unit 51 may judge whether the contrast C' is greater than the contrast $C_{org}$, as expressed by Formula 29.

$$C' > C_{org} \quad \text{[Formula 29]}$$

In the case that the control unit 51 judges that the contrast C' is not greater than the contrast $C_{org}$, the control unit 51 may cause the process to proceed to step S218. On the other hand, in the case that the control unit 51 judges that the contrast C' is greater than the contrast $C_{org}$, the control unit 51 may cause the process to proceed to step S217.

At step S217, the control unit 51 may set the contrast C' as the contrast $C_{org}$, as expressed by Formula 30. Then, the control unit 51 may set the position X of the stage 483 when the contrast $C_{org}$ is obtained as the position $X_{org}$, as expressed by Formula 30.

$$C_{org} = C'$$

$$X_{org} = X \quad \text{[Formula 30]}$$

At step S218, the control unit 51 may employ Formula 31 to judge whether the movable range of the stage 483 will be exceeded when the position X of the stage 483 is moved for the scan step Δx.

If the movable range of the stage 483 will not be exceeded when the position X of the stage 483 is moved for the scan step Δx, the control unit 51 may cause the process to return to step S213. On the other hand, if the movable range of the stage 483 will be exceeded when the position X of the stage 483 is moved for the scan step Δx, the control unit 51 may cause the process to proceed to step S219.

$$(X + \Delta x) > 0.5 X_{FS} \quad \text{[Formula 31]}$$

At step 219, the control unit 51 may store the position $X_{org}$ and the contrast $C_{org}$.

Thereafter, the control unit 51 may end the present process, and cause the process to proceed to step S22 of FIG. 33.

Figure 35:
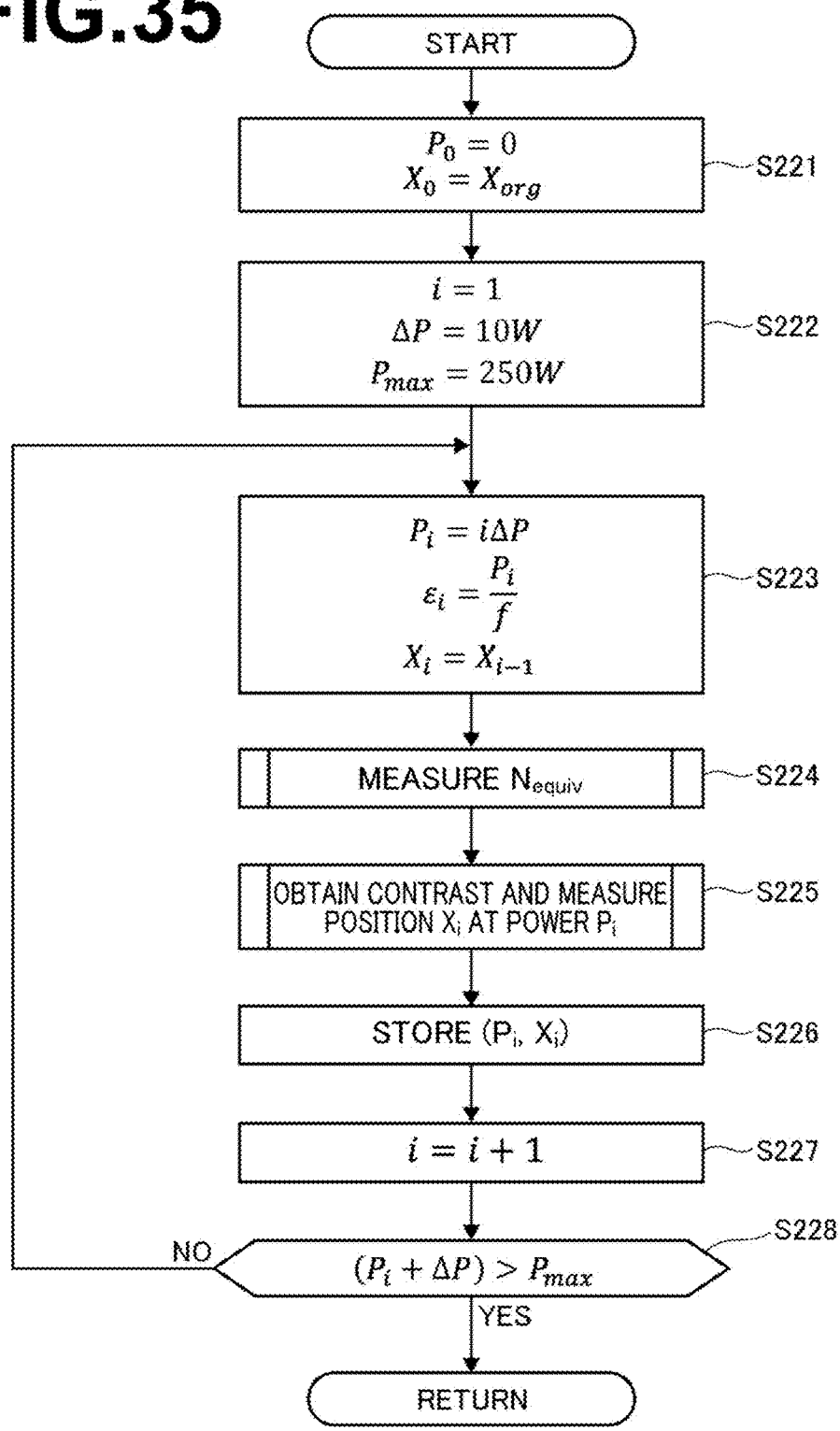
FIG. 35 is a diagram that illustrates a flow chart of a process that measures a position $X_i$ of a focal point at a power $P_i$, denoted as step S22 in FIG. 33.

FIG. 35 is a diagram that illustrates a flow chart of the process that measures the position $X_i$ of the focal point F at the power $P_i$, denoted as step S22 in FIG. 33.

At step S221, the control unit 51 may initialize parameters as expressed by Formula 32.

$$P_0 = 0$$

$$X_0 = X_{org} \quad \text{[Formula 32]}$$

$P_0$ may be a parameter related to the power $P_i$ of the EUV light 251.

$X_0$ may be a parameter related to the position of the stage 483.

At step S222, the control unit 51 may initialize parameters as expressed by Formula 33.

$$i = 1$$

$$\Delta P = 10W$$

$$P_{max} = 250W \quad \text{[Formula 33]}$$

$\Delta P$ may be a scan step of the power $P_i$ when the power $P_i$ of the EUV light 251 is scanned to measure the position $X_i$ of the focal point F during each burst generating period.

$P_{max}$ may be an upper limit value of a range within which the power $P_i$ is scanned.

At step S223, the control unit 51 may set the power $P_i$ of the EUV light 251 during each burst generating period, as expressed by Formula 34. The control unit 51 may set a pulse energy $\varepsilon_i$ of the EUV light 251 during each burst generating period, as expressed by Formula 34. The control unit 51 may set the position $X_i$ of the focal point F to $X_{i-1}$, as expressed by Formula 34.

$$P_i = i\Delta P \quad \text{[Formula 34]}$$

$$\varepsilon_i = \frac{P_i}{f}$$

$$X_i = X_{i-1}.$$

Note that f may be the repetition frequency of the EUV light 251.

At step S224, the control unit 51 may perform a process that measures a pulse number $N_{equiv}$ which is necessary for the EUV light generating apparatus 1 to achieve a state of thermal equilibrium, and the amount of shift of the focal point F becomes saturated and stabilized at the power $P_i$.

A process that measures the pulse number $N_{equiv}$ will be described later with reference to FIG. 36.

At step S225, the control unit 51 may obtain an image of the droplet 271 and a contrast thereof, and perform a process that measures the position $X_i$ of the focal point F in a state in which the amount of shift is stabilized at the power $P_i$.

A process that obtains the contrast and measures the position $X_i$ at the power $P_i$ will be described later with reference to FIG. 38.

At step S226, the control unit 51 may correlate the measured position $X_i$ to the power $P_i$ and store the correlated measured position $X_i$.

At step S227, the control unit 51 may incrementally increase the parameter i, as expressed by Formula 35.

$$i = i + 1 \quad \text{[Formula 35]}$$

At step S228, the control unit 51 may employ Formula 36 to judge whether a scan range of the power $P_i$ will be exceeded when the power $P_i$ is increased by the scan step $\Delta P$.

$$(P_i + \Delta P) > P_{max} \quad \text{[Formula 36]}$$

If the scan range of the power $P_i$ will not be exceeded when the power $P_i$ is increased by the scan step $\Delta P$, the control unit 51 may cause the process to return to step S223. On the other hand, if the scan range of the power $P_i$ will be exceeded when the power $P_i$ is increased by the scan step $\Delta P$, the control unit 51 may end the present process.

Thereafter, the control unit 51 may cause the process to proceed to step S23 of FIG. 33.

Figure 36:
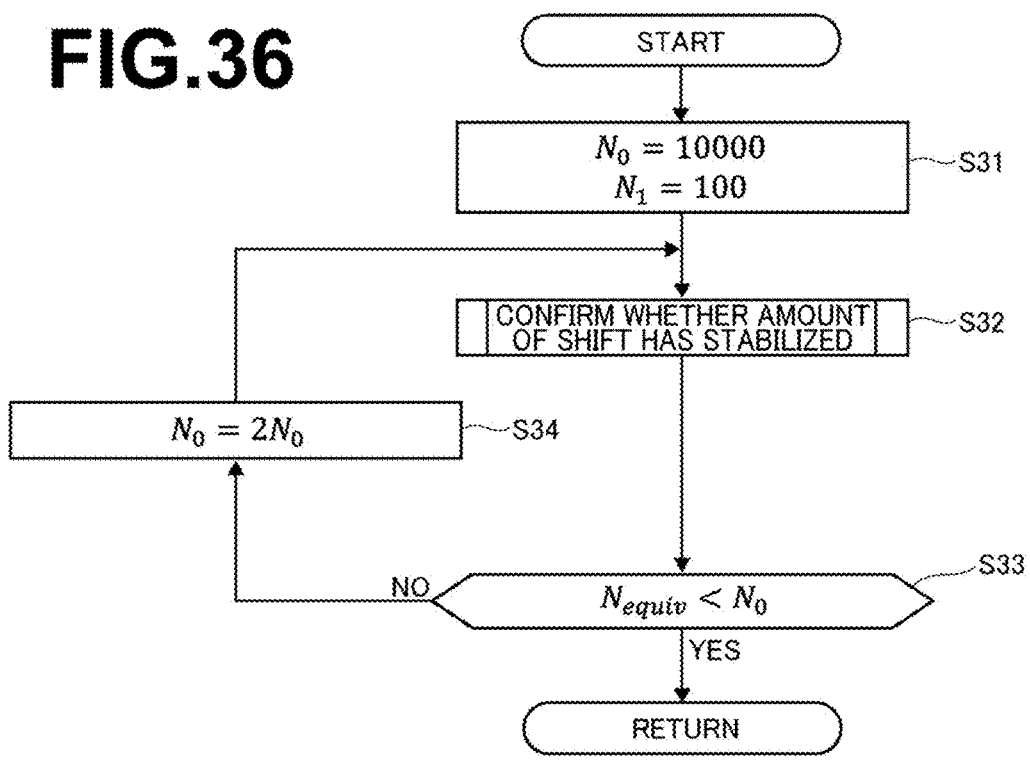
FIG. 36 is a diagram that illustrates a flow chart of a process that measures a pulse number $N_{equiv}$, denoted as step S224 in FIG. 35.

FIG. 36 is a diagram that illustrates a flow chart of the process that measures the pulse number $N_{equiv}$, denoted as step S224 in FIG. 35.

At step S31, the control unit 51 may initialize parameters as expressed by Formula 37.

$$N_0 = 10000$$

$$N_1 = 100 \quad \text{[Formula 37]}$$

$N_0$ and $N_1$ may be parameters related to the pulse number of the EUV light 251.

At step S32, the control unit 51 may perform a process that confirms whether the amount of shift of the focal point F at the power $P_i$ has stabilized.

The process that confirms whether the amount of shift of the focal point F has stabilized will be described later with reference to FIG. 37.

At step S33, the control unit 51 may employ Formula 38 to judge whether the pulse number $N_{equiv}$ is less than $N_0$.

$$N_{equiv} < N_0 \quad \text{[Formula 38]}$$

If the pulse number $N_{equiv}$ is less than $N_0$, the control unit 51 may end the present process. Thereafter, the control unit 51 may cause the process to proceed to step S225 of FIG. 35. On the other hand, if the pulse number $N_{equiv}$ is not less than $N_0$, the control unit 51 may cause the process to proceed to step S34.

At step S34, the control unit 51 may set $N_0$ to $2N_0$ as expressed by Formula 39, and cause the process to return to step S32.

$$N_0 = 2N_0 \quad \text{[Formula 39]}$$

Figure 37:
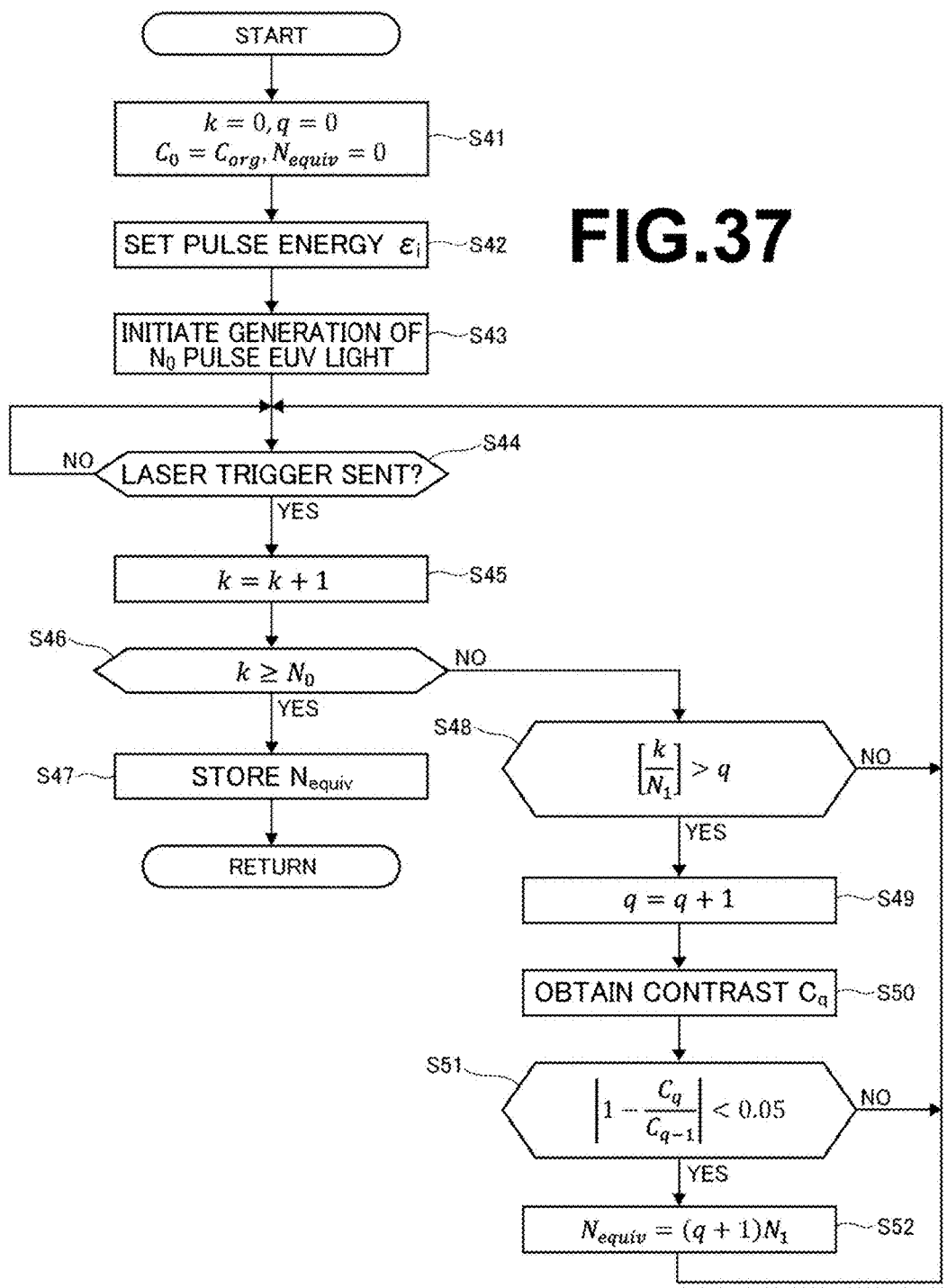
FIG. 37 is a diagram that illustrates a flow chart of a process that confirms whether an amount of shift of a focal point has stabilized, denoted as step S32 in FIG. 36.

FIG. 37 is a diagram that illustrates a flow chart of the process that confirms whether the amount of shift of the focal point F has stabilized, denoted as step S32 in FIG. 36.

At step S41, the control unit 51 may initialize parameters as expressed by Formula 40.

$$k = 0, q = 0$$

$$C_0 = C_{org}, N_{equiv} = 0 \quad \text{[Formula 40]}$$

k and q may be parameters related to the pulse number of the EUV light 251.

$C_0$ maybe a parameter related to the contrast of the image of the droplet 271.

At step S42, the control unit 251 may set the pulse energy $\varepsilon_i$ of the EUV light 251.

At step S43, the control unit 51 may prepare to initiate the generation of the $N_0$ pulse EUV light 251.

At step S44, the control unit 51 may judge whether the laser trigger signal has been sent.

The control unit 51 may be in a standby state until the laser trigger signal is sent. If the laser trigger signal has been sent, the control unit 51 may cause the process to proceed to step S45.

At step S45, the control unit 51 may incrementally increase the parameter k related to the pulse number, as expressed by Formula 41.

$$k=k+1 \quad \text{[Formula 41]}$$

At step S46, the control unit 51 may employ Formula 42 to judge whether the parameter k is greater than or equal to $N_0$.

$$k \geq N_0 \quad \text{[Formula 42]}$$

If the parameter k is not greater than or equal to $N_0$, the control unit 51 may cause the process to proceed to step S48. On the other hand, if the parameter k is greater than or equal to $N_0$, the control unit 51 may cause the process to proceed to step S47.

At step S47, the control unit 51 may store the pulse number $N_{equiv}$. Thereafter, the control unit 51 may cause the process to proceed to step S33 of FIG. 36.

At step S48, the control unit 51 may judge whether the relationship expressed by Formula 43 is established.

$$\left[\frac{k}{N_1}\right] > q \quad \text{[Formula 43]}$$

If the relationship expressed by Formula 43 is not established, the control unit 51 may cause the process to return to step S44. On the other hand, if the relationship expressed by Formula 43 is established, the control unit 51 may cause the process to proceed to step S49.

At step S49, the control unit 51 may incrementally increase the parameter q related to the pulse number, as expressed by Formula 44.

$$q=q+1 \quad \text{[Formula 44]}$$

At step S50, the control unit 51 may obtain an image of the droplet 271 and a contrast $C_q$ thereof.

At step S51, the control unit 51 may judge whether the relationship expressed by Formula 45 is established.

$$\left|1 - \frac{C_q}{C_{q-1}}\right| < 0.05 \quad \text{[Formula 45]}$$

If the relationship expressed by Formula 45 is not satisfied, the control unit 51 may cause the process to return to step S44. On the other hand, if the relationship expressed by Formula 45 is satisfied, the control unit 51 may cause the process to proceed to step S52.

At step S52, the control unit may set $(q+1)N_1$ as the pulse number $N_{equiv}$, and cause the process to return to step S44.

$$N_{equiv}=(q+1)N_1 \quad \text{[Formula 46]}$$

The control unit 51 may confirm whether the EUV light generating apparatus 1 is in a state of thermal equilibrium and the amount of shift of the focal point F has stabilized, by judging whether the amount of variation of the contrast $C_q$ of the image of the droplet 271 is less than 5%, in this manner.

If the amount of variation of the contrast $C_q$ is not less than 5%, the control unit 51 may cause the EUV light 251 to continue to be generated until the variation of the contrast $C_q$ becomes less than 5%. Then, if the amount of variation of the contrast $C_q$ becomes less than 5%, the control unit 51 may judge that the amount of shift of the focal point F has stabilized, and store the pulse number at that time as $N_{equiv}$.

Figure 38:
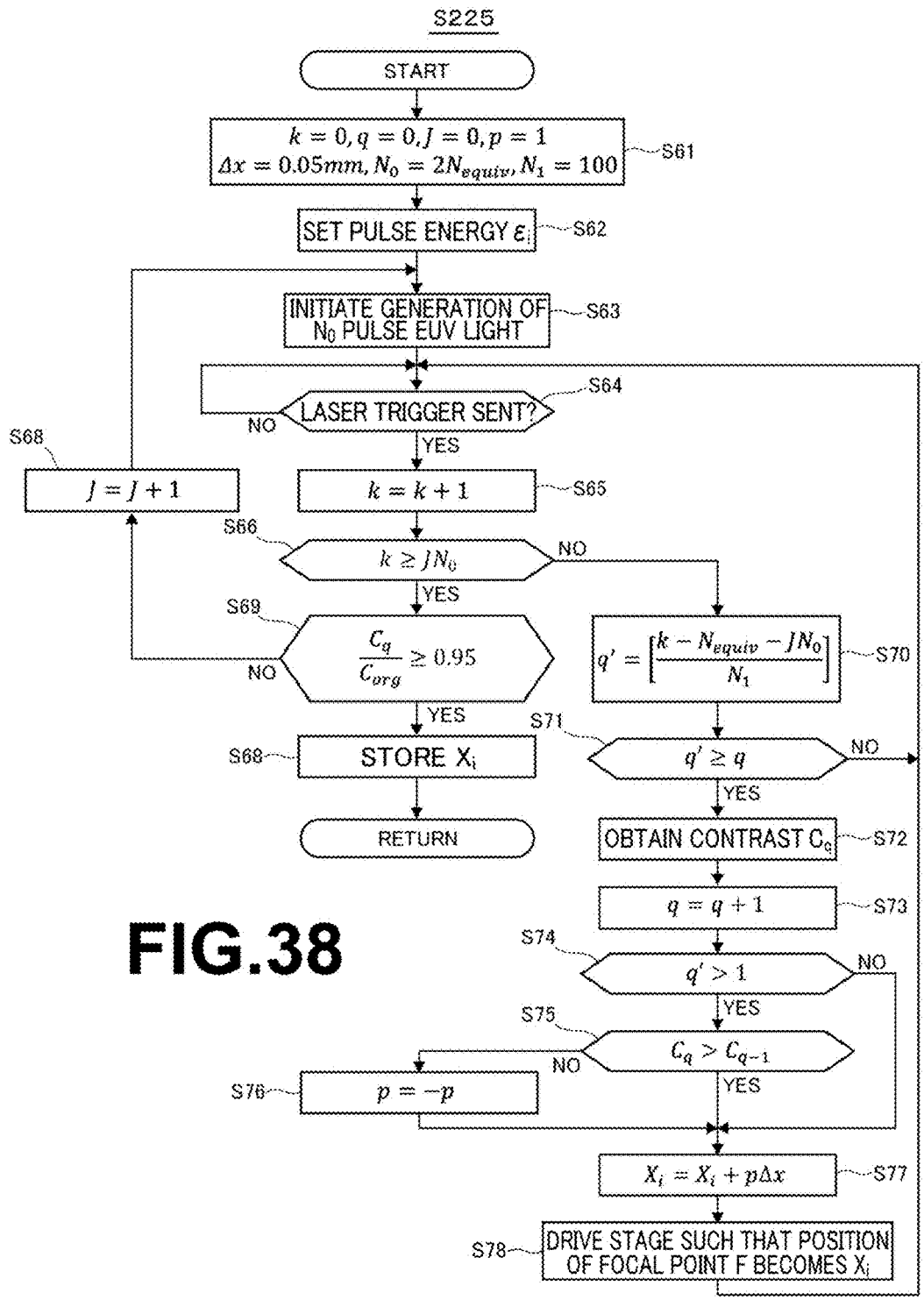
FIG. 38 is a diagram that illustrates a flow chart of a process that obtains contrast to measure a position $X_i$, denoted as step S225 in FIG. 35.

FIG. 38 is a diagram that illustrates a flow chart of the process that obtains contrast to measure the position $X_i$, denoted as step S22 in FIG. 35.

At step S61, the control unit 51 may initialize parameters as expressed by Formula 47.

$$k=0, q=0, J=0, p=1$$

$$\Delta x=0.05 \text{ mm}, N_0=2N_{equiv}, N_1=100 \quad \text{[Formula 47]}$$

J may be a parameter related to the pulse number of the EUV light 251.

p may be a parameter relate to a driving direction of the stage 483.

At steps S62 through S65, the control unit 51 may perform processes similar to those of steps S42 through S45 of FIG. 37.

At step S66, the control unit 51 may employ Formula 48 to judge whether the parameter k is greater than or equal to $JN_0$.

$$k \geq JN_0 \quad \text{[Formula 48]}$$

If the parameter k is not greater than or equal to $JN_0$, the control unit 51 may cause the process to proceed to step S70. On the other hand, if the parameter k is greater than or equal to $JN_0$, the control unit 51 may cause the process to proceed to step S67.

At step S67, the control unit 51 may judge whether the relationship expressed by Formula 49 is established.

$$\frac{C_q}{C_{org}} \geq 0.95 \quad \text{[Formula 49]}$$

If the relationship expressed by Formula 49 is not established, the control unit 51 may cause the process to proceed to step S68. On the other hand, if the relationship expressed by Formula 49 is established, the control unit 51 may cause the process to proceed to step S69.

At step S68, the control unit 51 may incrementally increase the parameter J related to the pulse number as expressed by Formula 50, and cause the process to return to step S63.

$$J=J+1 \quad \text{[Formula 50]}$$

At step S69, the control unit 51 may store the position $X_i$ of the focal point F. Thereafter, the control unit 51 may cause the process to proceed to step S226 of FIG. 35.

At step S70, the control unit 51 may employ Formula 51 to calculate a parameter q' related to the pulse number.

$$q' = \left[\frac{k - N_{equiv} - Jn_0}{N_1}\right] \quad \text{[Formula 51]}$$

At step S71, the control unit 51 may employ Formula 52 to judge whether the parameter q' is greater than or equal to the parameter q.

$$q' \geq q \quad \text{[Formula 52]}$$

If the parameter q' is not greater than or equal to the parameter q, the control unit 51 may cause the process to return to step S64. On the other hand, if the parameter q' is greater than or equal to the parameter q, the control unit 51 may cause the process to proceed to step S72.

At step S72, the control unit 51 may obtain an image of the droplet 271 and the contrast $C_q$ thereof.

At step S73, the control unit 51 may perform a process similar to that of step S49 of FIG. 37.

At step S74, the control unit 51 may employ Formula 53 to judge whether the parameter q' is greater than 1.

$$q'>1 \qquad \text{[Formula 53]}$$

If the parameter q' is not greater than 1, the control unit 51 may cause the process to proceed to step S77. On the other hand, if the parameter q' is greater than 1, the control unit 51 may cause the process to proceed to step S75.

At step S75, the control unit 51 may employ Formula 54 to judge whether the contrast $C_q$ is greater than a contrast $C_{q-1}$.

$$C_q > C_{q-1} \qquad \text{[Formula 54]}$$

If the contrast $C_q$ is greater than the contrast $C_{q-1}$, the control unit 51 may cause the process to proceed to step S77. On the other hand, if the contrast $C_q$ is not greater than the contrast $C_{q-1}$, the control unit 51 may cause the process to proceed to step S76.

At step S76, the control unit 51 may set the parameter p to −p, such that the driving direction of the stage 483 will be reversed, as expressed by Formula 55.

$$p = -p \qquad \text{[Formula 55]}$$

At step S77, the control unit 51 may set the position $X_i$ such that the position $X_i$ of the focal point F moves for $p\Delta x$, as expressed by Formula 56.

$$X_i = X_i + p\Delta x \qquad \text{[Formula 56]}$$

At step S78, the control unit 51 may drive the stage 483 such that the position of the focal point F becomes $X_i$, and cause the process to return to step S64.

The control unit 51 may cause the EUV light 251 to continue to be generated until the EUV light generating apparatus 1 reaches a state of thermal equilibrium, and obtain the contrast Cq of the image of the droplet 271 when the state of thermal equilibrium is reached, in this manner. Then, the control unit 51 may measure the position $X_i$ of the focal point F in a state in which the amount of shift is stabilized by specifying the position $X_i$ at which the contrast Cq is maximal. Next, the control unit 51 may store the measured position $X_i$, under a condition that the contrast $C_q$ is 95% or greater of the contrast $C_{org}$, which is obtained in a state prior to the generation of the EUV light 251 being performed. If the contrast $C_q$ is not 95% or greater of the contrast $C_{org}$, the control unit 51 may cause the EUV light 251 to be generated again, and measure the position $X_i$ again.

Figure 39:
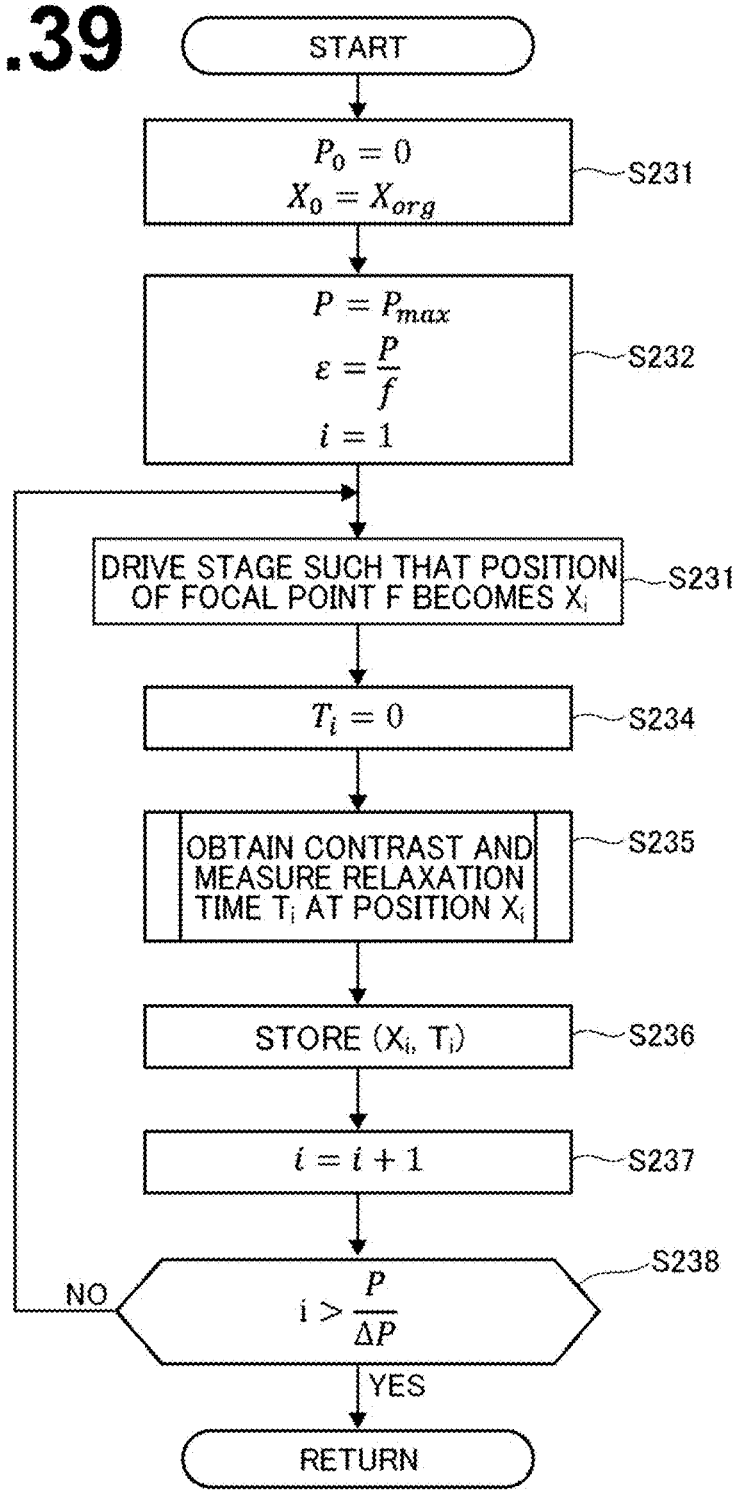
FIG. 39 is a diagram that illustrates a flow chart of a process that measures a relaxation time $T_i$, denoted as step S23 in FIG. 33.

FIG. 39 is a diagram that illustrates a flow chart of the process that measures the relaxation time $T_i$, denoted as step S23 in FIG. 33.

At step S231, the control unit 51 may perform a process similar to that of step S221 of FIG. 35.

At step S232, the control unit 51 may initialize parameters as expressed by Formula 57.

$$P = P_{max}$$
$$\varepsilon = \frac{P}{f}$$
$$i = 1 \qquad \text{[Formula 57]}$$

P may be a parameter related to the power $P_i$ of the EUV light 251.

ε may be a parameter related to the pulse energy of the EUV light 251.

At step S233, the control unit 51 may drive the stage such that the position of the focal point F becomes $X_i$.

At step S234, the control unit 51 may set the relaxation time $T_i$ to zero, as expressed by Formula 58.

$$T_i = 0 \qquad \text{[Formula 58]}$$

At step S235, the control unit 51 may obtain an image of the droplet 271 and a contrast thereof, and perform a process that measures the relaxation time $T_i$ at the position $X_i$ of the focal point F.

A process that obtains the contrast and measures the relaxation time $T_i$ at the position $X_i$ will be described later with reference to FIG. 40.

At step S236, the control unit 51 may correlate the measured relaxation time $T_i$ with the position $X_i$, and store the correlated relaxation time $T_i$.

At step S237, the control unit 51 may perform a process similar to that of step S227 illustrated in FIG. 35.

At step S238, the control unit 51 may judge whether the relationship expressed by Formula 59 is established.

$$i > \frac{P}{\Delta P} \qquad \text{[Formula 59]}$$

If the relationship expressed by Formula 59 is not established, the control unit 51 may cause the process to return to step S233. On the other hand, if the relationship expressed by Formula 59 is established, the control unit 51 may end the present process.

Thereafter, the control unit 51 may cause the process to proceed to step S24 of FIG. 33.

Figure 40:
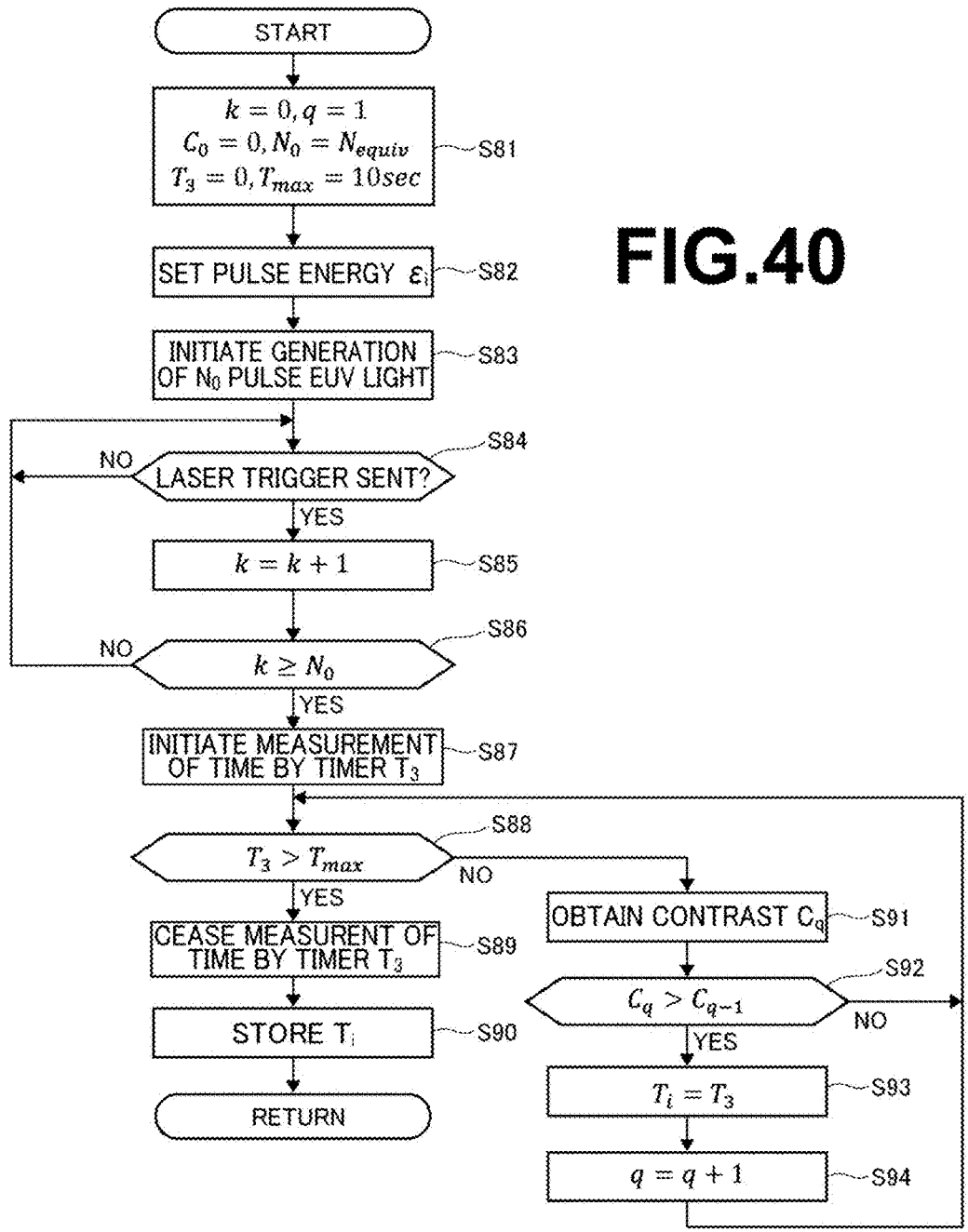
FIG. 40 is a diagram that illustrates a flow chart of a process that obtains a contrast and measures a relaxation time $T_i$ at a position $X_i$, denoted as step S235 in FIG. 39.

FIG. 40 is a diagram that illustrates a flow chart of a process that obtains the contrast and measures the relaxation time $T_i$ at the position $X_i$, denoted as step S235 in FIG. 39.

At step S81, the control unit 51 may initialize parameters as expressed by Formula 60.

$$k = 0, q = 1$$
$$C_0 = 0, N_0 = N_{equiv}$$
$$T_3 = 0, T_{max} = 10 \text{ sec} \qquad \text{[Formula 60]}$$

$T_3$ may be a timer for measuring the relaxation time $T_i$.
$T_{max}$ may be a parameter related to the relaxation time $T_i$.
$T_{max}$ may be a minimum amount of time required to measure the relaxation time $T_i$.

At steps S82 through S85, the control unit 51 may perform processes similar to those of steps S42 through S45 of FIG. 37.

At step S86, the control unit 51 may perform a process similar to that of step S46 of FIG. 37.

However, if the parameter k is not greater than or equal to $N_0$, the control unit 51 may cause the process to return to step S84. On the other hand, if the parameter k is greater than or equal to $N_0$, the control unit 51 may cause the process to proceed to step S87.

At step S87, the control unit 51 may cause the timer $T_3$ to initiate the measurement of time.

At step S88, the control unit 51 may judge whether the value of the timer $T_3$ is greater than $T_{max}$ by employing Formula 61.

$$T_3 > T_{max} \qquad \text{[Formula 61]}$$

If the value of the timer $T_3$ is not greater than $T_{max}$, the control unit 51 may cause the process to proceed to step S91. On the other hand, if the value of the timer $T_3$ is greater than $T_{max}$, the control unit 51 may cause the process to proceed to step S89.

At step S89, the control unit 51 may cause the timer $T_3$ to cease the measurement of time.

At step S90, the control unit 51 may store the relaxation time $T_i$.

Thereafter, the control unit 51 may cause the process to proceed to step S236 of FIG. 39.

At step S91, the control unit 51 may obtain an image of the droplet 271 and the contrast $C_q$ thereof.

At step S92, the control unit 51 may perform a process similar to that of step S75 of FIG. 38.

However, if the contrast $C_q$ is not greater than the contrast $C_{q-1}$, the control unit 51 may cause the process to return to step S88. On the other hand, if the contrast $C_q$ is greater than the contrast $C_{q-1}$, the control unit 51 may cause the process to proceed to step S93.

At step S93, the control unit 51 may set the value of the timer $T_3$ to the relaxation time $T_i$, as expressed by Formula 62.

$$T_i = T_3 \qquad \text{[Formula 62]}$$

At step S94, the control unit 51 may perform a process similar to that of step S49 of FIG. 37, and then cause the process to return to step S88.

The control unit 51 may obtain the contrast $C_q$ of the image of the droplet 271 while measuring the amount of elapsed time after the amount of shift of the focal point F stabilizes, in this manner. Then, the control unit 51 may measure the relaxation time $T_i$ by specifying the amount of elapsed time at which the contrast $C_q$ becomes maximal. Next, the control unit 51 may store the measured relaxation time $T_i$, under a condition that the minimum amount of time necessary to measure the relaxation time $T_i$ is secured.

Figure 41:
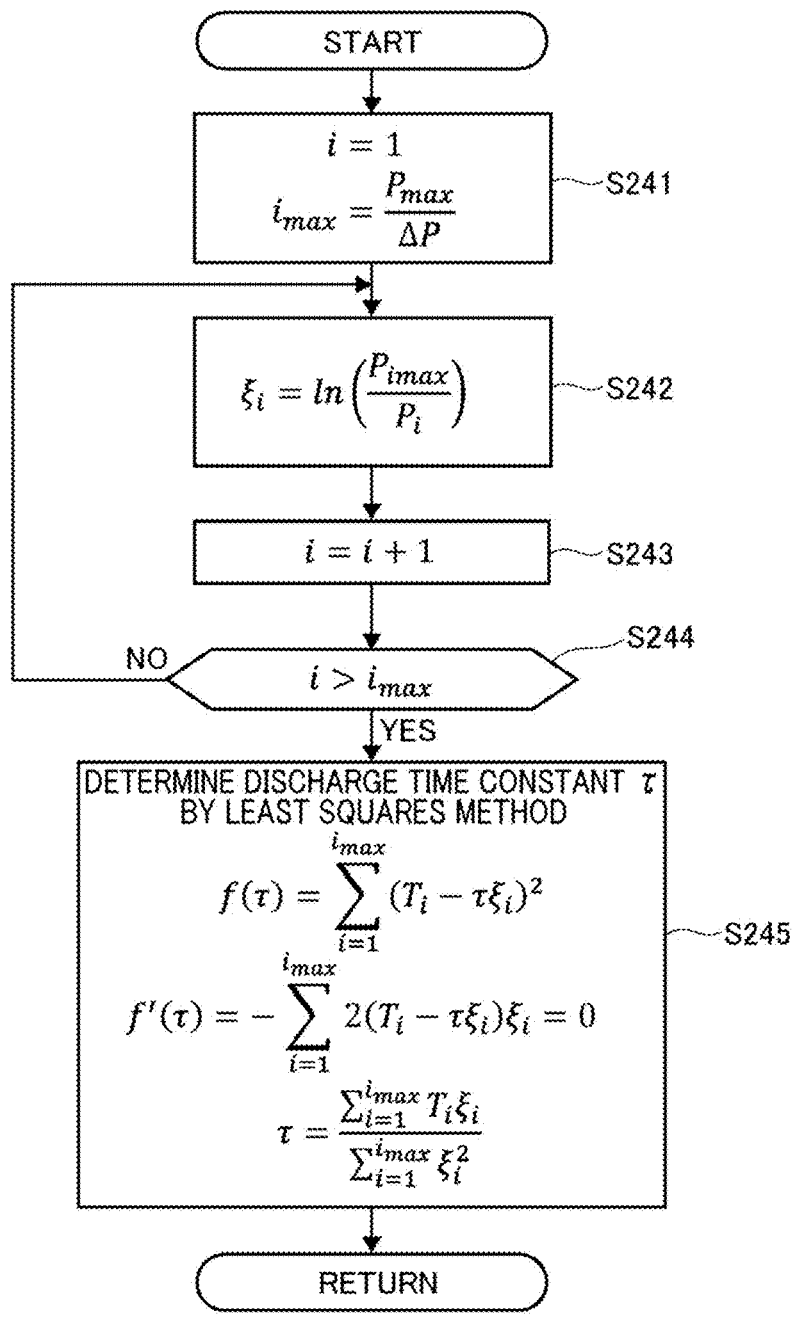
FIG. 41 is a diagram that illustrates a flow chart of a process that obtains the discharge time constant $\tau$, denoted as step S24 in FIG. 33.

FIG. 41 is a diagram that illustrates a flow chart of the process that obtains the discharge time constant $\tau$, denoted as step S24 in FIG. 33.

At step S241, the control unit 51 may initialize parameters as expressed by Formula 63.

$$i = 1 \qquad \text{[Formula 63]}$$
$$i_{max} = \frac{P_{max}}{\Delta P}$$

At step S242, the control unit 51 may perform calculation using Formula 64.

$$\xi_i = \ln\left(\frac{P_{imax}}{P_i}\right) \qquad \text{[Formula 64]}$$

At step S243, the control unit 51 may perform a process similar to that of step S227 of FIG. 35.

At step S244, the control unit 51 may employ Formula 65 to judge whether the parameter i is greater than $i_{max}$.

$$i > i_{max} \qquad \text{[Formula 65]}$$

If the parameter i is not greater than $i_{max}$, the control unit 51 may cause the process to return to step S242. On the other hand, if the parameter i is greater than $i_{max}$, the control unit 51 may cause the process to proceed to step S245.

At step S245, the control unit 51 may determine the discharge time constant $\tau$ by the least squares method as expressed by Formula 66, and then store the determined discharge time constant $\tau$.

$$f(\tau) = \sum_{i=1}^{i_{max}} (T_i - \tau \xi_i)^2 \qquad \text{[Formula 66]}$$

$$f'(\tau) = -\sum_{i=1}^{i_{max}} 2(T_i - \tau \xi_i)\xi_i = 0$$

$$\tau = \frac{\sum_{i=1}^{i_{max}} T_i \xi_i}{\sum_{i=1}^{i_{max}} \xi_i^2}$$

The control unit 51 may determine the discharge time constant $\tau$ from the power $P_i$ of the EUV light 251 and the relaxation time $T_i$ by employing the least squares method, and store the determined discharge time constant $\tau$, in this manner.

Note that the control unit 51 may determine the discharge time constant $\tau$ by employing a statistical technique different from the least squares method.

8. Fourth Embodiment

Next, an EUV light generating apparatus according to a fourth embodiment will be described with reference to FIG. 42. Descriptions of structures and operations of the EUV light generating apparatus of the fourth embodiment which are the same as those of the EUV light generating apparatus 1 of the first embodiment will be omitted. This point also applies to the descriptions of the fifth through ninth embodiments to follow below.

[8.1 Configuration]

Figure 42:
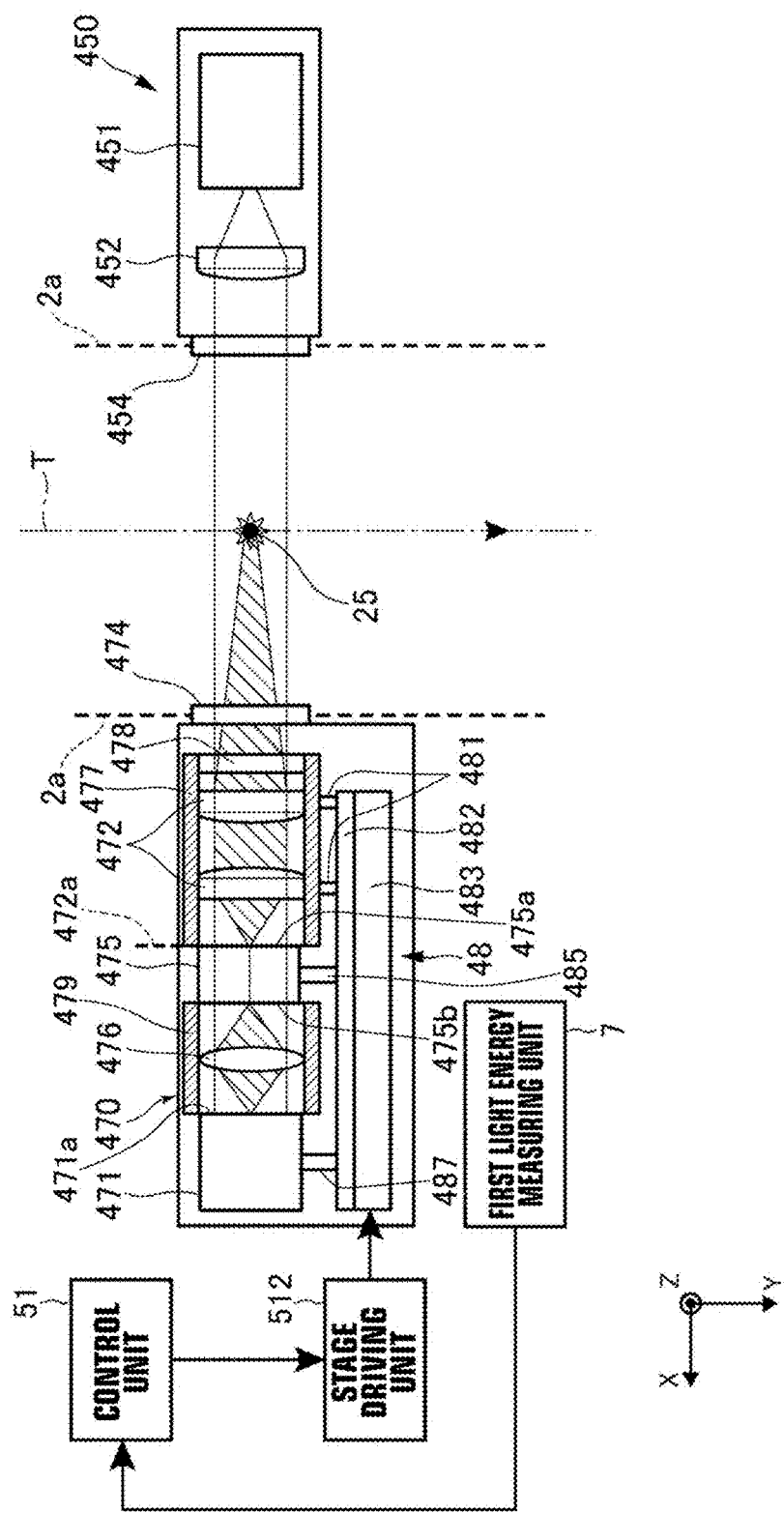
FIG. 42 is a diagram for explaining the configurations of the main parts of an EUV light generating apparatus according to a fourth embodiment.

The EUV light generating apparatus of the fourth embodiment, of which the main components are illustrated in FIG. 42, may basically differ from the EUV light generating apparatus 1 of the first embodiment illustrated in FIG. 11 in the points that the image forming optical system 472 is held by a combination lens barrel 477 and that the transfer optical system 476 is held by a lens holder 479. The combination lens barrel 477 may be fixed to the plate 482 via two leg portions 484. In addition, the optical shutter 475 may be fixed to the plate 482 via a leg portion 485, and the image sensor 471 which is an imaging element may be fixed to the plate 482 via a leg portion 487. Similarly to the configuration of FIG. 11, the plate 482 is moved by the stage 483. Meanwhile, the lens holder 479 is not fixed to the plate 482, but may be fixed to the optical shutter 475. One relay lens, for example, that constitutes the transfer optical system 476, may be held within the lens holder 479 such that it is movable in the direction of the optical axis, and may be applied for focus adjustment.

Focus adjustment in this case is focus adjustment for forming an image, which is reproduced and output on the reproduction surface 475b of the optical shutter 475, on the imaging surface 471a of the image sensor 471. The image sensor 471 may be in a state without degrees of rotational freedom about the optical axis with respect to the lens holder 479, by being fixed to the plate 482 via the leg portion 487. Note that the image forming optical system 472 constitutes the first image forming optical system of the present disclosure, and the transfer optical system 476 constitutes the second image forming optical system of the present disclosure.

Note that the combination lens barrel 477 may be fixed to the plate 482 via one leg portion 484.

[8.2 Operation]

In the fourth embodiment as well, control for capturing an image of the droplet 271 which is present in the plasma generating region 25 (refer to FIG. 2) with the image sensor 471 in a correctly focused state may be exerted in the same manner as in the EUV light generating apparatus 1 of the first embodiment. That is, for example, the EUV energy measurement signal output by the first light energy measuring unit 7 may be sent to the control unit 51, and the control unit 51 may control the operation of the stage driving unit 512 based on the EUV energy measurement signal. Thereby, the image forming optical system 472 held by the combination lens barrel 477, the optical shutter 475, the transfer optical system 476, and the image sensor 471 may be moved as a whole in the direction of the optical axis of the image forming optical system 472 by the stage 483, to be in a state in which the position of the light receiving surface 475a of the optical shutter 475 matches that of the image forming plane 472a of the image forming optical system 472. As a result, the image of the droplet 271 in focus may be detected by the optical shutter 475 as a first image, and the same first image may be reproduced and output at the reproduction surface 475b of the optical shutter 475. The output first image may be formed as a second image on the imaging surface 471a of the image sensor 471 as a second image. Thereby, the image of the droplet 271 in focus may ultimately be captured by the image sensor 471.

[8.3 Operative Effects]

According to the EUV light generating apparatus of the fourth embodiment, basically the same operative effects as those of the EUV light generating apparatus 1 of the first embodiment may be obtained. In addition, according to the EUV light generating apparatus of the fourth embodiment, light which is harmful in relation to the image sensor 471 capturing the image of the droplet 271 may be cut off by an optical filter 478. Light which is output from the illuminating unit 410 of the droplet detector 41 illustrated in FIG. 2 may be listed as an example of such harmful light, but the harmful light is not limited thereto. Note that the optical filter 478 may be a bandpass filter, a notch filter, a light attenuating filter, etc., but is not limited to these types of filters. In addition, the optical filter 478 may be directly mounted on the combination lens barrel 477 as illustrated in FIG. 42, or may be mounted on the combination lens barrel 477 in a state in which it is housed in a dedicated optical filter holder.

9. Fifth Embodiment

Next, an EUV light generating apparatus according to a fifth embodiment will be described with reference to FIG. 43.

[9.1 Configuration]

Figure 43:
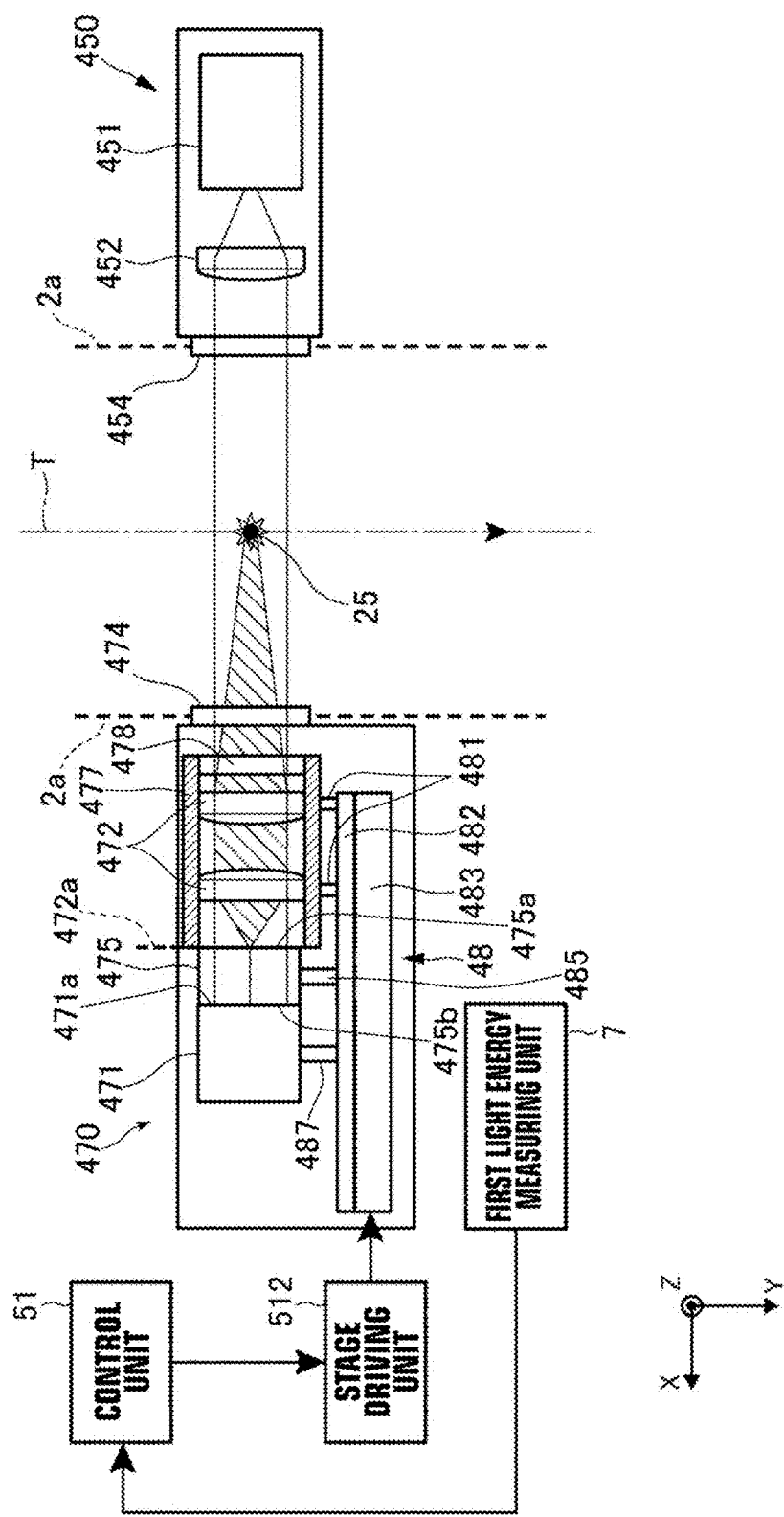
FIG. 43 is a diagram for explaining the configurations of the main parts of an EUV light generating apparatus according to a fifth embodiment.

The EUV light generating apparatus of the fifth embodiment, of which the main components are illustrated in FIG. 43, may basically differ from the EUV light generating apparatus of the fourth embodiment illustrated in FIG. 42 in the point that the transfer optical system 476 is omitted. That is, the image sensor 471 may be arranged in a state in which the imaging surface 471a thereof is in close contact with the reproduction surface 475b of the optical shutter 475.

[9.2 Operation]

In the EUV light generating apparatus of the fifth embodiment as well, control for capturing an image of the droplet 271 which is present in the plasma generating region 25 (refer to FIG. 2) with the image sensor 471 in a correctly focused state may be exerted in the same manner as in the EUV light generating apparatus of the fourth embodiment. That is, for example, the EUV energy measurement signal output by the first light energy measuring unit 7 may be sent to the control unit 51, and the control unit 51 may control the operation of the stage driving unit 512 based on the EUV energy measurement signal. Thereby, the image forming optical system 472 held by the combination lens barrel 477, the optical shutter 475, and the image sensor 471 may be moved as a whole in the direction of the optical axis of the image forming optical system 472 by the stage 483, to be in a state in which the position of the light receiving surface 475a of the optical shutter 475 matches that of the image forming plane 472a of the image forming optical system 472. As a result, the image of the droplet 271 in focus may be detected by the optical shutter 475, the same image may be reproduced and output at the reproduction surface 475b of the optical shutter 475, and the output image may be captured by the imaging surface 471a of the image sensor 471. Thereby, the image of the droplet 271 in focus may ultimately be captured by the image sensor 471.

[9.3 Operative Effects]

According to the EUV light generating apparatus of the fifth embodiment, basically the same operative effects as those of the EUV light generating apparatus of the fourth embodiment may be obtained. In addition, because the transfer optical system 476 is omitted, the weight of the elements to be moved by the stage 483 is reduced. As a result, it becomes possible for control exerted by the control unit 51 to be executed at a higher speed.

10. Sixth Embodiment

Next, an EUV light generating apparatus according to a sixth embodiment will be described with reference to FIG. 44.

[10.1 Configuration]

Figure 44:
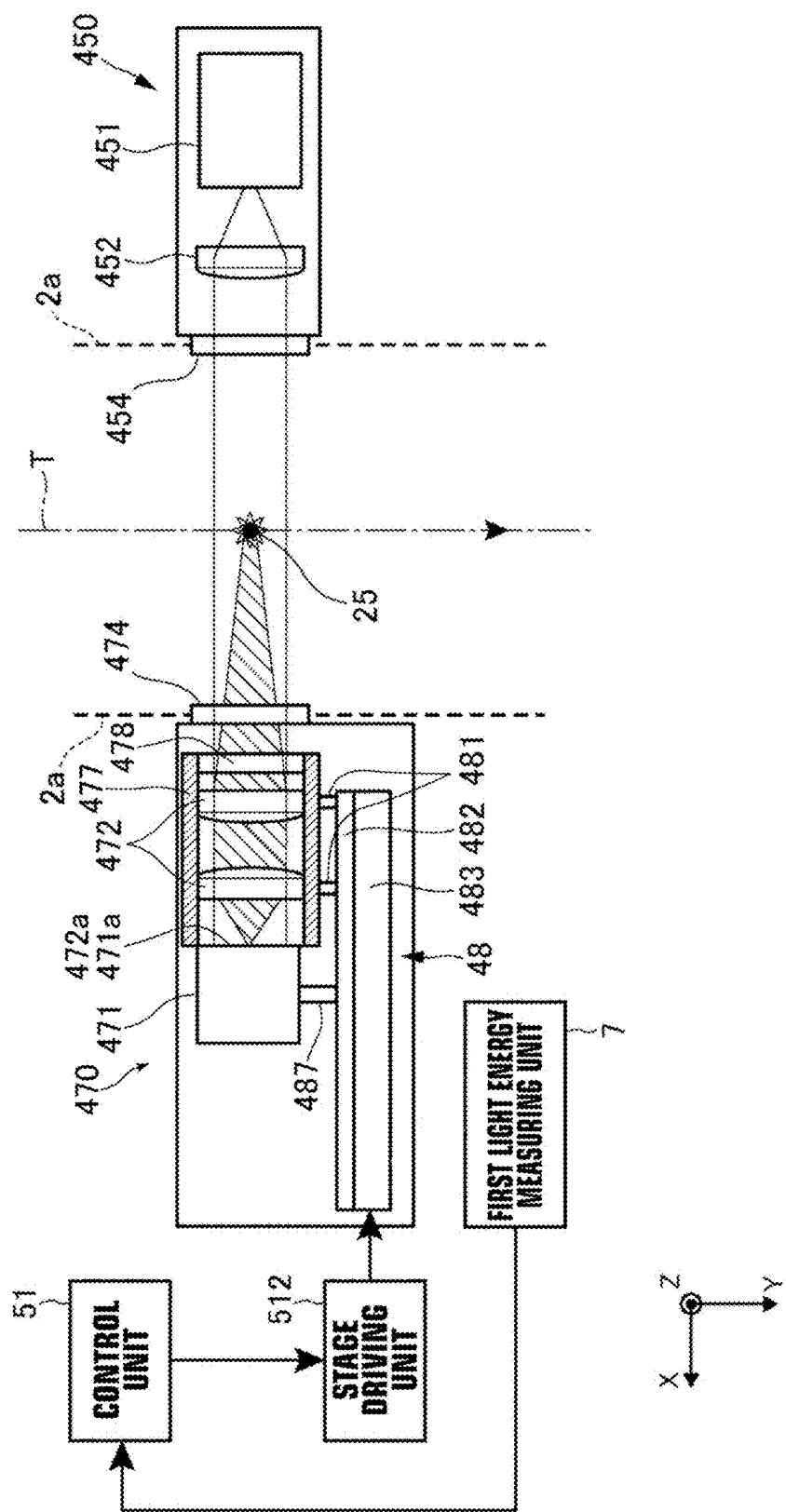
FIG. 44 is a diagram for explaining the configurations of the main parts of an EUV light generating apparatus according to a sixth embodiment.

The EUV light generating apparatus of the sixth embodiment, of which the main components are illustrated in FIG. 44, may basically differ from the EUV light generating apparatus of the fourth embodiment illustrated in FIG. 42 in the point that the optical shutter 475 and the transfer optical system 476 are omitted. That is, the image sensor 471 may be held integrally with the combination lens barrel 477 that holds the image forming optical system 472.

[10.2 Operation]

In the EUV light generating apparatus of the sixth embodiment as well, control for capturing an image of the droplet 271 which is present in the plasma generating region 25 (refer to FIG. 2) with the image sensor 471 in a correctly focused state may be exerted in the same manner as in the EUV light generating apparatus of the fourth embodiment. That is, for example, the EUV energy measurement signal output by the first light energy measuring unit 7 may be sent to the control unit 51, and the control unit 51 may control the operation of the stage driving unit 512 based on the EUV energy measurement signal. Thereby, the image forming optical system 472 held by the combination lens barrel 477 and the image sensor 471 may be moved as a whole in the direction of the optical axis of the image forming optical system 472 by the stage 483, to be in a state in which the position of the imaging surface 471a of the image sensor 471 matches that of the image forming plane 472a of the image forming optical system 472. As a result, the image of the droplet 271 in focus may be formed on the imaging surface 471a of the image sensor 471, and may be captured by the image sensor 471.

[10.3 Operative Effects]

According to the EUV light generating apparatus of the sixth embodiment, basically the same operative effects as those of the EUV light generating apparatus of the fourth embodiment may be obtained. In addition, because the optical shutter 475 and the transfer optical system 476 are omitted, the weight of the elements to be moved by the stage 483 is reduced. As a result, it becomes possible for control exerted by the control unit 51 to be executed at a higher speed.

Note that, when moving the image forming optical system 472 in the direction of the optical axis under control by the control unit 51, only a portion of the plurality of lenses that constitute the image forming optical system 472 may be moved, as opposed to moving the entirety of the image forming optical stem 472. In this case, a lens for focusing may be arranged between the lens positioned most toward the side of the plasma generating region 25 and the lens positioned most toward the side of the image sensor 471 in the image forming optical system 472, and only the lens for focusing may be moved. In addition, focusing may be performed by moving the image sensor 471 in the direction of the optical axis of the image forming optical system 472 instead of or in addition to moving the entirety or a portion of the image forming optical system 472. The above points also apply to the other embodiments as well.

11. Seventh Embodiment

Next an EUV light generating apparatus according to a seventh embodiment will be described with reference to FIG. 45.

[11.1 Configuration]

Figure 45:
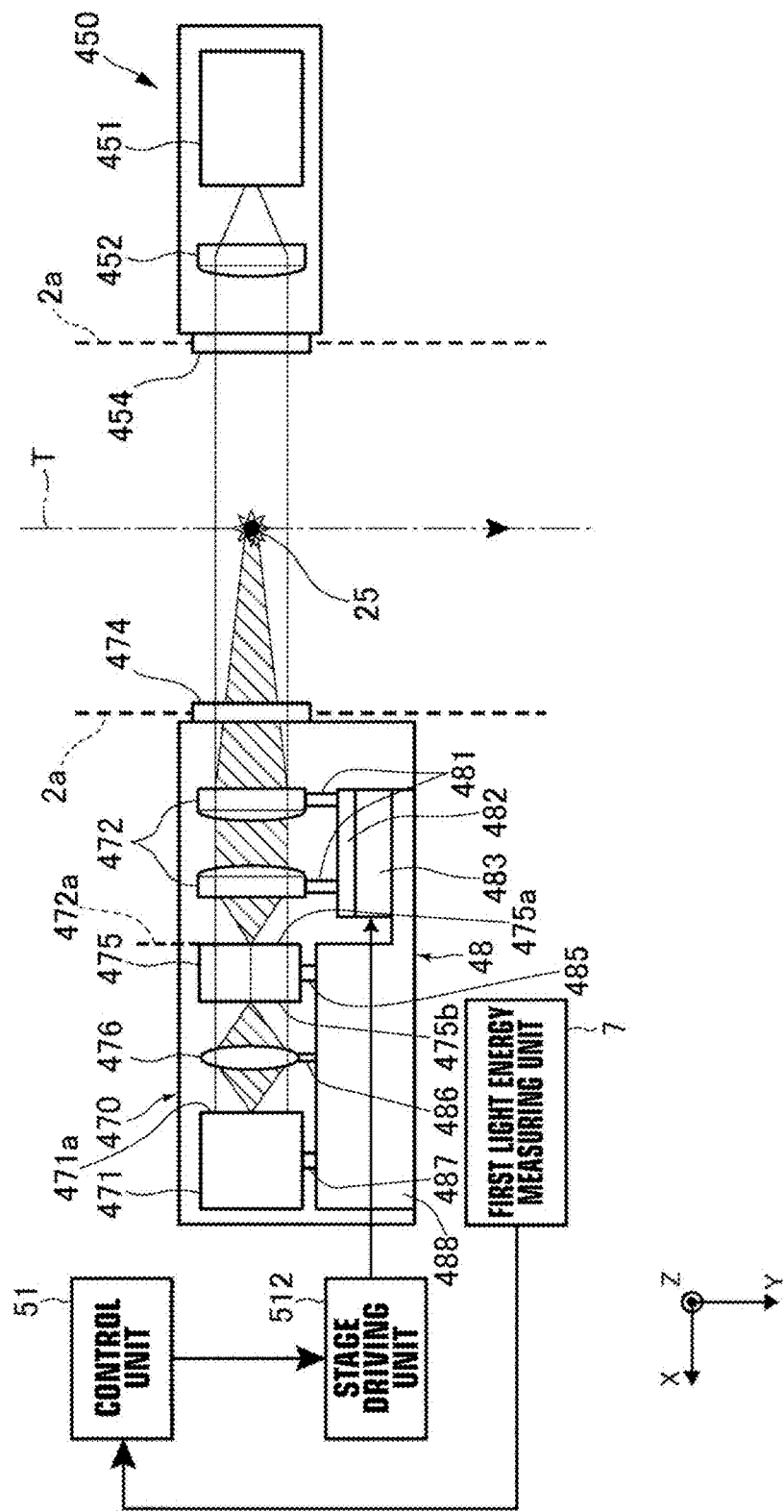
FIG. 45 is a diagram for explaining the configurations of the main parts of an EUV light generating apparatus according to a seventh embodiment.

The EUV light generating apparatus of the seventh embodiment, of which the main components are illustrated in FIG. 45, may basically differ from the EUV light generating apparatus 1 of the first embodiment illustrated in FIG. 11 in the point that only the image forming optical system 472 is fixed on the plate 482. That is, optical shutter 475, the transfer optical system 476, and the image sensor 471 may be fixed to a bracket 488 which is separate from the plate 482. Note that the leg portions 484 that fix the image forming optical system 472 to the plate 482 may be similar to the holder 481 illustrated in FIG. 11. In addition, the leg portion 485, a leg portion 486, and the leg portion 487 that respectively fix the optical shutter 475, the transfer optical system 476, and the image sensor 471 to the bracket 488 may be similar to the holder 481. Note that the image forming optical system 472 constitutes the first image forming optical system of the present disclosure, and the transfer optical system 476 constitutes the second image forming optical system of the present disclosure.

[11.2 Operation]

In the seventh embodiment as well, control for capturing an image of the droplet 271 which is present in the plasma generating region 25 (refer to FIG. 2) with the image sensor 471 in a correctly focused state may be exerted in the same manner as in the EUV light generating apparatus 1 of the first embodiment. That is, for example, the EUV energy measurement signal output by the first light energy measuring unit 7 may be sent to the control unit 51, and the control unit 51 may control the operation of the stage driving unit 512 based on the EUV energy measurement signal. Thereby, the image forming optical system 472 may be moved as a whole in the direction of the optical axis of the image forming optical system 472 by the stage 483, to be in a state in which the position of the image forming plane 472a of the image forming optical system 472 matches that of the light receiving surface 475a of the optical shutter 475. As a result, the image of the droplet 271 in focus may be detected by the optical shutter 475 as a first image, and the same first image may be reproduced and output at the reproduction surface 475b of the optical shutter 475. The output first image may be formed as a second image on the imaging surface 471a of the image sensor 471 as a second image. Thereby, the image of the droplet 271 in focus may ultimately be captured by the image sensor 471.

[11.3 Operative Effects]

According to the EUV light generating apparatus of the seventh embodiment, basically the same operative effects as those of the EUV light generating apparatus 1 of the first embodiment may be obtained. In addition, only the image forming optical system 472 is moved by the stage 483 in the seventh embodiment. Therefore, it becomes possible for control exerted by the control unit 51 to be executed at a higher speed compared to the first embodiment.

12. Eighth Embodiment

An EUV light generating apparatus according to an eighth embodiment will be described with reference to FIG. 46.

[12.1 Configuration]

Figure 46:
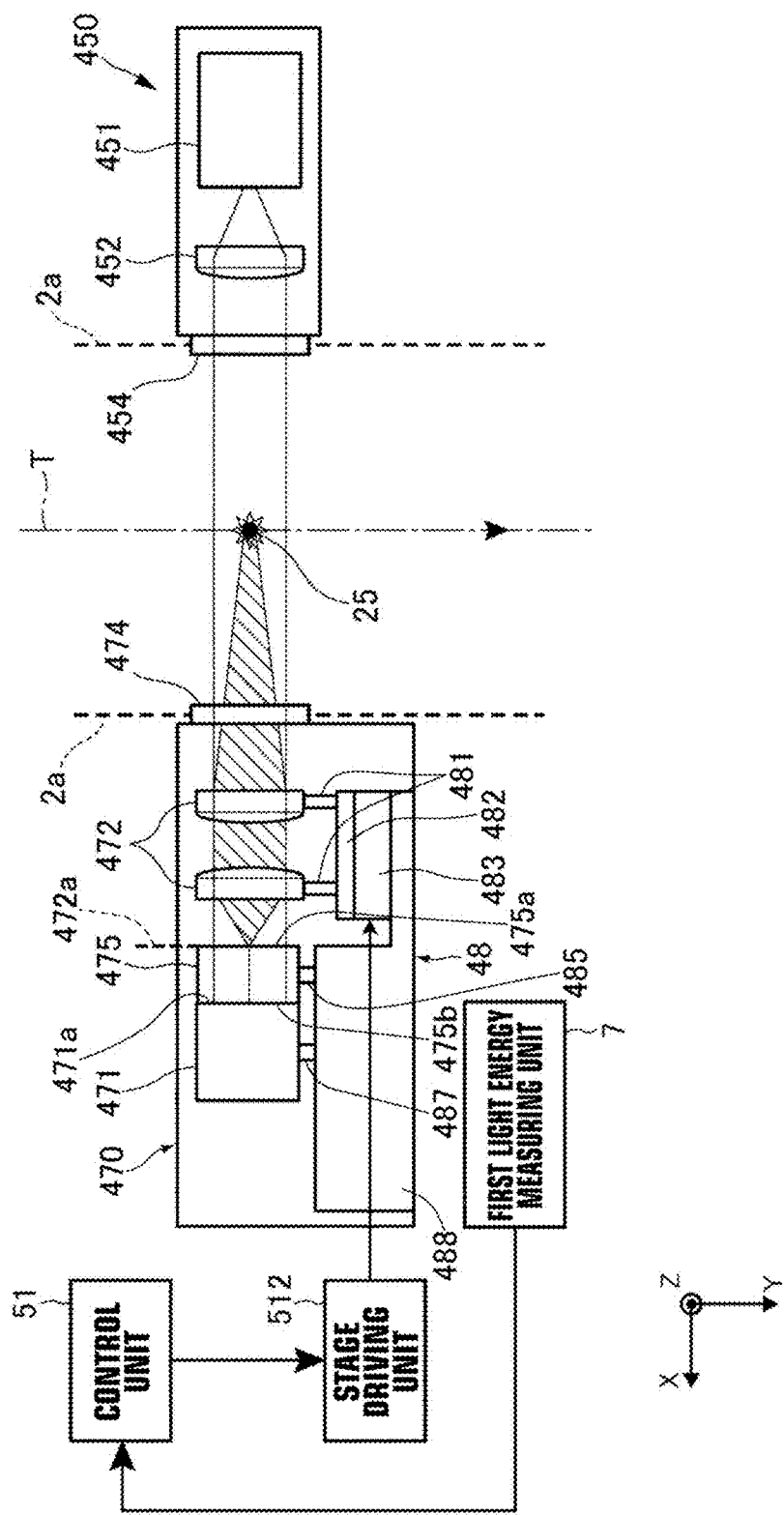
FIG. 46 is a diagram for explaining the configurations of the main parts of an EUV light generating apparatus according to an eighth embodiment.

The EUV light generating apparatus of the eighth embodiment, of which the main components are illustrated in FIG. 46, may basically differ from the EUV light generating apparatus of the seventh embodiment illustrated in FIG. 45 in the point that the transfer optical system 476 is omitted. That is, the image sensor 471 may be arranged in a state in which the imaging surface 471a thereof is in close contact with the reproduction surface 475b of the optical shutter 475.

[12.2 Operation]

In the EUV light generating apparatus of the eighth embodiment as well, control for capturing an image of the droplet 271 which is present in the plasma generating region 25 (refer to FIG. 2) with the image sensor 471 in a correctly focused state may be exerted in the same manner as in the EUV light generating apparatus of the seventh embodiment. That is, for example, the EUV energy measurement signal output by the first light energy measuring unit 7 may be sent to the control unit 51, and the control unit 51 may control the operation of the stage driving unit 512 based on the EUV energy measurement signal. Thereby, the image forming optical system 472 may be moved in the direction of the optical axis by the stage 483, to be in a state in which the position of the image forming plane 472a of the image forming optical system 472 matches that of the light receiving surface 475a of the optical shutter 475. As a result, the image of the droplet 271 in focus may be detected by the optical shutter 475, the same image may be reproduced and output at the reproduction surface 475b of the optical shutter 475, and the output image may be captured by the imaging surface 471a of the image sensor 471. Thereby, the image of the droplet 271 in focus may ultimately be captured by the image sensor 471.

[12.3 Operative Effects]

According to the EUV light generating apparatus of the eighth embodiment, basically the same operative effects as those of the EUV light generating apparatus of the seventh embodiment may be obtained.

13. Ninth Embodiment

Next, an EUV light generating apparatus according to a ninth embodiment will be described with reference to FIG. 47.

[13.1 Configuration]

Figure 47:
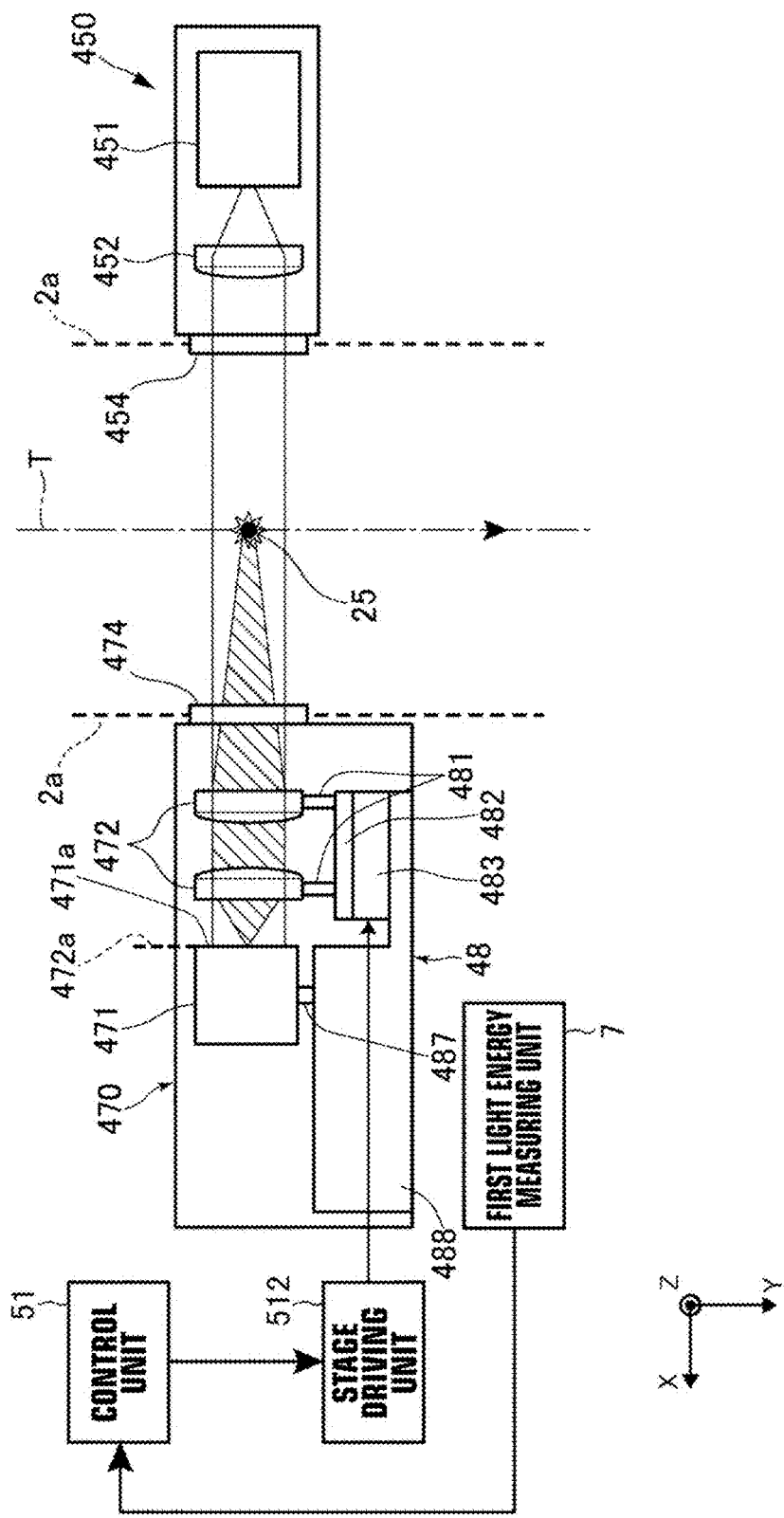
FIG. 47 is a diagram for explaining the configurations of the main parts of an EUV light generating apparatus according to a ninth embodiment.

The EUV light generating apparatus of the ninth embodiment, of which the main components are illustrated in FIG. 47, may basically differ from the EUV light generating apparatus of the seventh embodiment illustrated in FIG. 45 in the point that the optical shutter 475 and the transfer optical system 476 are omitted. That is, the image sensor 471 may be fixed to the bracket 488 in a state in which the image sensor 471 directly faces the image forming optical system 472.

[13.2 Operation]

In the EUV light generating apparatus of the ninth embodiment as well, control for capturing an image of the droplet 271 which is present in the plasma generating region 25 (refer to FIG. 2) with the image sensor 471 in a correctly focused state may be exerted in the same manner as in the EUV light generating apparatus of the seventh embodiment. That is, for example, the EUV energy measurement signal output by the first light energy measuring unit 7 may be sent to the control unit 51, and the control unit 51 may control the operation of the stage driving unit 512 based on the EUV energy measurement signal. Thereby, the image forming optical system 472 may be moved in the direction of the optical axis by the stage 483, to be in a state in which the position of the image forming plane 472a of the image forming optical system 472 matches that of the imaging surface 471a of the image sensor 471. As a result, the image of the droplet 271 in focus may be formed on the imaging surface 471a of the image sensor 471, and may be captured by the image sensor 471.

Note that as the seventh through ninth embodiments, two lenses of the image forming optical system 472 are moved by the stage 483 in the direction of the optical axis, to bring the image of the droplet 271 into focus. However, the present disclosure is not limited to these embodiments. For example, at least one of the two lenses of the image forming optical system 472 may be moved by the stage 483 in the direction of the optical axis, to bring the image of the droplet 271 into focus.

Further, as modifications to the seventh and eighth embodiments, the optical shutter 475, the transfer optical system 476, and the image sensor 471 may be fixed to a single plate and moved in the direction of the optical axis of the image forming optical system 472 without moving the image forming optical system 472, to bring the image of the droplet 271 into focus. In addition, as a modification of the ninth embodiment, the image sensor 471 may be fixed to a single plate and moved in the direction of the optical axis of the image forming optical system 472 without moving the image forming optical system 472, to bring the image of the droplet 271 into focus.

13.3 Operative Effects

According to the EUV light generating apparatus of the ninth embodiment, basically the same operative effects as those of the EUV light generating apparatus of the seventh embodiment may be obtained.

14. Other Items

[14.1 Hardware Environment of Control Units]

Those skilled in the art would understand that the matters described above can be executed by combining a general purpose computer or a programmable controller with a program module or a software application. Generally, the program module will include routines, programs, components, and data structures, etc., for executing the processes described in the present disclosure.

Figure 48:
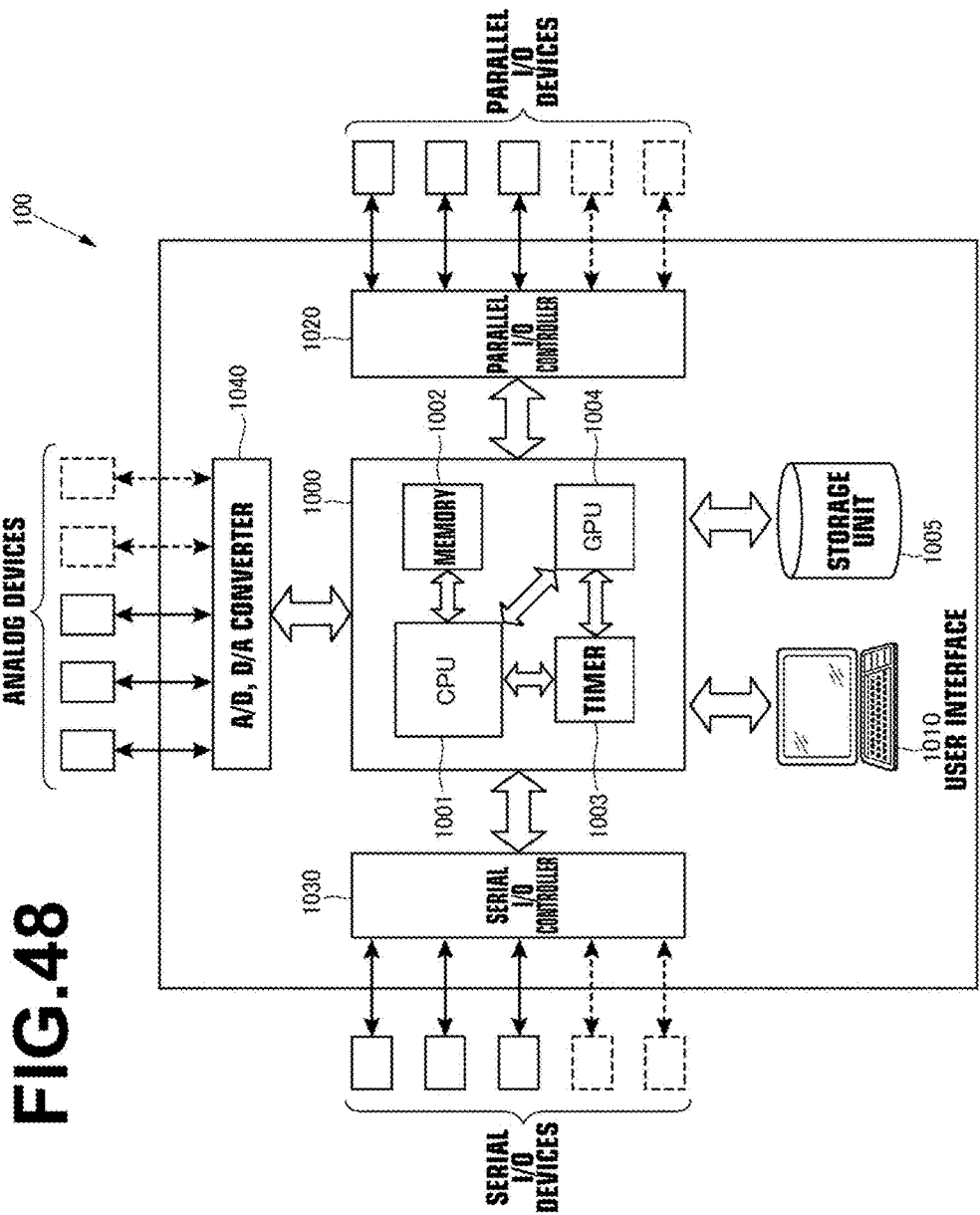
FIG. 48 is a block diagram that illustrates the hardware environment of each control unit.

FIG. 48 is a block diagram that illustrates an exemplary hardware environment in which various aspects of the present disclosure can be implemented. The exemplary hardware environment 100 illustrated in FIG. 48 may include a processing unit 1000, a storage unit 1005, a user interface 1010, a parallel I/O controller 1020, a serial I/O controller 1030, and an A/D, D/A converter 1040. However, the configuration of the hardware environment 100 is not limited to that described above.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any commercially available processor. A dual microprocessor or any other multiprocessor architecture may be employed as the CPU 1001.

The components illustrated in FIG. 48 may be interconnected with each other to execute the processes described in the present disclosure.

During operation, the processing unit 1000 may read and execute programs stored in the storage unit 1005, the processing unit 1000 may read data together with the programs from the storage unit 1005, and the processing unit 1000 may write data to the storage unit 1005. The CPU 1001 may execute programs read out from the storage unit 1005. The memory 1002 may be a work area in which programs executed by the CPU 1001 and data used in the operation of the CPU 1001 are temporarily stored. The timer 1003 may measure temporal intervals and output the results of measurement to the CPU 1001 according to the execution of programs. The GPU 1004 may process image data according to programs read from the storage unit 1005, and output the results of processing to the CPU 1001.

The parallel I/O controller 1020 may be connected to parallel I/O devices which are capable of communicating with the processing unit 1000, such as the EUV light generation control unit 5, the control unit 51, and the stage driving unit 512. The parallel I/O controller 1020 may control communications among the processing unit 1000 and the parallel I/O devices. The serial I/O controller 1030 may be connected to serial I/O devices which are capable of communicating with the processing unit 1000, such as the target supply unit 26, the laser beam propagating direction control unit 34, the light source 411, the signal processing unit 435, the light source 451, the image sensor 471, and the stage 483. The serial I/O controller 1030 may control communications among the processing unit 1000 and the serial I/O devices. The A/D, D/A converter 1040 may be connected to analog devices such as the target sensor 4, the light sensor 431, the EUV energy sensor 71, the laser energy sensor 81, and the light energy sensor 91, via an analog port. The A/D, D/A 1040 converter may control communications among the processing unit 1000 and the analog devices, and perform A/D as well as D/A conversion of the contents of the communications.

The user interface 1010 may display the progress of programs which are being executed by the processing unit 1000 to an operator, such that the operator can command the processing unit 1000 to cease executing programs or to execute interruption routines.

The exemplary hardware environment 100 may be applied to the configurations of the EUV light generation control unit 5, the control unit 51, the stage driving unit 512, etc. of the present disclosure. Those skilled in the art would understand that these controllers may also be realized in a distributed computing environment, that is, an environment in which tasks are executed by processing units which are connected to each other via a communications network. In the present disclosure, the EUV light generation control unit 5, the control unit 51, the stage driving unit 512, etc. may be connected to each other via a communications network such as an Ethernet and the Internet. In a distributed computing environment, program modules may be stored in both local and remote memory storage devices.

[14.2 Other Modifications, Etc.]

It would be obvious to those skilled in the art that the technologies which are described in the above embodiments and modifications thereto may be combined with each other.

The description above is intended to be illustrative and the present disclosure is not limited thereto. Therefore, it would be obvious to those skilled in the art that various modifications to the embodiments of the present disclosure would be possible as long as they do not stray from the spirit and the scope of the appended claims.

The terms which are employed in the present specification and the appended claims are to be interpreted as "not limiting". For example, the terms "include" and "including" are to be interpreted to mean "including the described elements but not limited thereto". The term "have" is to be interpreted to mean "having the described elements but not limited thereto". Further, the indefinite articles "a" and "an", as well as the word "one" in the present specification as well as the appended claims are to be interpreted to mean "at least one" or "one or more".

What is claimed is:

1. An extreme ultraviolet light generating apparatus, comprising:
   a chamber, within which extreme ultraviolet light is generated from a droplet which is supplied to a predetermined region therein;
   an image forming optical system provided in the chamber, configured to form an image of the droplet which is supplied to the predetermined region;
   an imaging element configured to capture the formed image;
   a stage configured to move at least a portion of the image forming optical system and/or the imaging element in an optical axis direction of the image forming optical system;
   a light energy measuring unit configured to measure light energy which is generated when the extreme ultraviolet light is generated; and
   a control unit configured to control the stage based on a measured value of the light energy measured by the light energy measuring unit such that an image formation plane of the image of the droplet formed by the image forming optical system matches an imaging surface of the imaging element.

2. The extreme ultraviolet light generating apparatus as defined in claim 1, wherein:
   a laser beam with which the droplet supplied to the predetermined region is irradiated is introduced to the chamber;
   the extreme ultraviolet light is generated by plasma, which is generated from the droplet irradiated with the laser beam, emitting light that includes the extreme ultraviolet light; and
   the light energy measuring unit measures the light energy of at least one of:
   the extreme ultraviolet light emitted from the plasma;
   light emitted from the plasma having a wavelength different from that of the extreme ultraviolet light; and
   the laser beam with which the droplet supplied to the predetermined region is irradiated.

3. The extreme ultraviolet light generating apparatus as defined in claim 2, wherein:
   the light energy is converted into heat energy within the extreme ultraviolet light generating apparatus when the extreme ultraviolet light is generated and heats the extreme ultraviolet light generating apparatus; and
   the control unit:
   estimates an amount of increase of the heat energy that increases within the extreme ultraviolet light generating apparatus during each predetermined period of time, from an integrated value which is the measured value of the light energy integrated for each of the predetermined periods of time, and
   controls the stage based on the amount of increase of the heat energy.

4. The extreme ultraviolet light generating apparatus as defined in claim 3, wherein the control unit:
   stores a discharge time constant of the heat energy for when the heat energy is discharged to the exterior of the extreme ultraviolet light generating apparatus,
   estimates an amount of discharge of the heat energy to the exterior of the extreme ultraviolet light generating apparatus during each of the predetermined periods of time according to the discharge time constant, and
   controls the stage based on the amount of discharge of the heat energy.

5. The extreme ultraviolet light generating apparatus as defined in claim 4, wherein the control unit:
   calculates an amount of shift of a position of a subject for a case in which an image formation plane of the image forming optical system matches an imaging surface of the imaging element when the extreme ultraviolet light is generated, based on a sum of the amount of increase of the heat energy and the amount of discharge of the heat energy,
   determines a driving amount of the stage corresponding to the amount of shift, and
   controls the stage according to the driving amount.

6. The extreme ultraviolet light generating apparatus as defined in claim 5, wherein the control unit:
   obtains a contrast of an image of the droplet which is obtained by an imaging unit, and
   determines and stores the discharge time constant based on the contrast.

7. The extreme ultraviolet light generating apparatus as defined in claim 6, wherein:
   the control unit determines an initial position of the imaging unit based on the contrast.

8. An extreme ultraviolet light generating apparatus, comprising:
   a chamber, within which extreme ultraviolet light is generated from a droplet which is supplied to a predetermined region therein;
   a first image forming optical system provided in the chamber, configured to form a first image of the droplet which is supplied to the predetermined region;
   an optical shutter having a light receiving surface that detects the formed first image and is configured to output the first image;
   an imaging element configured to capture the first image which is output from the optical shutter;

a stage configured to move at least a portion of the first image forming optical system and/or the optical shutter in an optical axis direction of the first image forming optical system;

a light energy measuring unit configured to measure light energy which is generated when the extreme ultraviolet light is generated; and a control unit configured to control the stage based on a measured value of the light energy measured by the light energy measuring unit such that an image formation plane of the image of the droplet formed by the first image forming optical system matches the light receiving surface of the optical shutter.

9. The extreme ultraviolet light generating apparatus as defined in claim 8, further comprising:

a second image forming optical system provided between the optical shutter and the imaging element, configured to form the first image which is output from the optical shutter on an imaging surface of the imaging element as a second image.

10. The extreme ultraviolet light generating apparatus as defined in claim 8, wherein:

a laser beam with which the droplet supplied to the predetermined region is irradiated is introduced to the chamber;

the extreme ultraviolet light is generated by plasma, which is generated from the droplet irradiated with the laser beam, emitting light that includes the extreme ultraviolet light; and the light energy measuring unit measures the light energy of at least one of:

the extreme ultraviolet light emitted from the plasma;

light emitted from the plasma having a wavelength different from that of the extreme ultraviolet light; and the laser beam with which the droplet supplied to the predetermined region is irradiated.

11. The extreme ultraviolet light generating apparatus as defined in claim 10, wherein:

the light energy is converted into heat energy within the extreme ultraviolet light generating apparatus when the extreme ultraviolet light is generated and heats the extreme ultraviolet light generating apparatus; and the control unit:

estimates an amount of increase of the heat energy that increases within the extreme ultraviolet light generating apparatus during each predetermined period of time, from an integrated value which is the measured value of the light energy integrated for each of the predetermined periods of time, and controls the stage based on the amount of increase of the heat energy.

12. The extreme ultraviolet light generating apparatus as defined in claim 11, wherein the control unit:

stores a discharge time constant of the heat energy for when the heat energy is discharged to the exterior of the extreme ultraviolet light generating apparatus, estimates an amount of discharge of the heat energy to the exterior of the extreme ultraviolet light generating apparatus during each of the predetermined periods of time according to the discharge time constant, and controls the stage based on the amount of discharge of the heat energy.

13. The extreme ultraviolet light generating apparatus as defined in claim 12, wherein the control unit:

calculates an amount of shift of a position of a subject for a case in which an image formation plane of the image forming optical system matches an imaging surface of the imaging element when the extreme ultraviolet light is generated, based on a sum of the amount of increase of the heat energy and the amount of discharge of the heat energy, determines a driving amount of the stage corresponding to the amount of shift, and controls the stage according to the driving amount.

14. The extreme ultraviolet light generating apparatus as defined in claim 13, wherein the control unit:

obtains a contrast of an image of the droplet which is obtained by an imaging unit, and determines and stores the discharge time constant based on the contrast.

15. The extreme ultraviolet light generating apparatus as defined in claim 14, wherein:

the control unit determines an initial position of the imaging unit based on the contrast.

* * * * *